(12) United States Patent
Fujimori et al.

(10) Patent No.: US 6,692,897 B2
(45) Date of Patent: Feb. 17, 2004

(54) POSITIVE RESIST COMPOSITION

(75) Inventors: Toru Fujimori, Shizuoka (JP);
Yasumasa Kawabe, Shizuoka (JP);
Hajime Nakao, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 194 days.

(21) Appl. No.: 09/902,793

(22) Filed: Jul. 12, 2001

(65) Prior Publication Data

US 2002/0155383 A1 Oct. 24, 2002

(30) Foreign Application Priority Data

Jul. 12, 2000 (JP) ........................ P.2000-211642

(51) Int. Cl.$^7$ ............................................... G03F 7/038
(52) U.S. Cl. ................. 430/282.1; 430/270.1; 430/905; 430/919; 564/305
(58) Field of Search ............................. 430/270.1, 905, 430/919, 282.1; 564/305

(56) References Cited

U.S. PATENT DOCUMENTS 6,159,656 A * 12/2000 Kawabe et al. .......... 430/270.1
6,376,152 B2 * 4/2002 Kawabe et al. .......... 430/270.1

FOREIGN PATENT DOCUMENTS

| JP | 11305439 A | * 11/1999 | ........... G03F/7/039 |
| JP | 2001290275 A | * 10/2001 | ........... G03F/7/039 |
| JP | 2001343749 A | * 12/2001 | ........... G03F/7/039 |

* cited by examiner

*Primary Examiner*—Janet Baxter
*Assistant Examiner*—Yvette C. Thornton
(74) *Attorney, Agent, or Firm*—Sughrue Mion, PLLC

(57) ABSTRACT

A positive resist composition comprises: (A) a resin having an aliphatic cyclic hydrocarbon group and increasing the solubility to an alkali developer by the action of an acid; (B) a compound generating an acid upon irradiation with an actinic ray or radiation; and (C) a nitrogen-containing compound having in the molecule at least one partial structure represented by following formula (I).

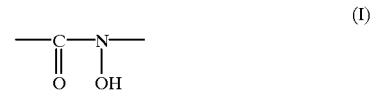

17 Claims, No Drawings

POSITIVE RESIST COMPOSITION

FIELD OF THE INVENTION

The present invention relates to a positive resist composition used for lithographic printing plates, semiconductor production processes, such as IC, etc., productions of circuit substrates for liquid crystals, thermal heads, etc., and further other photofabrication processes. Particularly, the positive photoresist composition of the invention functions by high-energy radiations such as far-ultraviolet rays (including excimer laser light, etc.), electron rays, X-rays, and radiations, and are suitably used for the production of semiconductor integrated circuits.

BACKGROUND OF THE INVENTION

Hitherto, in the production processes of IC, LSI, etc., fine working by a lithography using a photoresist composition has been carried out. Recently, with the high-integration of integrated circuits, the formation of hyperfine patterns of a sub-micron region and a quarter micron region has been required. With the requirement, the light-exposure wavelength tends to become shorter wavelength such as from g line to i line and further an excimer laser light. At present, a lithography using an excimer laser light has become the important working technique in the field, and a resist suitable for such an excimer laser lithographic process, a chemically amplified type resist has been employed.

The chemically amplified type resist composition is a material of forming an acid at the exposed portions by the irradiation of radiations such as a far-ultraviolet light, etc., and by changing the solubility of the irradiated portions by the active radiation and the non-exposed portions in a developer by the reaction using the acid as a catalyst, patterns are formed on a substrate. The chemical amplified type resist has the advantages of having a high resistance and a high resolution, and capable of forming images by a compound generating an acid by the irradiation of small amount of radiations (hereinafter, the compound is referred to as "photoacid generator").

The above-described chemically amplified resist can be largely classified into (1) a three-component system made of an alkali-soluble resin, a photoacid generator, and a dissolution-inhibiting compound to the alkali-soluble resin and having an acid-decomposing group, (2) a two-component system made of a resin having a group, which becomes alkali soluble by being decomposed by the reaction acid, and a photoacid generator, and (3) a hybrid system made of a resin having a group, which becomes alkali soluble by being decomposed by the reaction acid, a low-molecular dissolution inhibiting compound having an acid decomposing group, and a photoacid generator. In these positive-working chemically amplified resists of the two-component system, the three-component system, and the hybrid system, an acid is generated from the photoacid generator by light exposure, and after heat treatment, by developing, resist patterns are obtained.

In the lithography using the chemically amplified type resist, a photoresist excellent in the characteristics such as the sensitivity, the resolution, the profile, the coating property, the dry etching resistance, the adhesion, the substrate dependence, the stability to the environment (for example, the resist dimensional stability by the fluctuation of the setting time of the resist), the depth of focus (for example, the pattern forming property to the focus gap at the irradiation of radiation), etc., has been demanded and many means for improving the performances by additives have hitherto been proposed.

Because the chemically amplified resists has the specific reaction mechanism, it has been attempted to improve the resist characteristics, particularly the environmental stability by preventing the diffusing property of the generated acid by adding an acid scavenger. For example, it is proposed to add organic amines as disclosed in Japanese Patent Laid-Open Nos. 127369/1993, 232706/1993, 249662/1993, 289322/1993, 317902/1994, 92678/1995, 120929/1995, etc. However, there is a problem that when an amine is added, the resolution is improved but the sensitivity is lowered.

On the other hand, it has been attempted to add various kinds of compounds to the chemically amplified resist composition for the purposes of improving the sensitivity, the improvement of the resist pattern forms. For example, it is disclosed to add carboxylic acids in Japanese Patent Laid-Open Nos. 181279/1993, 92679/1995, 6002/1994, and 6003/1997, U.S. Pat. Nos. 5,955,240 and 5,948,589, European Patent 67951, etc.; it is disclosed to add aromatic polyhydroxy compounds in Japanese Patent Laid-Open Nos. 134345/1992, 217251/1992, 181680/1995, and 211597/1996, U.S. Pat. Nos. 5,688,628 and 5,972,559, etc.; and it is disclosed to add sulfonamide compounds in Japanese Patent Laid-Open Nos. 181263/1993 and 92680/1995.

Furthermore, means for improving the resist characteristics such as the resolution, the light exposure latitude, the adhesion, the substrate dependence, etc., has been provided. For example, the methods of preventing the occurrence of pattern collapsing by the addition of formamide or acetamide compounds are disclosed in Japanese Patent Laid-Open No. 5987/1997, U.S. Pat. No. 5,770,343, and European Patent 749044 and it is disclosed to improve the substrate dependence by adding nitrogen-containing compounds such as succinic acid imide, phthalimide, etc., in Japanese Patent Laid-Open No. 44950/1999. Also, the methods of improving the stability to the environment (for example, the resist dimensional stability by the fluctuation of the setting time of the resist), the resolution, the depth of focus, etc., by the addition of the compounds (photobases) lowering the basic property by light exposure are disclosed in Japanese Patent Laid-Open Nos. 232706/1993, 11835/1994, 242606/1994, 266100/1994, 333851/1995, and 333844/1995, U.S. Pat. No. 5,663,035, and European Patent 677788.

Furthermore, it is disclosed in Japanese Patent Laid-Open No. 297396/1997 to improve the resolution and the depth of focus by adding a specific low-molecular acid-decomposing dissolution-inhibiting compound to a two-component type chemically amplified resist.

However, in the photoresist composition for fat-ultraviolet light exposure, even by the techniques as described above, about the performance of a line edge roughness, there are many unsufficient points, and thus the improvement has been required. In this case, the line edge roughness is that the edges of the interface between the line pattern of a resist and a substrate fluctuates irregularly to the direction perpendicular to the line direction because of the characteristics of the resist. When the pattern is observed from right above, the edge is seen as roughness. The roughness is transferred by the etching step using the resist as a mask to deteriorate the electric characteristics, whereby the yield is lowered.

Particularly, with the resist pattern size becomes a quarter micron or smaller, the requirement of improving the line roughness has been increased but the guideline for the improvement has not yet been disclosed.

As described above, because in the known techniques of the photoresist compositions, a roughness is seen on the edge of a pattern and stable patterns are not obtained, a further improvement has been desired.

SUMMARY OF THE INVENTION

Accordingly, an object of the invention is to provide a positive resist composition capable of giving an excellent resist pattern profile wherein the edge roughness of the pattern is improved and a development defect is also improved.

As the result of intensive investigations on the materials constituting a resist composition in the positive-working amplified system, the present inventors have found that the above-described object can be attained by using a specific nitrogen-containing compound and have accomplished the present invention.

That is, the above-described object can be attained by the constitutions of the invention described below.

(1) A positive resist composition comprising:
- (A) a resin having an aliphatic cyclic hydrocarbon group and increasing the solubility to an alkali developer by the action of an acid;
- (B) a compound generating an acid upon irradiation with one of an actinic ray and radiation; and
- (C) a nitrogen-containing compound having in the molecule at least one partial structure represented by formula (I):

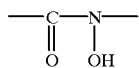

(I)

(2) The positive resist composition according to item (1), wherein the resin (A) comprises at least one selected from the group consisted of: a repeating unit having a partial structure containing an alicyclic hydrocarbon, represented by formula (pI) to (pVI) below; and a repeating unit represented by formula (II) below:

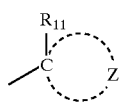

(pI)

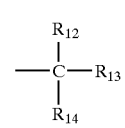

(pII)

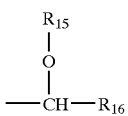

(pIII)

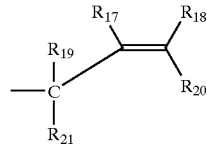

(pIV)

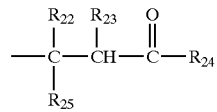

(pV)

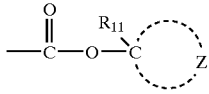

(pVI)

wherein $R_{11}$ represents a methyl group, an ethyl group, an n-propyl group, an isopropyl group, an n-butyl group, an isobutyl group, or a sec-butyl group; Z represents an atomic group necessary for forming an alicyclic hydrocarbon group together with the carbon atom; $R_{12}$ to $R_{16}$ each independently represents a straight chain or branched alkyl group having from 1 to 4 carbon atoms or an alicyclic hydrocarbon group, wherein at least one of $R_{12}$ to $R_{14}$ or one of $R_{15}$ and $R_{16}$ represents an alicyclic hydrocarbon group; $R_{17}$ to $R_{21}$ each independently represents a hydrogen atom, a straight chain or branched alkyl group having from 1 to 4 carbon atoms or an alicyclic hydrocarbon group, wherein at least one of $R_{17}$ to $R_{21}$ represents an alicyclic hydrocarbon group and one of $R_{19}$ and $R_{21}$ represents a straight chain or branched alkyl group having from 1 to 4 carbon atoms or an alicyclic hydrocarbon group; $R_{22}$ to $R_{25}$ each independently represents a straight chain or branched alkyl group having from 1 to 4 carbon atoms or an alicyclic hydrocarbon group, wherein at least one of $R_{22}$ to $R_{25}$ represents an alicyclic hydrocarbon group and $R_{23}$ and $R_{24}$ may be bonded to each other to form a ring:

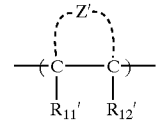

(II)

wherein $R_{11}'$ and $R_{12}'$ each independently represents a hydrogen atom, a cyano group, a halogen atom or an alkyl group which may have a substituent; Z' represents an atomic group for forming an alicyclic structure containing the two carbon atoms (C—C), which may have a substituent.

(3) The positive resist composition according to item (2), wherein Z' of the formula (II) represents an atomic group for forming a bridged alicyclic structure containing the two carbon atoms (C—C), which may have a substituent.

(4) The positive resist composition according to item (2), wherein the formula (II) is one of formulae (II-A) and (II-B);

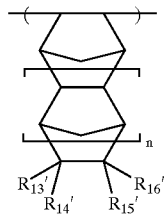

(II-A)

(II-B)

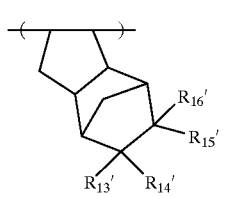

wherein $R_{13}'$ to $R_{16}'$ each independently represents a hydrogen atom, a halogen atom, a cyano group, —COOH, —COOR$_5$, a group of being decomposed by the action of an acid, —C(=O)—X-A'-R$_{17}'$, or an alkyl or cyclic hydrocarbon group which may have a substituent; $R_5$ represents an alkyl or cyclic hydrocarbon group which may have a substituent, or a —Y group below; X represents an oxygen atom, a sulfur atom, —NH—, —NHSO$_2$—, or —NHSO$_2$NH—; A' represents a single bond or a divalent linkage group; n represents 0 or 1; $R_{17}'$ represents —COOH, —COOR$_5$, —CN, a hydroxy group, an alkoxy group which may have a substituent, —CO—NH—R$_6$, —CO—NH—SO$_2$—R$_6$, or a —Y group below; $R_6$ represents an alkyl or cyclic hydrocarbon group which may have a substituent; and at least two of $R_{13}'$ to $R_{16}'$ may be bonded to each other to form a ring:

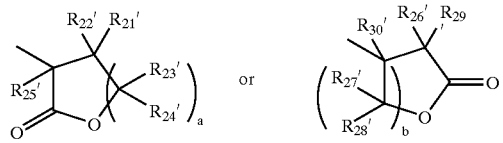

wherein $R_{21}'$ to $R_{30}'$ each independently represents a hydrogen or an alkyl group which may have a substituent; a and b each represents 1 or 2.

(5) The positive resist composition according to item (2), wherein the repeating unit having the partial structure represented by the formula (pI) to (pVI), is a repeating unit represented by formula (pA):

(pA)

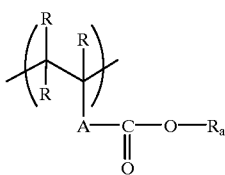

wherein R represents a hydrogen atom, a halogen atom, a substituted or unsubstituted, straight chain or branched alkyl group having from 1 to 4 carbon atoms; each of plural R is the same or different; A represents a single bond or, an alkylene group, a substituted alkylene group, an ether group, a thioether group, a carbonyl group, an ester group, an amide group, a sulfonamide group, a urethane group, a urea group or a combination thereof; Ra represents one of the groups represented by the formulae (pI) to (pVI).

(6) The positive resist composition according to item (1), wherein the resin (A) further comprises a repeating unit having the lactone structure, represented by formula (IV):

(IV)

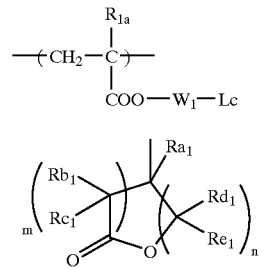

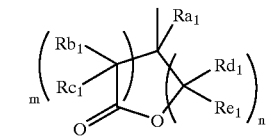

wherein $R_{1a}$ represents a hydrogen atom or a methyl group; $W_1$ represents a single bond or, an alkylene group, an ether group, a thioether group, a carbonyl group, an ester group or a combination thereof; Ra$_1$, Rb$_1$, Rc$_1$, Rd$_1$ and Re$_1$ each independently represents a hydrogen atom or an alkyl group having from 1 to 4 carbon atoms; m and n each independently represents an integer of from 0 to 3; and m+n is 2 or larger but not larger than 6.

(7) The positive resist composition according to item (1), wherein the resin (A) further comprises a repeating unit having a group represented by one of formulae (V-1) to (V-4):

(V-1)

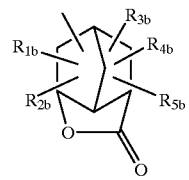

(V-2)

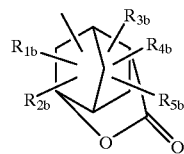

(V-3)

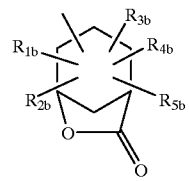

(V-4)

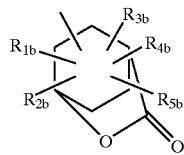

wherein $R_{1b}$ to $R_{5b}$ each independently represents a hydrogen atom, an alkyl group which may have a substituent, a cycloalkyl group which may have a substituent or an alkenyl group which may have a substituent, and two of $R_{1b}$ to $R_{5b}$ may be bonded to each other to form a ring.

(8) The positive resist composition according to item (1), wherein the resin (A) further comprises a repeating unit represented by formula (VI):

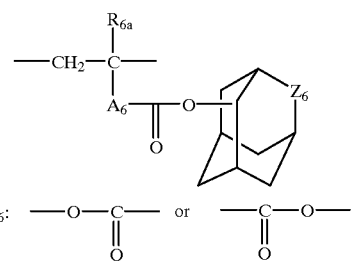

(VI)

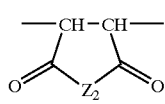

wherein $A_6$ represents a single bond or, an alkylene group, a cycloalkylene group, an ether group, a thioether group, a carbonyl group, an ester group or a combination thereof; and $R_{6a}$ represents a hydrogen atom, an alkyl group having from 1 to 4 carbon atoms, a cyano group or a halogen atom.

(9) The positive resist composition according to item (1), wherein the resin (A) further comprises a repeating unit having a group represented by formula (VII):

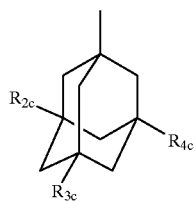

(VII)

wherein $R_{2c}$ to $R_{4c}$ each independently represents a hydrogen atom or a hydroxy group, and at least one of $R_{2c}$ to $R_{4c}$ represents a hydroxy group.

(10) The positive resist composition according to item (1), wherein the resin (A) further comprises a repeating unit represented by formula (VIII):

(VIII)

—CH—CH—
 /   \
O     O
 \   /
  Z₂ wherein $Z_2$ represents —O— or —N($R_{41}$); $R_{41}$ represents a hydrogen atom, a hydroxy group, an alkyl group, a haloalkyl group or —OSO$_2$—$R_{42}$; and $R_{42}$ represents an alkyl group, a haloalkyl group, a cycloalkyl group or a camphor residue.

(11) The positive resist composition according to claim 1, wherein the nitrogen-containing compound (C) is a compound represented by formula (Ia):

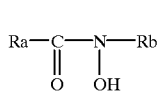

(Ia)

wherein Ra represents a hydrogen atom, an alkyl group which may have a substituent, an alkenyl group which may have a substituent or an aryl group which may have a substituent; Rb represents a hydrogen atom, an aryl group which may have a substituent, —C(=O)—Ra or —N=N—Ra; and Ra and Rb may be bonded to each other to form a ring.

(12) The positive resist composition according to item (1), wherein the nitrogen-containing compound (C) is a compound represented by formula (II-1):

(II-1)

wherein R represents a monovalent organic residue having from 1 to 20 carbon atoms.

(13) The positive resist composition according to item (1), wherein the nitrogen-containing compound (C) is a compound represented by formula (II-2):

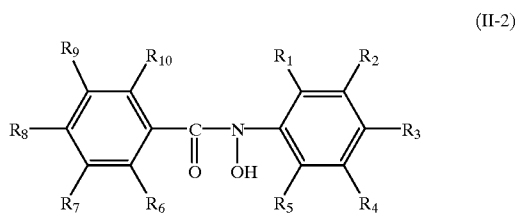

(II-2)

wherein $R_1$ to $R_{10}$, which are the same or different, each represents a hydrogen atom, a hydroxyl group, a halogen atom, a nitro group, a cyano group, an alkyl group, an alkoxy group, a hydroxyalkyl group, a cycloalkyl group or an aryl group.

(14) The positive resist composition according to item (1), wherein the nitrogen-containing compound (C) is used in an amount of from 0.001 to 40% by weight, based on the solid components in the composition.

(15) The positive resist composition according to item (1), which further comprises a low-molecular acid-decomposing compound: having a molecular weight of not higher than 2000; having a group capable of being decomposed by the action of an acid; and increasing the alkali solubility by the action of an acid.

(16) The positive resist composition according to item (1), wherein is a composition for light exposure by a far ultraviolet light having wavelengths of not longer than 220 nm.

(17) The positive resist composition according to item (1), which further comprises (D) a nitrogen-containing basic compound.

(18) The positive resist composition according to item (1), which further comprises (E) a surfactant containing at least one of a fluorine atom and a silicon atom.

DETAILED DESCRIPTION OF THE INVENTION

Then, the present invention is described in detail.

First, the components used in the invention are explained in detail.

[1] (A) The resin (sometimes, is referred to as "acid-decomposing" resin) increasing the solubility to an alkali developer by the action of an acid.

As the acid-decomposing resin (A) used in the invention, any resin which has an aliphatic cyclic hydrocarbon group and increases the solubility to an alkali developer by the action of an acid, can be used but the resin preferably contains at least one selected from the group of the repeating unit having a partial structure containing an alicyclic hydrocarbon, represented by the above-described formulae (pI) to (pVI) and the repeating unit represented by the above-described formula (II).

In the formulae (pI) to (pVI), the alkyl group shown by $R_{12}$ to $R_{25}$ is a straight chain or branched alkyl group having from 1 to 4 carbon atoms, which may be substituted or unsubstituted. Examples of the alkyl group include methyl, ethyl, n-propyl, isopropyl, n-butyl, isobutyl, sec-butyl, and t-butyl.

Also, the substituent of the above-described alkyl group includes an alkoxy group having from 1 to 4 carbon atoms, a halogen-atom (such as fluorine, chlorine, bromine, and iodine), an acryl group, an acyloxy group, a cyano group, a hydroxy group, a carboxy group, an alkoxycarbonyl group, a nitro group, etc.

The alicyclic hydrocarbon group shown by $R_{11}$ to $R_{25}$ or the alicyclic hydrocarbon group formed by Z and the carbon atoms may be monocyclic or polycyclic. Practically, there are the groups having a monocyclo structure having at least 5 carbon atoms, a bicyclo structure, a tricyclo structure, a tetracyclo structure, etc. The carbon atom number of them is preferably from 6 to 30, and particularly preferably from 7 to 25. These alicyclic hydrocarbons may have a substituent.

The structural examples of the alicyclic portions of the alicyclic hydrocarbons are shown below.

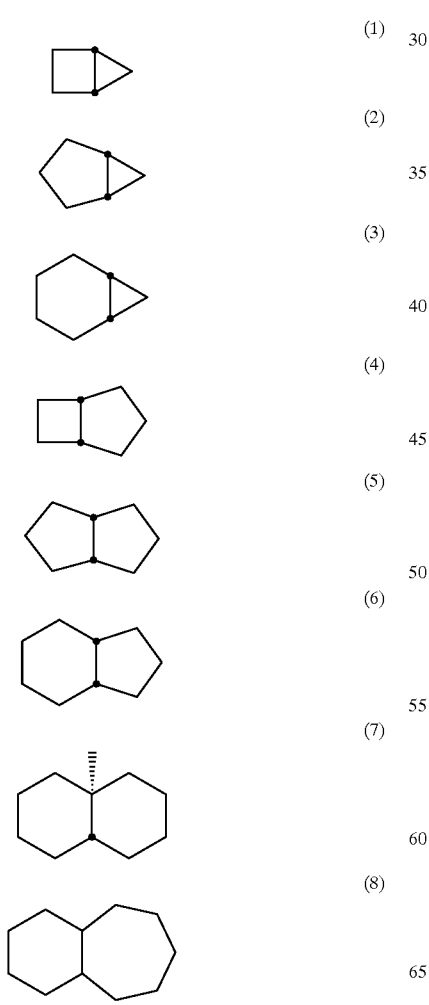

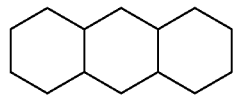

(9)

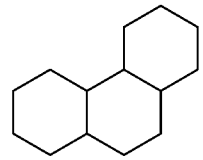

(10)

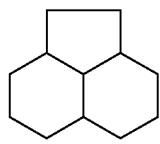

(11)

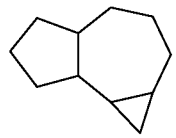

(12)

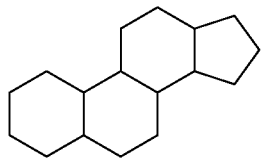

(13)

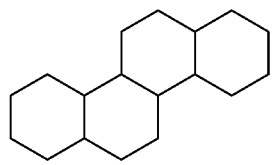

(14)

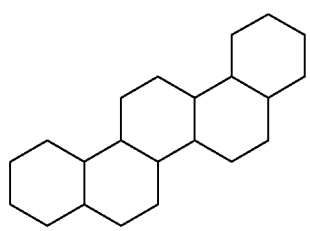

(15)

(16)

(17)

(18)

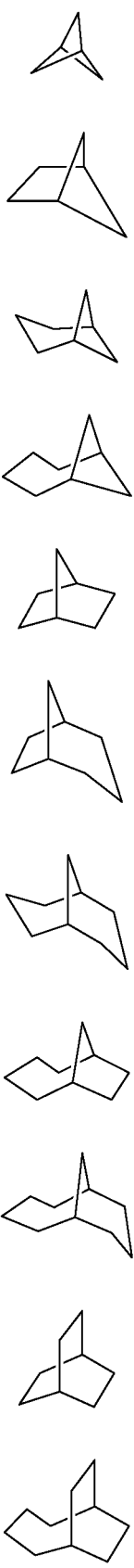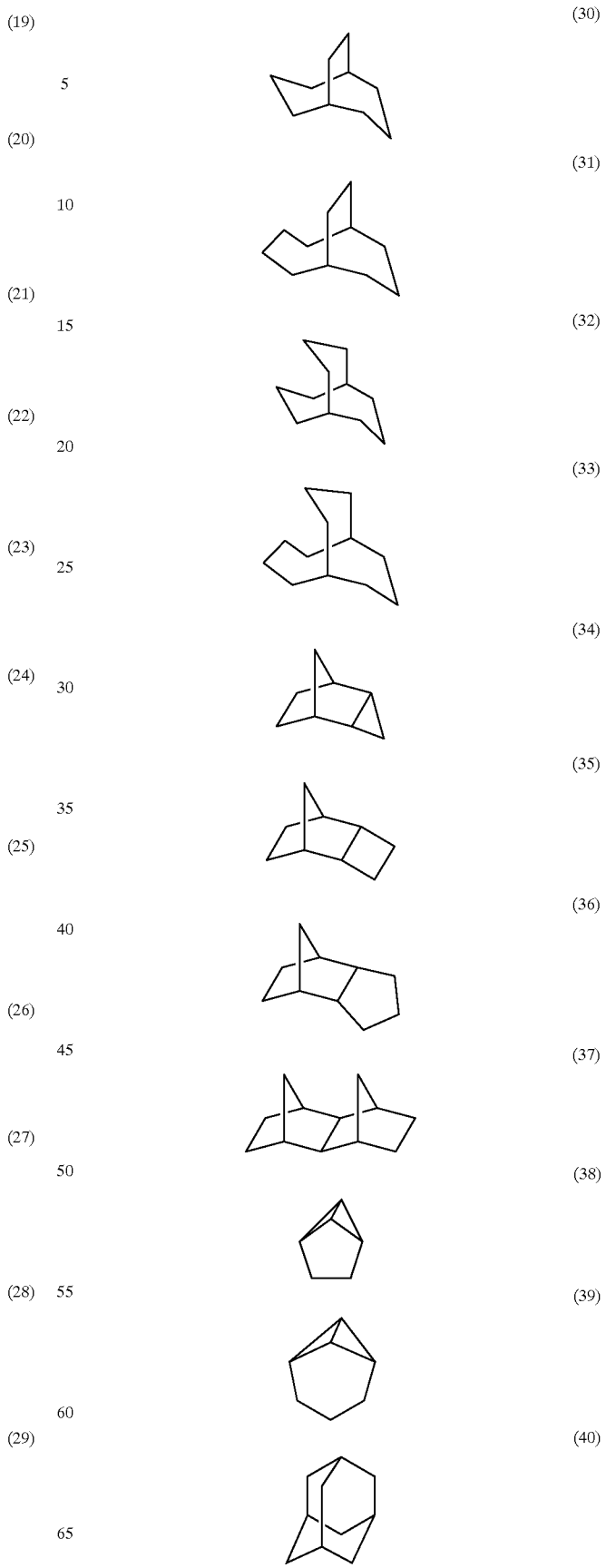

-continued

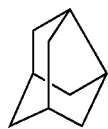  (41)

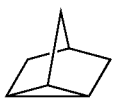  (42)

  (43)

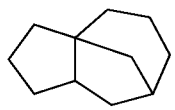  (44)

  (45)

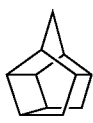  (46)

  (47)

  (48)

  (49)

  (50)

In the invention, preferred practical examples of the above-described alicyclic portion include an adamantyl group, a moradamantyl group, a decalin residue, a tricyclodecanyl group, tetracyclododecanyl group, norbornyl group, a cedrol group, a cyclohexyl group, a cycloheptyl group, a cyclooctyl group, a cyclodecanyl group, and a cyclododecanyl group. Also, the more preferred examples thereof include an adamantyl group, a decalin residue, a norbornyl group, a cedrol group, a cyclohexyl group, a cycloheptyl group, a cyclooctyl group, a cyclodecanyl group, and a cyclododecanyl group.

As the substituents of these alicyclic hydrocarbon groups, there are an alkyl group, a substituted alkyl group, a halogen atom, a hydroxy group, an alkoxy group, a carboxy group, an alkoxycarbonyl group, etc. As the alkyl group, lower alkyl groups such as methyl, ethyl, propyl, isopropyl, butyl, etc., are preferable and the lower alkyl group selected from the class consisting of methyl, ethyl, propyl, and isopropyl is more preferable. As the substituent of the substituted alkyl group, there are a hydroxy group, a halogen atom, an alkoxy group, etc. As the above-described alkoxy group, there are alkoxy groups having from 1 to 4 carbon atoms, such as methoxy, ethoxy, propoxy, butoxy, etc.

The structures shown by the above-described formulae (pI) to (pVI) in the above-described resin (A) can be used for the protection of an alkali-soluble group. As the alkali-soluble group, there are various groups known in the technical field.

Practically, there are a carboxylic acid group, a sulfonic acid group, a phenol group, a thiol group, etc., and in these groups, a carboxylic acid group and a sulfonic acid group are preferred.

As the alkali-soluble groups each protected by the structure shown by the formula (pI) to (pVI) in the resin (A), there are preferably the groups represented by following formulae (pVII) to (pXI).

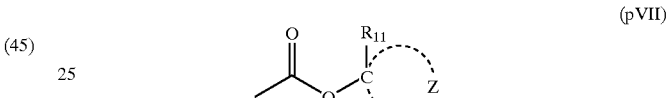  (pVII)

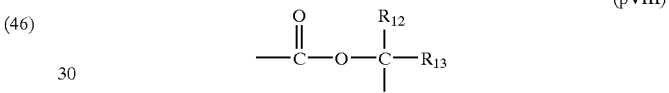  (pVIII)

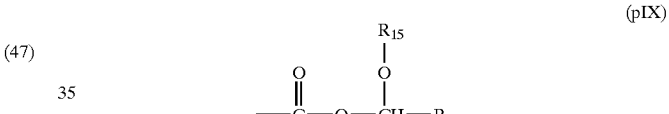  (pIX)

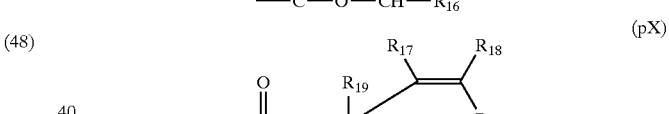  (pX)

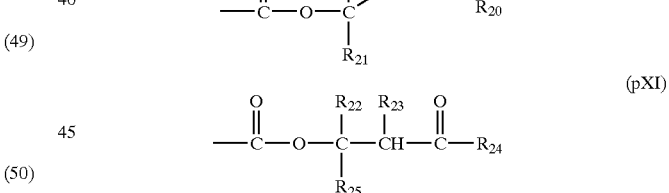  (pXI)

In the above formulae, $R_{11}$ to $R_{25}$ and Z are same as defined above.

In the resin (A) described above, as the repeating unit having the alkali-soluble group protected by the formula (pI) to (pVI), the repeating unit represented by following formula (pA) is preferred.

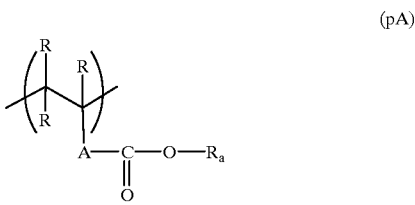  (pA)

In the above formula, R represents a hydrogen atom, a halogen atom, a substituted or unsubstituted, straight chain or branched alkyl group having from 1 to 4 carbon atoms. Each of plural R may be the same or different.

In the above formula, A represents a single bond, or a single group or a combination of two or more groups selected from the class consisting of an alkylene group, a substituted alkylene group, an ether group, a thioether group, a carbonyl group, an ester group, an amide group, a sulfonamide group, a urethane group, and a urea group.

Also, Ra represents one group of the above-described formulae (pI) to (pVI)

Then, practical examples of the monomer corresponding to the repeating unit shown by the formula (pA) described above are shown below.

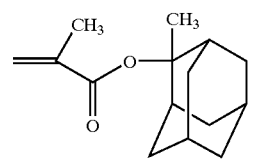

1

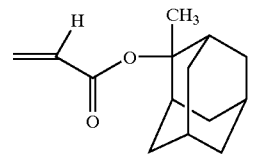

2

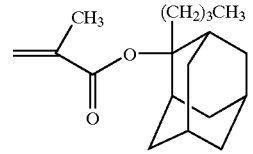

3

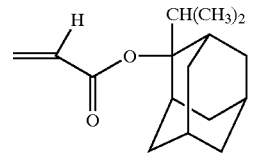

4

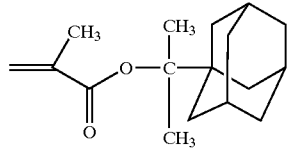

5

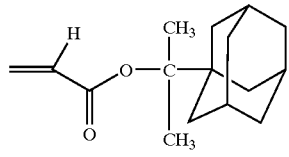

6

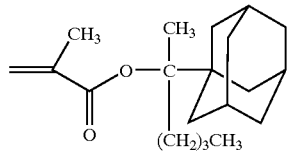

7

-continued

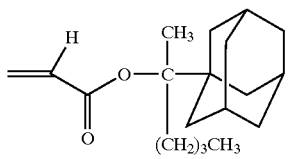

8

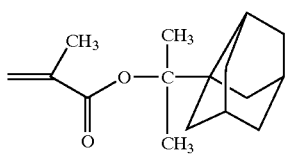

9

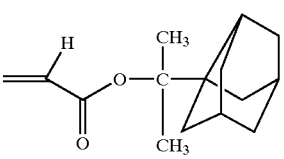

10

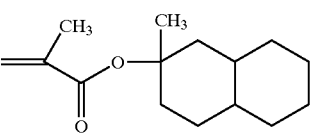

11

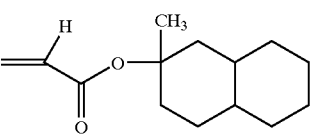

12

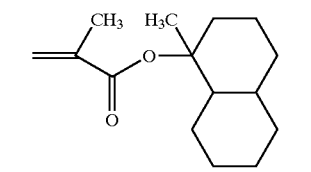

13

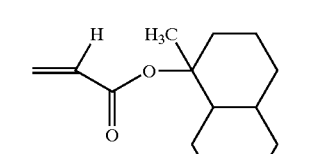

14

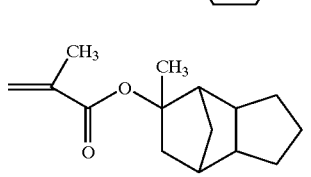

15

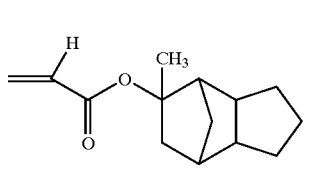

16

17

-continued
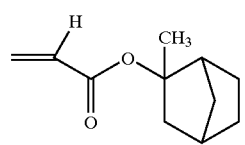
18
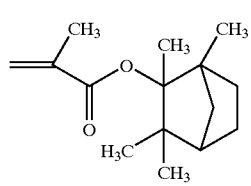
19
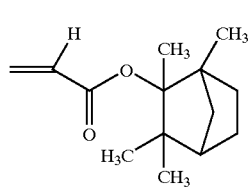
20
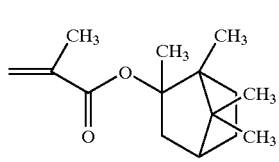
21
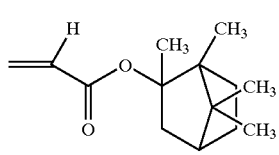
22
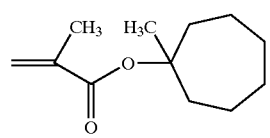
23
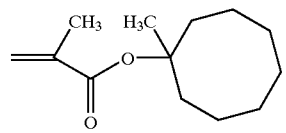
24
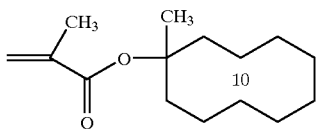
25
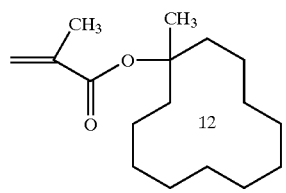
26
-continued
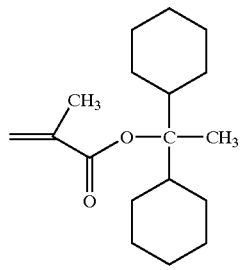
27
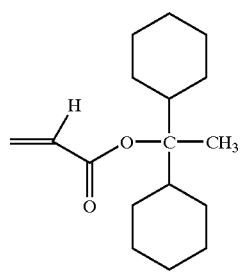
28
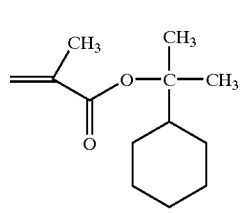
29
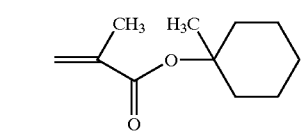
30
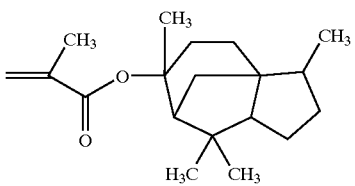
31
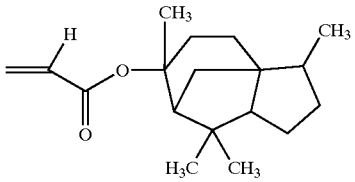
32
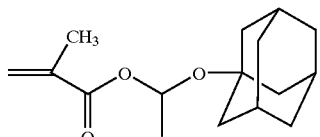
33
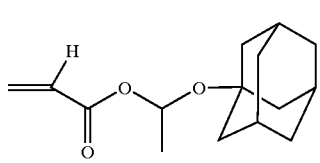
34

-continued

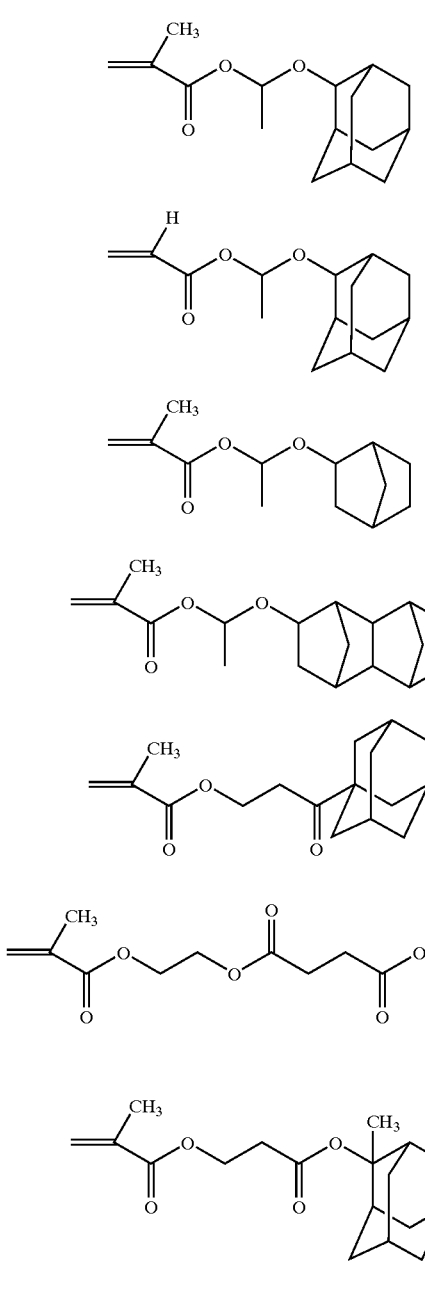

In the above-described formula (II), $R_{11}'$ and $R_{12}'$ each independently represents a hydrogen atom, a cyano group, a halogen atom, or an alkyl group which may have a substituent.

Z' represents an atomic group for forming an alicyclic structure containing the two carbon atoms (C—C), which may have a substituent.

As the halogen atom in above-described $R_{11}'$ and $R_{12}'$, there are chlorine, bromine, fluorine, iodine, etc.

As the alkyl group of above-described $R_{11}$ and $R_{12}'$ in the formula (II) and $R_{21}'$ to $R_{30}'$ of the above described formula of-Y group, a straight chain or branched alkyl group having from 1 to 10 carbon atoms is preferred, a straight chain or branched alkyl group having from 1 to 6 carbon atoms is more preferred, and as the far more preferred alkyl group, there are methyl, ethyl, propyl, isopropyl, n-butyl, isobutyl, sec-butyl, and t-butyl.

As the substituent of the above-described alkyl group, there are a hydroxy group, a halogen atom, a carboxyl group, an alkoxy group, an acyl group, a cyano group, an acyloxy group, etc. As the halogen atom, there are chlorine, bromine, fluorine, iodine, etc.; as the alkoxy group, there are alkoxy groups having from 1 to 4 carbon atoms such as methoxy, ethoxy, propoxy, butoxy, etc.; as the acyl group, there are formyl, acetyl, etc.; and as the acyloxy group, there are acetoxy, etc.

The atomic group for forming an alicyclic structure shown in the above-described formula (II) is the atomic group forming a repeating unit of an alicyclic hydrocarbon which may have a substituent in the resin, and in these atomic groups, the atomic group for forming a bridged alicyclic structure forming the repeating unit of a bridged alicyclic hydrocarbon is preferred.

As the skeleton of the alicyclic hydrocarbon formed, there are those shown by the following structures.

 (1)

 (2)

 (3)

 (4)

 (5)

 (6)

(7)

(8)

(9)

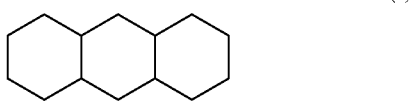

-continued
(10)
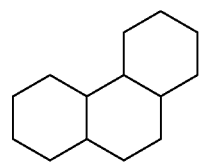
(11)
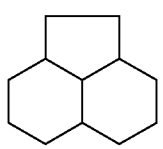
(12)
(13)
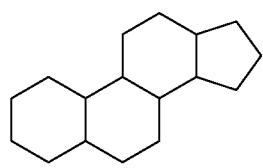
(14)
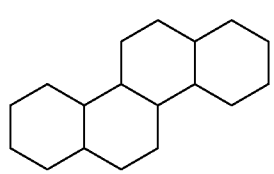
(15)
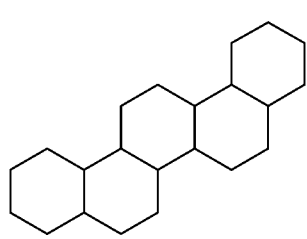
(16)
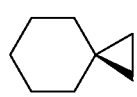
(17)
(18)
(19)
-continued
(20)
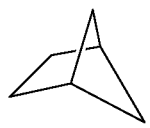
(21)
(22)
(23)
(24)
(25)
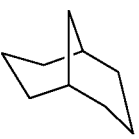
(26)
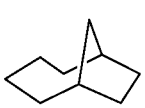
(27)
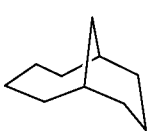
(28)
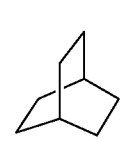
(29)
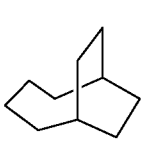
(30)
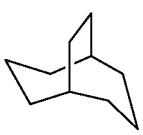

(31) 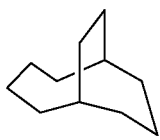

(32) 

(33) 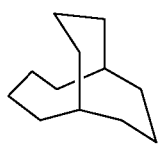

(34) 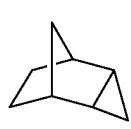

(35) 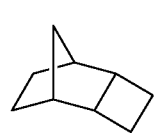

(36) 

(37) 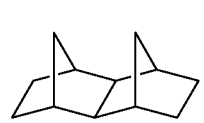

(38) 

(39) 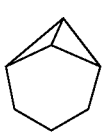

(40) 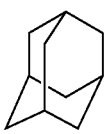

(41) 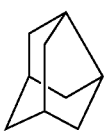

(42) 

(43) 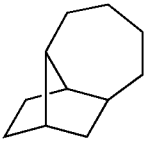

(44) 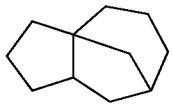

(45) 

(46) 

(47) 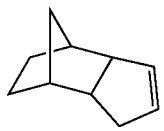

In the above-described structures, the preferred skeletons of the bridged alicyclic hydrocarbons are structures (5), (6), (7), (9), (10), (13), (14), (15), (23), (28), (36), (37), (42), and (47).

The skeleton of each of the above-described alicyclic hydrocarbons may have a substituent. As the substituent, there are the group represented by $R_{13}'$ to $R_{16}'$ in the above-described formula (II-A) or (II-B).

In the above-described repeating units each having the bridged alicyclic hydrocarbon, the repeating units shown by the above-described formula (II-A) or (II-B) are more preferred.

In the above-described formula (II-A) or (II-B), $R_{13}'$ to $R_{16}'$ each independently represents a hydrogen atom, a halogen atom, —COOH, —COOR$_5$, a group of being decomposed by the action of an acid, —C(=O)—X-A'-R$_{17}'$, or an alkyl or cyclic hydrocarbon group which may have a substituent.

$R_5$ represents an alkyl group or a cyclic hydrocarbon group, which may have a substituent, or the -Y group described above.

X represents an oxygen atom, a sulfur atom, —NH—, —NHSO$_2$—, or —NHSO$_2$NH—.

A' represents a single bond or a divalent linkage group.

Also, at least two of $R_{13}'$ to $R_{16}'$ may be bonded to each other to form a ring; and n represents 0 or 1.

$R_{17}'$ represents —COOH, —COOR$_5$, —CN, a hydroxy group, an alkoxy group, which may have a substituent, —CO—NH—R$_6$, —CO—NH—SO$_2$—R$_6$, or the above-described -Y group.

$R_6$ represents an alkyl group or a cyclic hydrocarbon group, which may have a substituent.

In the above-described-Y group, $R_{21}'$ to $R_{30}'$ each independently represents a hydrogen atom or an alkyl group which may have a substituent; and a and b each represents 1 or 2.

In the resin used in the invention, the acid-decomposing group may be contained in above-described —C (=O)—X-A'-$R_{17}$' or may be contained as a substituent of Z' of the formula (II).

The construction of the acid-decomposing group is shown by —C(=O)—$X_1$–$R_0$.

In the above formula, $R_0$ represents a tertiary alkyl group such as t-butyl, t-amyl, etc.; an isoboronyl group; a 1-alkoxyethyl group such as 1-ethoxyethyl, 1-butoxyethyl, 1-isobutoxyethyl, 1-cyclohexyloxyethyl, etc.; an alkoxymethyl group such as 1-methoxymethyl, 1-ethoxymethyl, etc.; a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc. $X_1$ has the same meaning as above-described X.

As the halogen atoms shown by above-described $R_{13}'$ to $R_{16}'$, there are chlorine, bromine, fluorine, iodine, etc.

The alkyl groups in $R_5$, $R_6$, and $R_{13}'$ to $R_{16}'$ described above are preferably straight chain or branched alkyl groups having from 1 to 10 carbon atoms, more preferably straight chain or branched alkyl groups having from 1 to 6 carbon atoms, and are far more preferably methyl, ethyl, propyl, isopropyl, n-butyl, isobutyl, sec-butyl, and t-butyl.

The cyclic hydrocarbon groups in $R_5$, $R_6$, and $R_{13}'$ to $R_{16}'$ described above are, for example, cyclic alkyl groups and a bridged hydrocarbon groups, and practically there are a cyclopropyl group, a cyclopentyl group, a cyclohexyl group, an adamantyl group, a 2-methyl-2-adamantyl group, a norbornyl group, boronyl group, an isoboronyl group, a tricyclodecanyl group, a dicyclopentenyl group, a norbornaepoxy group, a menthyl group, an isomenthyl group, a neomenthyl group, a tetracyclododecanyl group, etc.

As the ring formed by bonding at least two of above-described $R_{13}'$ to $R_{16}'$, there are rings having from 5 to 12 carbon atoms, such as cyclopentene, cyclohexene, cycloheptane, cyclooctane, etc.

As the alkoxy group in above-described $R_{17}'$, there are alkoxy groups having from 1 to 4 carbon atoms, such as methoxy, ethoxy, propoxy, butoxy, etc.

Also, as the substituents of the alkyl group, the cyclic hydrocarbon group, and the alkoxy group described above, there are a hydroxy group, a halogen atom, a carboxyl group, an alkoxy group, an acyl group, a cyano group, an acyloxy group, an alkyl group, a cyclic hydrocarbon group, etc. As the halogen atom, there are chlorine, bromine, fluorine, iodine, etc. As the alkoxy group, there are alkoxy groups having from 1 to 4 carbon atoms, such as methoxy, ethoxy, propoxy, butoxy, etc.; as the acyl group, there are formyl, acetyl, etc.; and the acyloxy group, there are acetoxy, etc.

Also, as the alkyl group and cyclic hydrocarbon group, there are those described above.

As the divalent linkage group of above-described A', there are a single group or a combination of two or more groups selected from the class consisting of an alkylene group, a substituted alkylene group, an ether group, a thioether group, a carbonyl group, an ester group, an amide group, a sulfonamide group, a urethane group, and a urea group.

As the alkylene group and the substituted alkylene group in above-described A', there are groups represented by following formula;

$$-[C(R_a)(R_b)]_r-$$

In the formula, $R_a$ and $R_b$, which may be the same or different, each represents a hydrogen atom, an alkyl group, a substituted alkyl group, a halogen atom, a hydroxy group, or an alkoxy group.

As the alkyl group, a lower alkyl group such as methyl, ethyl, propyl, isopropyl, butyl, etc., is preferred and a more preferred alkyl group is selected from methyl, ethyl, propyl, and isopropyl. As the substituent of the substituted alkyl group, there are a hydroxy group, a halogen atom, and an alkoxy group. As the alkoxy group, there are alkoxy groups having from 1 to 4 carbon atoms, such as methoxy, ethoxy, propoxy, butoxy, etc. As the halogen atom, there are chlorine, bromine, fluorine, iodine, etc. Also, in the above-described formula, r represents an integer of from 1 to 10.

In the resin used in the invention, the group of being decomposed by the action of an acid can be comprised in at least one kind of the repeating unit selected from the repeating unit having the partial structure containing the alicyclic hydrocarbon shown by the formulae (pI) to (pVI) described above, the repeating unit shown by the formula (II), and the repeating unit of a copolymer component described below.

The various kinds of the substituents of $R_{13}'$ to $R_{16}'$ in the formula (II-A) or the formula (II-B) described above become the substituents of for the alicyclic structure formed by the atomic group in the above-described formula (II) or the substituents of the bridged alicyclic structure formed by the atomic group Z.

Then, as the practical examples of the repeating unit shown by the formula (II-A) or the formula (II-B) described above, following [II-1] to [II-175] are illustrated below but the invention is not limited to these practical examples.

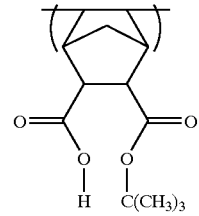

[II-1]

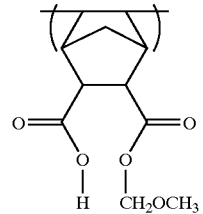

[II-2]

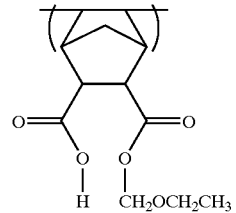

[II-3]

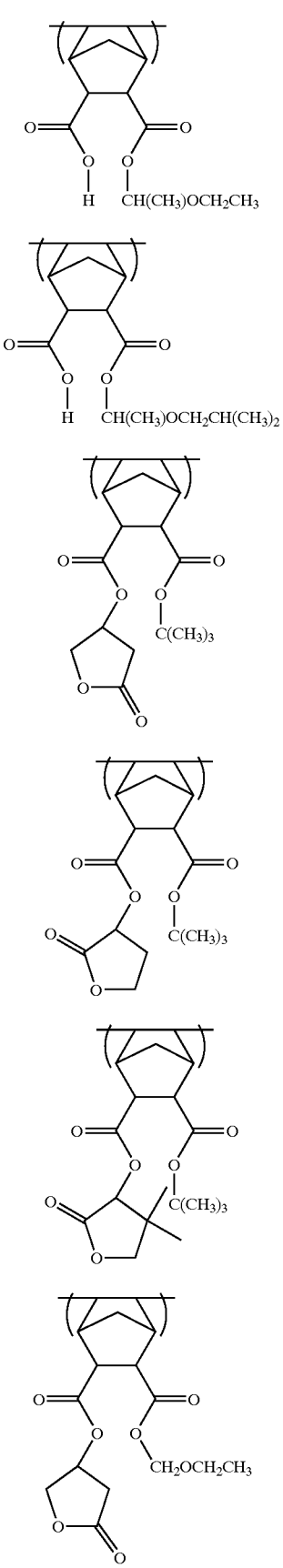
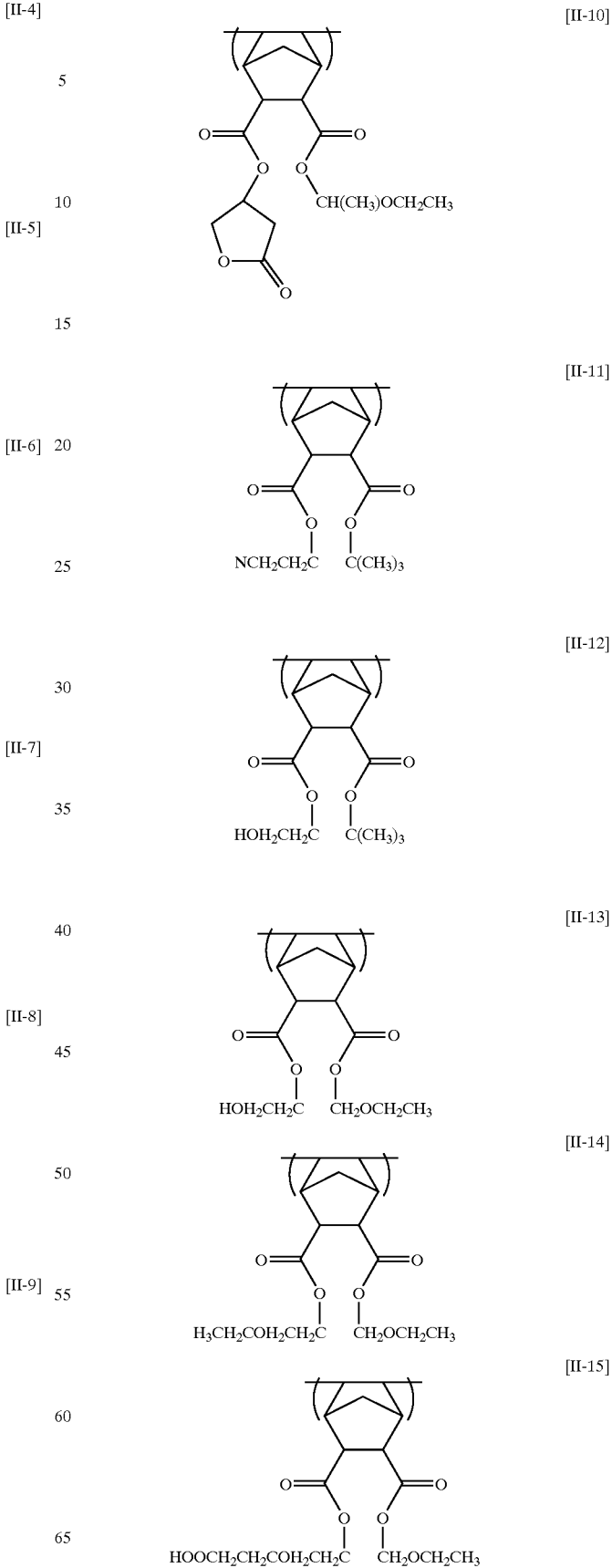

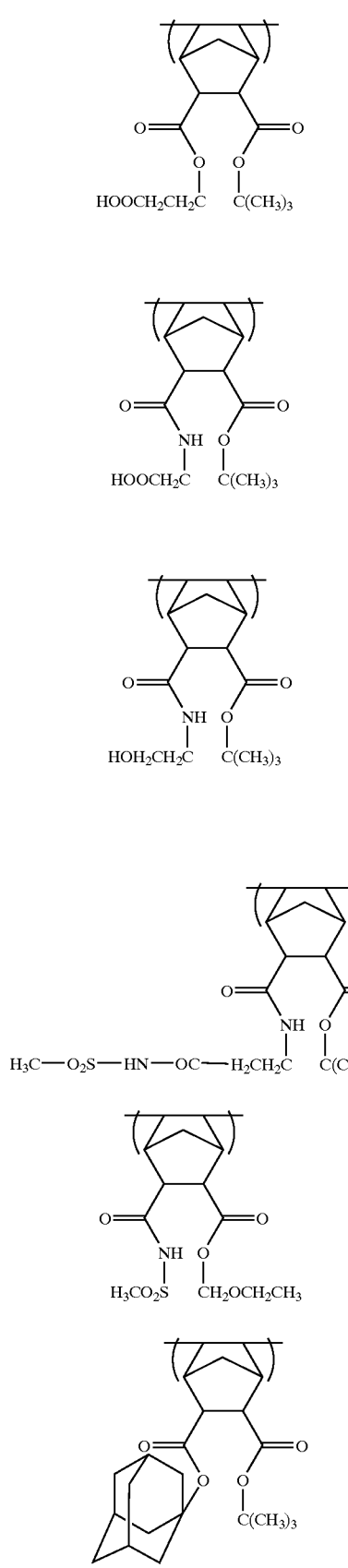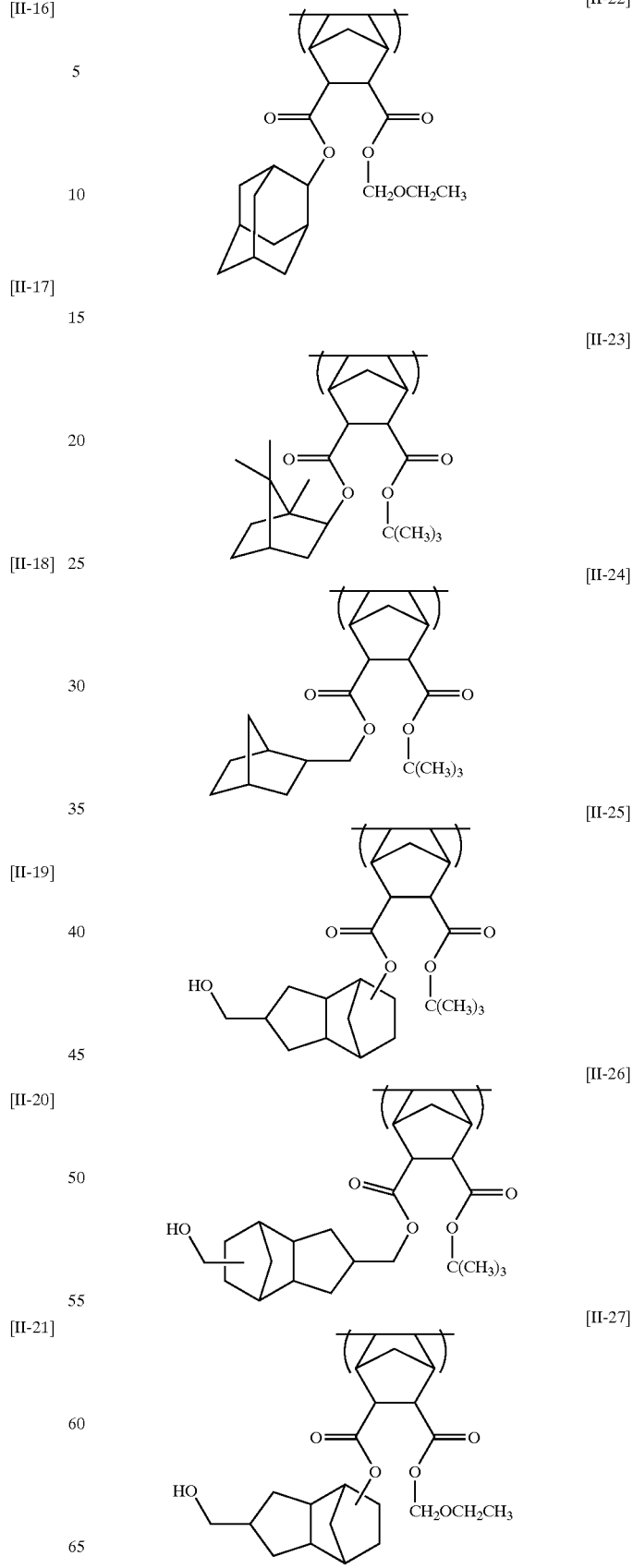

-continued
[II-28]
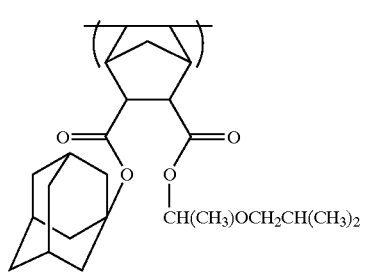
[II-29]
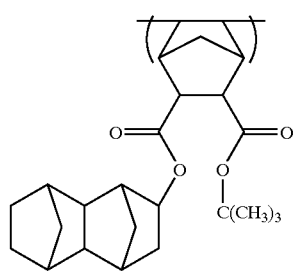
[II-30]
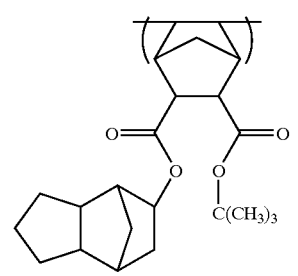
[II-31]
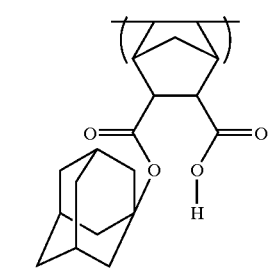
[II-32]
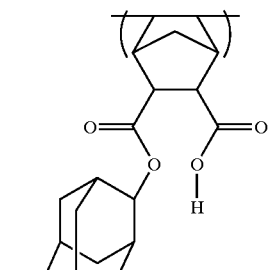
[II-33]
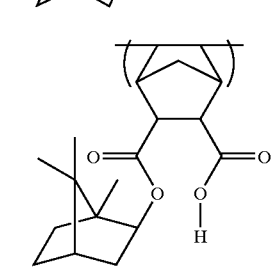
[II-34]
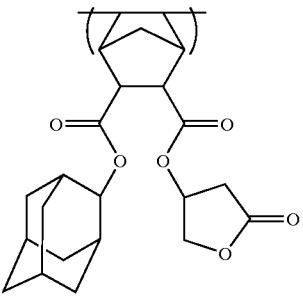
[II-35]
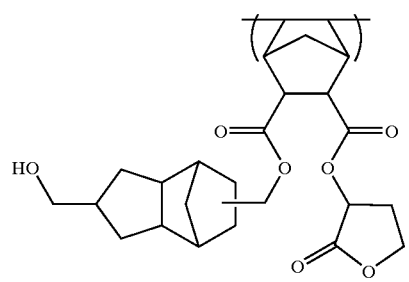
[II-36]
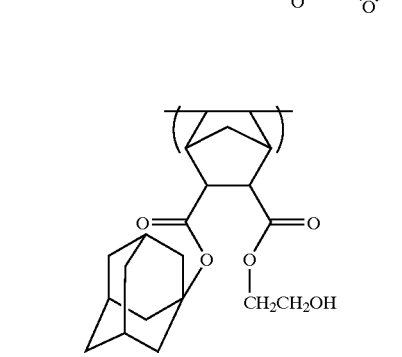
[II-37]
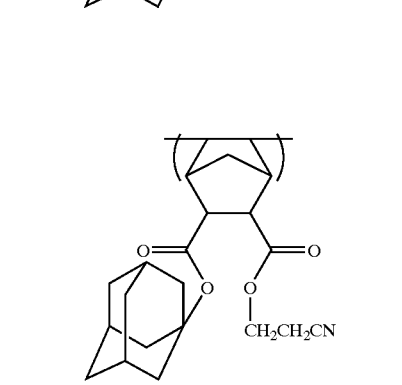
[II-38]
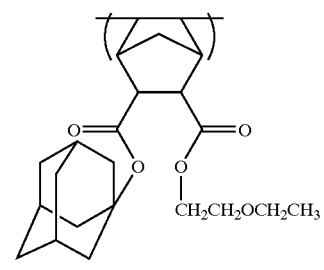

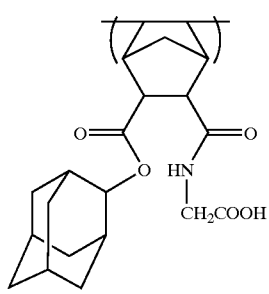 [II-39]
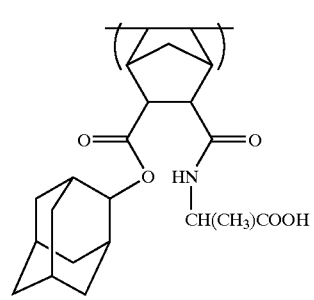 [II-40]
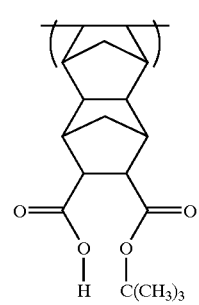 [II-41]
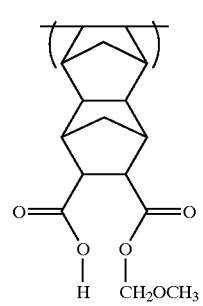 [II-42]
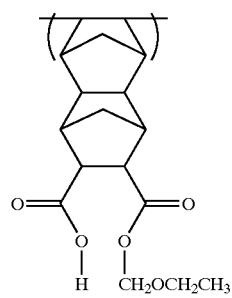 [II-43]
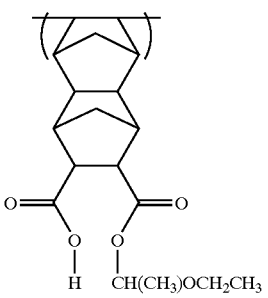 [II-44]
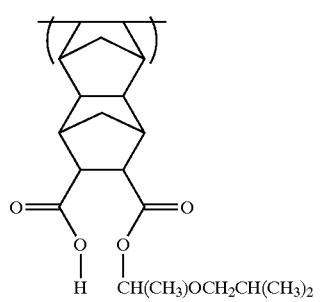 [II-45]
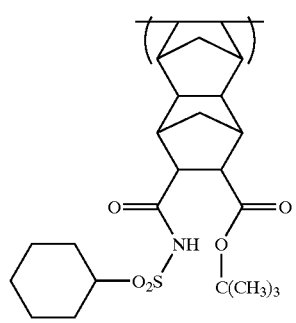 [II-46]
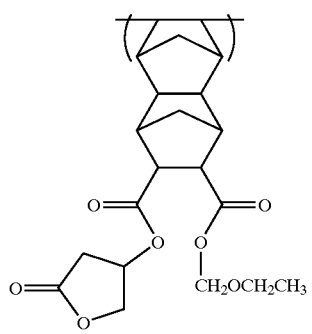 [II-47]
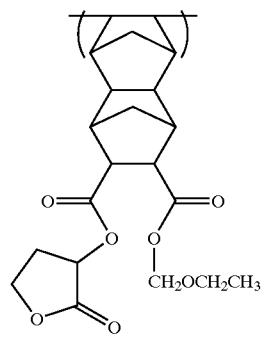 [II-48]

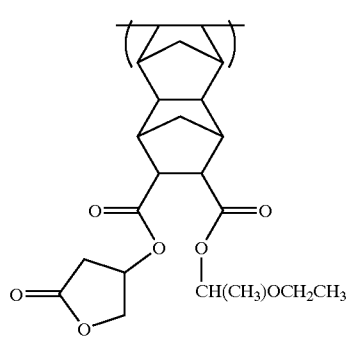
[II-49]
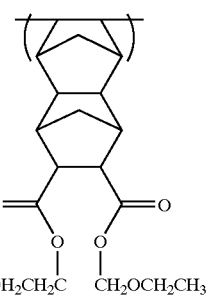
[II-54]
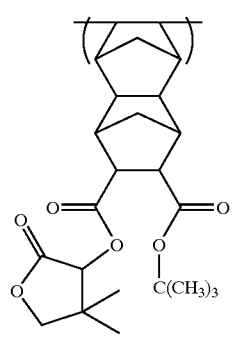
[II-50]
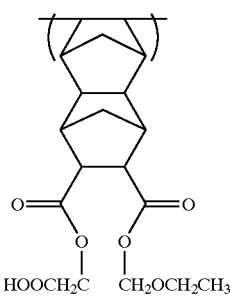
[II-55]
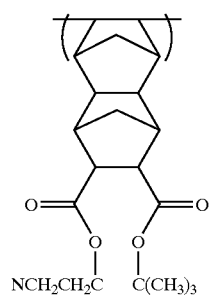
[II-51]
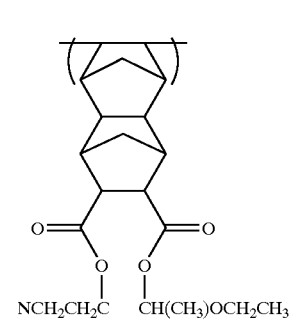
[II-56]
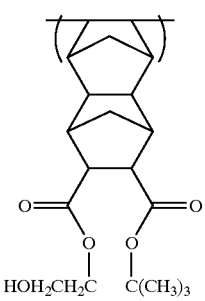
[II-52]
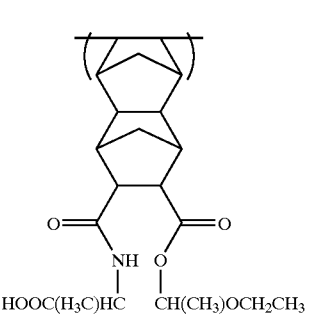
[II-57]
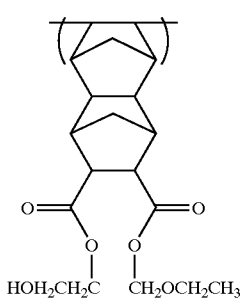
[II-53]
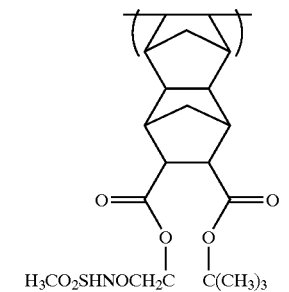
[II-58]

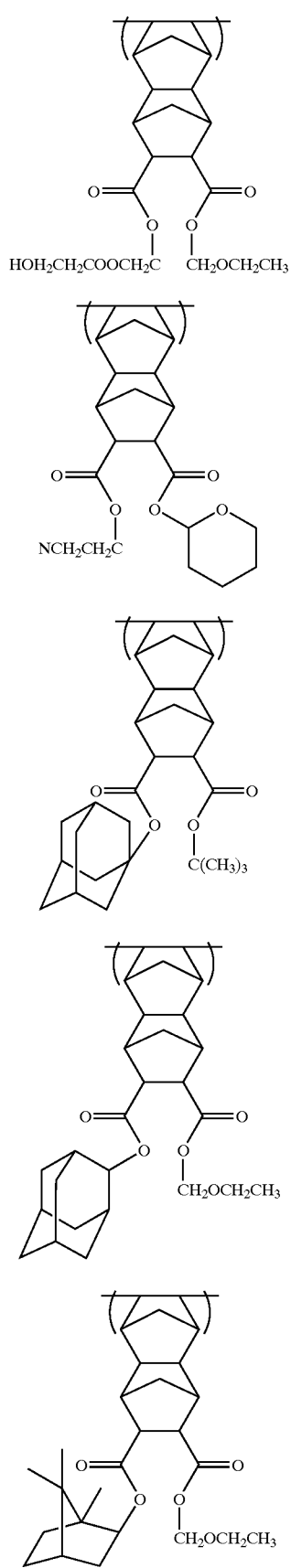
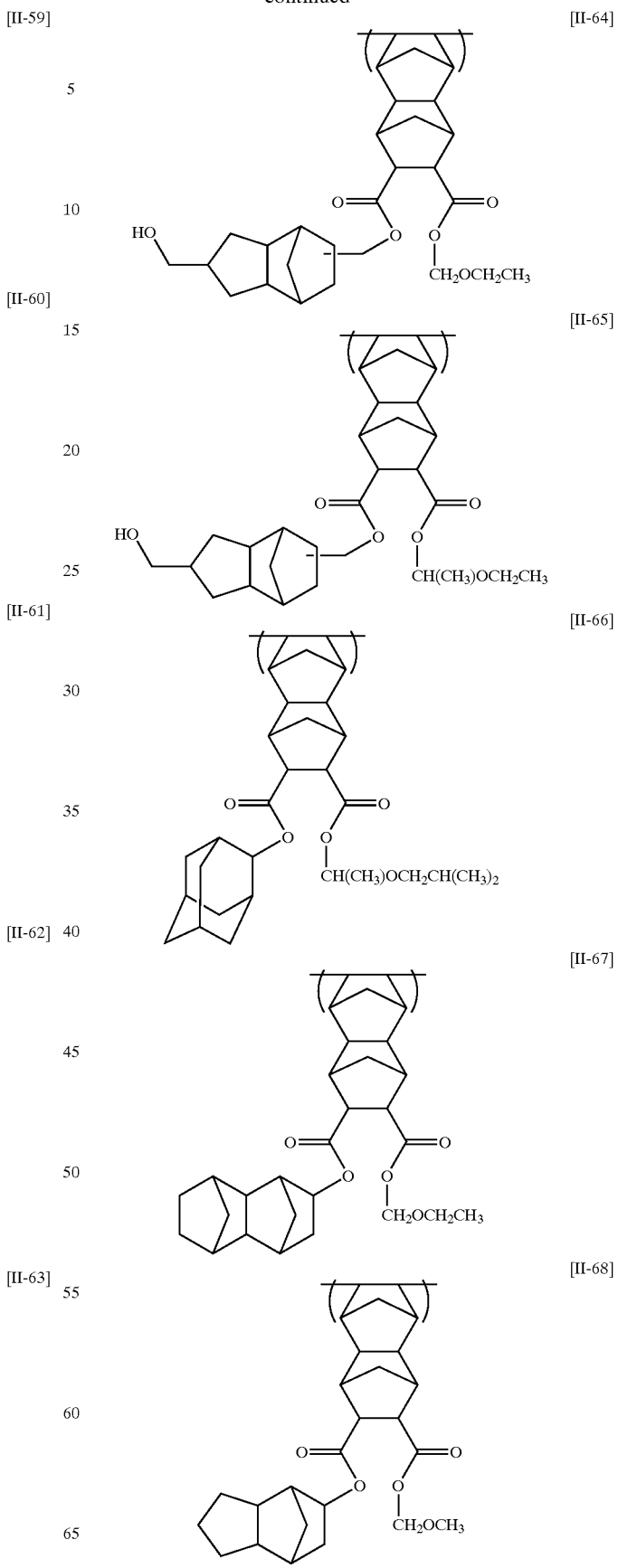

[II-69]
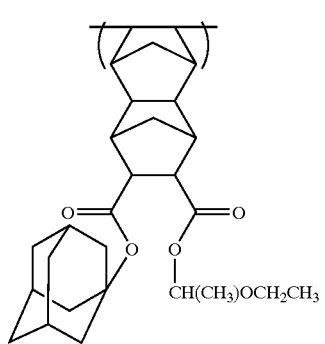
[II-70]
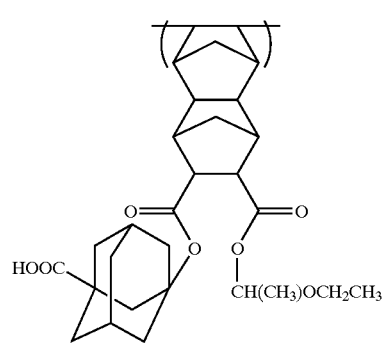
[II-71]
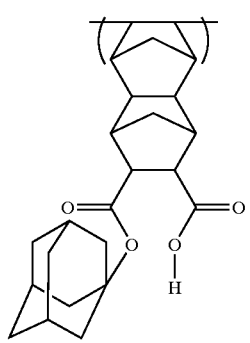
[II-72]
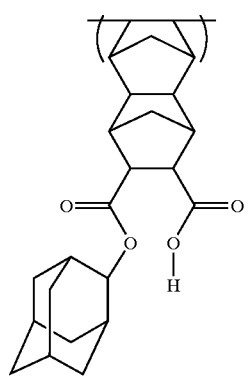
[II-73]
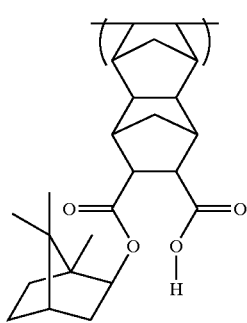
[II-74]
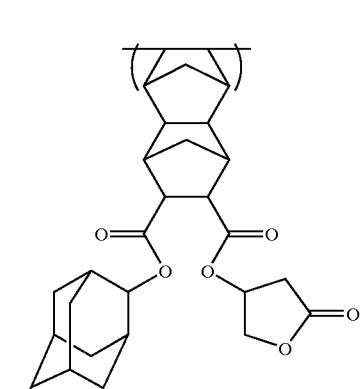
[II-75]
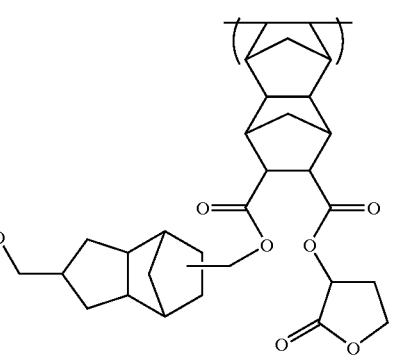
[II-76]
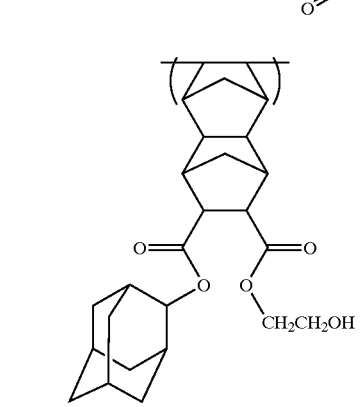

[II-77] 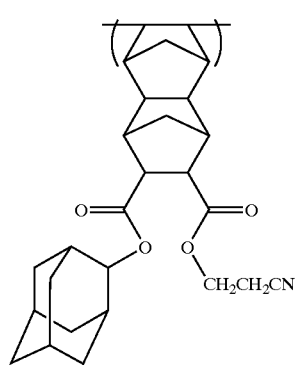
[II-78] 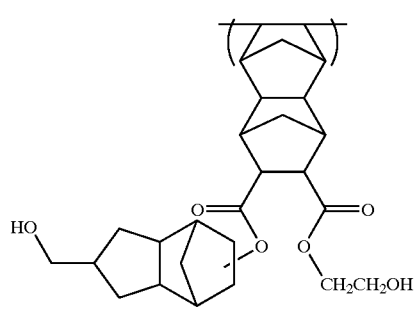
[II-79] 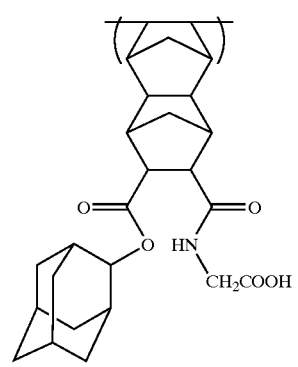
[II-80] 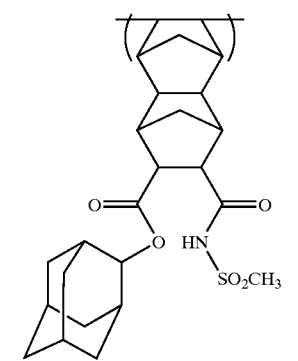
[II-81] 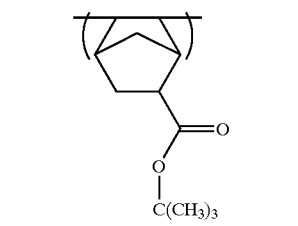
[II-82] 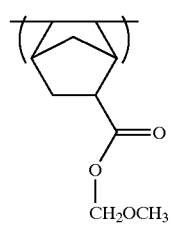
[II-83] 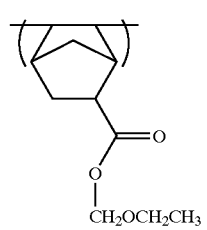
[II-84] 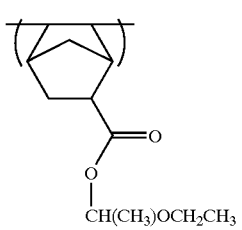
[II-85] 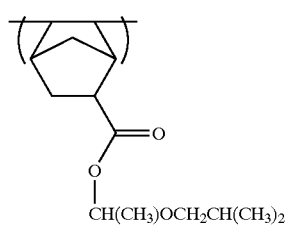
[II-86] 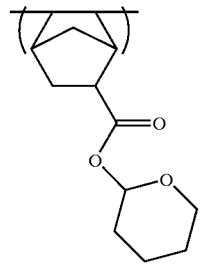
[II-87] 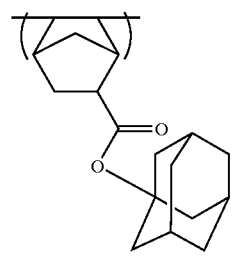

-continued
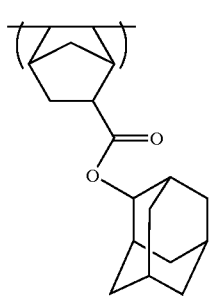
[II-88]
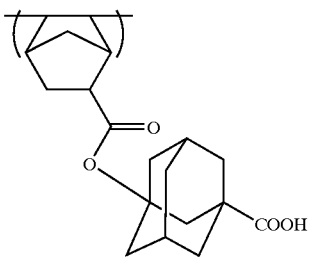
[II-94]
[II-89]
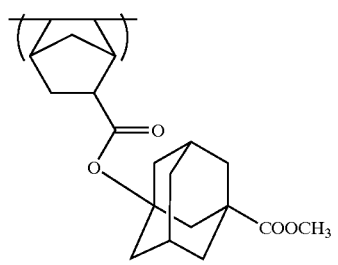
[II-95]
[II-90]
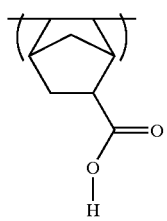
[II-96]
[II-91]
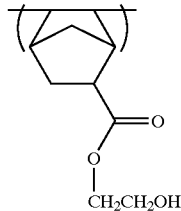
[II-97]
[II-92]
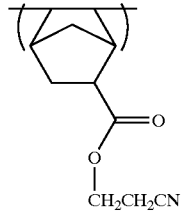
[II-98]
[II-93]
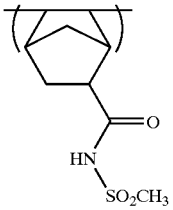
[II-99]

[II-100] 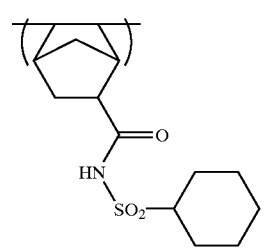
[II-101] 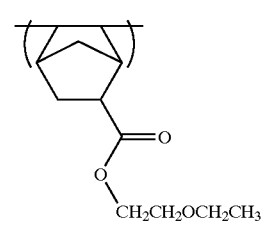
[II-102] 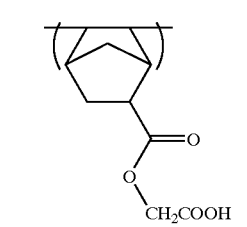
[II-103] 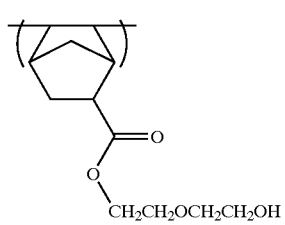
[II-104] 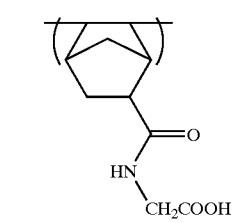
[II-105] 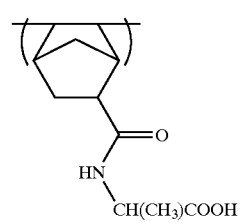
[II-106] 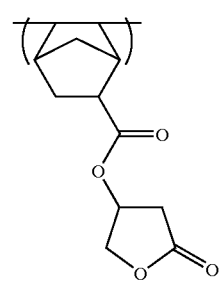
[II-107] 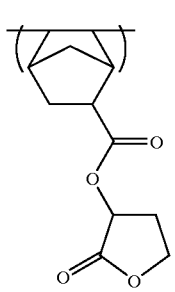
[II-108] 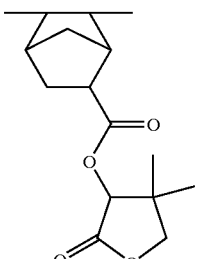
[II-109] 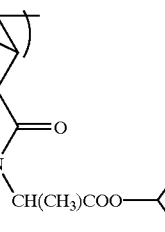
[II-110] 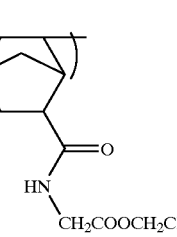
[II-111] 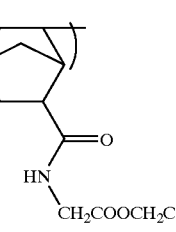
[II-112] 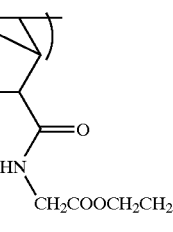

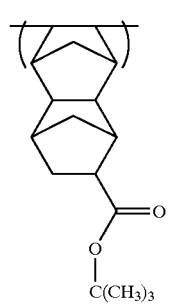 [II-113]
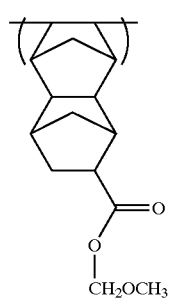 [II-114]
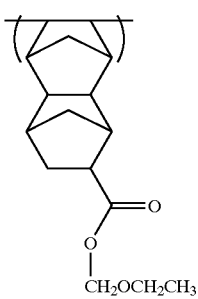 [II-115]
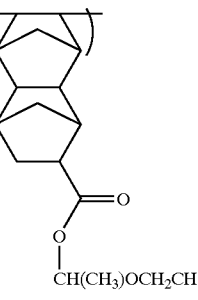 [II-116]
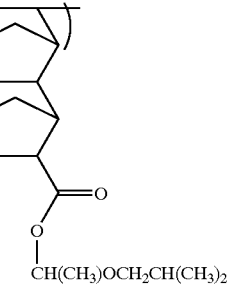 [II-117]
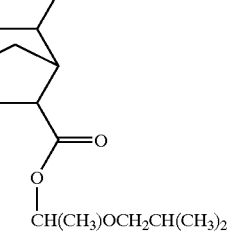 [II-118]
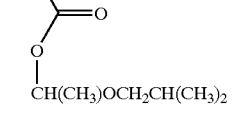 [II-119]
 [II-120]
 [II-121]

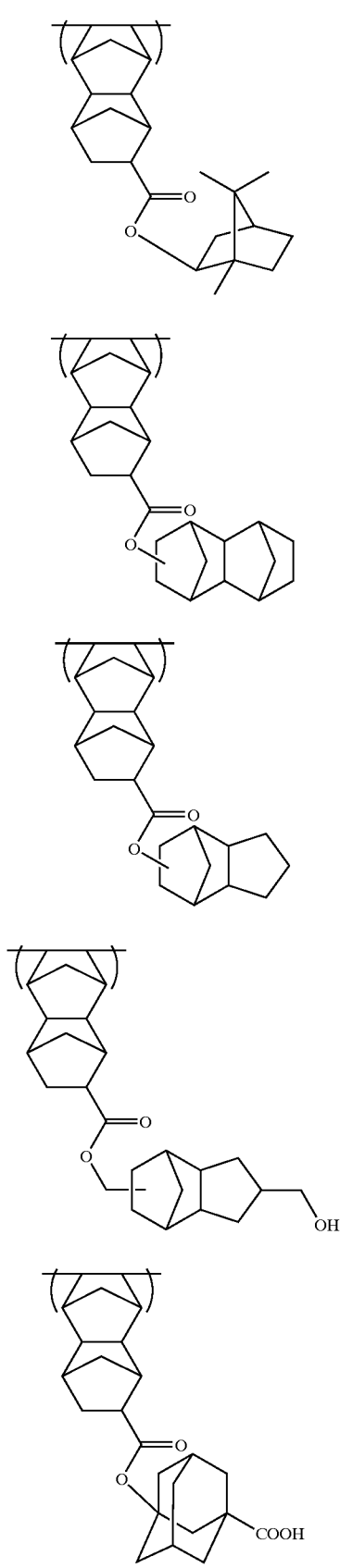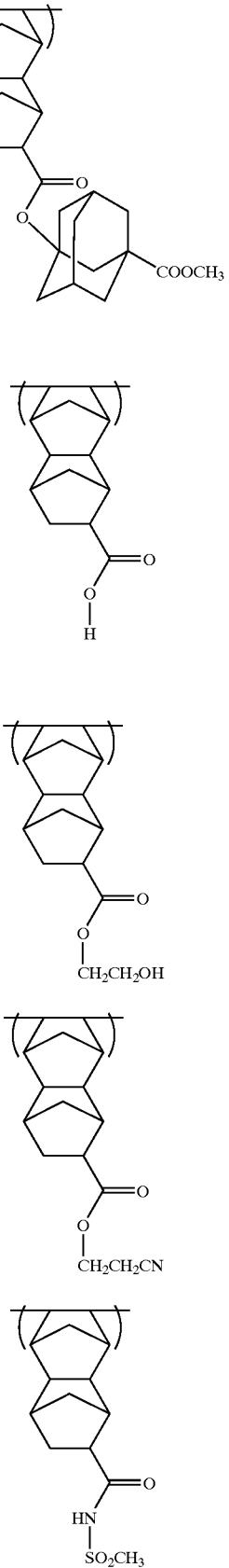

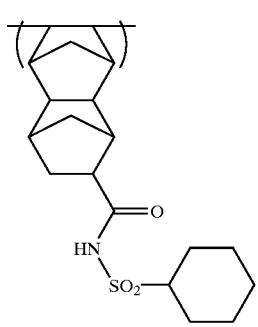 [II-132]
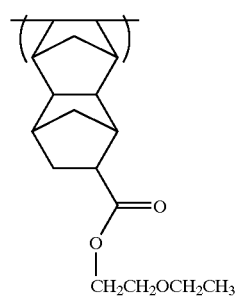 [II-133]
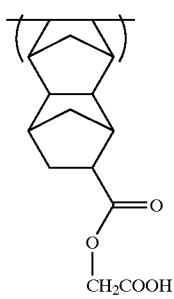 [II-134]
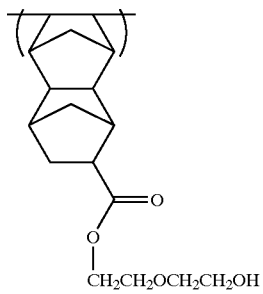 [II-135]
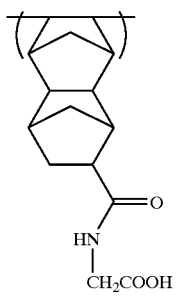 [II-136]
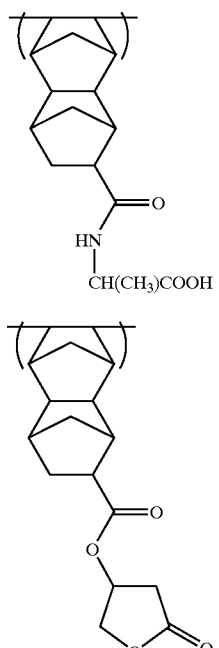 
[II-137]
[II-138]
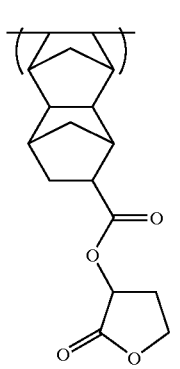 [II-139]
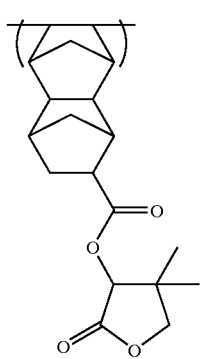 [II-140]

[II-141]
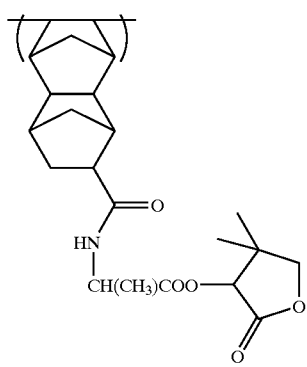
[II-142]
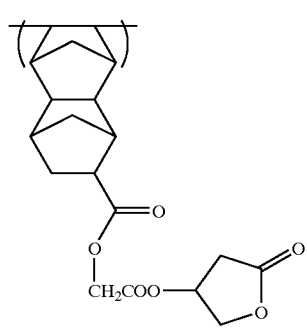
[II-143]
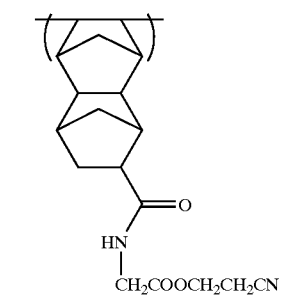
[II-144]
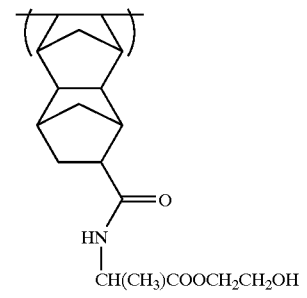
[II-145]
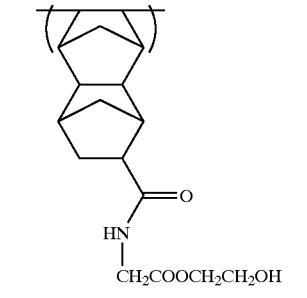
[II-146]
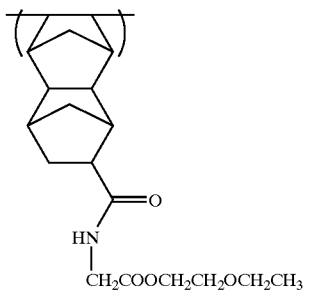
[II-147]
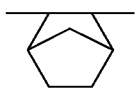
[II-148]
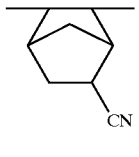
[II-149]
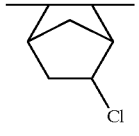
[II-149]
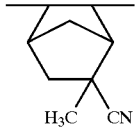
[II-150]
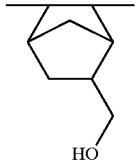
[II-151]
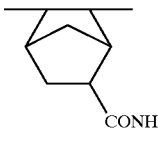
[II-152]
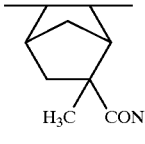
[II-153]
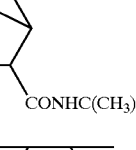
[II-154]
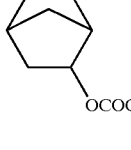

-continued
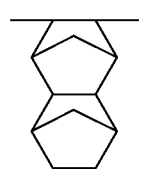 [II-155]
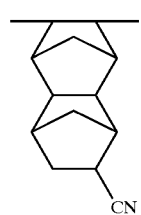 [II-156]
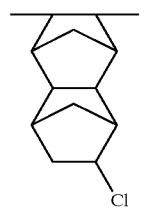 [II-157]
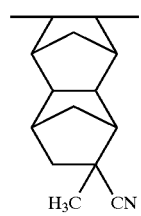 [II-158]
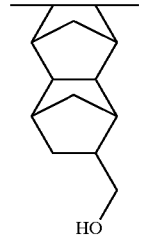 [II-159]
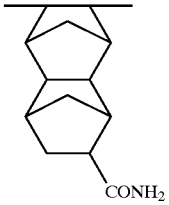 [II-160]
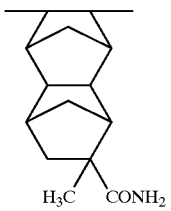 [II-161]
-continued
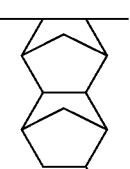
CONHC(CH$_3$)$_2$CH$_2$SO$_3$H
[II-162]
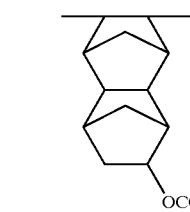 [II-163]
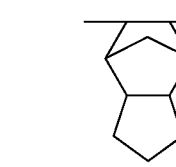 [II-164]
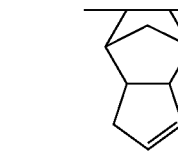 [II-165]
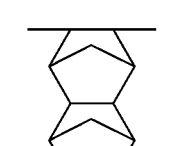 [II-166]
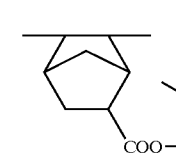 [II-167]
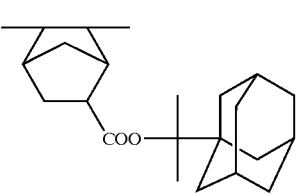 [II-168]
[II-169]

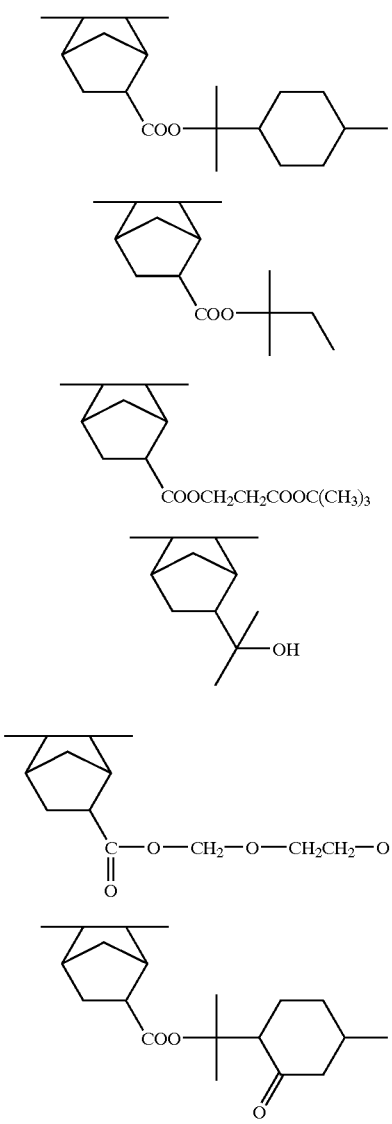

[II-170]

[II-171]

[II-172]

[II-173]

[II-174]

[II-175]

The acid-decomposing resin in the invention can further contain the repeating unit having the lactone structure shown by following formula (IV).

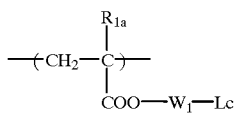

(IV)

Lc:

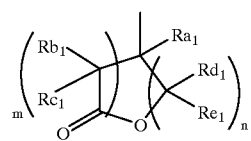

In the formula (IV) described above, $R_{1a}$ represents a hydrogen atom or a methyl group.

$W_1$ represents a single bond or, a single group or a combination of two or more groups selected from the class consisting of an alkylene group, an ether group, a thioether group, a carbonyl group, and an ester group.

$Ra_1$, $Rb_1$, $Rc_1$, $Rd_1$, and $Re_1$ each independently represents a hydrogen atom or an alkyl group having from 1 to 4 carbon atoms. Also, m and n each independently represents an integer of from 0 to 3, and m+n is 2 or larger but not larger than 6.

As the alkyl group having from 1 to 4 carbon atoms of $Ra_1$ to $Re_1$, there are methyl, ethyl, propyl, isopropyl, n-butyl, isobutyl, sec-butyl, t-butyl, etc.

In the formula (IV), as the alkylene group of $W_1$, where are the groups represented by the following formula;

$$-[C(Rf)(Rg)]_{r_1}-$$

In the above-described formula, Rf and Rg, which may be the same or different, each represents a hydrogen atom, an alkyl group, a substituted alkyl group, a halogen atom, a hydroxy group, or an alkoxy group.

As the alkyl group, a lower alkyl group such as methyl, ethyl, propyl, isopropyl, butyl, etc., is preferred and a more preferred alkyl group is selected from methyl, ethyl, propyl, and isopropyl. As the substituent of the substituted alkyl group, there are a hydroxy group, a halogen atom, and an alkoxy group. As the alkoxy group, there are the alkoxy groups having from 1 to 4 carbon atoms, such as methoxy, ethoxy, propoxy, butoxy, etc. As the halogen atom, there are chlorine, bromine, fluorine, iodine, etc. Also, in the above-described formula, $r_1$ represents an integer of from 1 to 10.

As the substituent of the above-described alkyl group, there are a carboxyl group, an acyloxy group, a cyano group, an alkyl group, a substituted alkyl group, a halogen atom, a hydroxy group, an alkoxy group, a substituted alkoxy group, an acetylamide group, an alkoxycarbonyl group, and an acyl group.

In this case, as the alkyl group, there are lower alkyls such as methyl, ethyl, propyl, isopropyl, butyl, cyclopropyl, cyclobutyl, cyclopentyl, etc. As the substituent of the substituted alkyl group, there are a hydroxyl group, a halogen atom, and an alkoxy group. As the substituent of the substituted alkoxy group, there are an alkoxy group, etc. As the alkoxy group, there are alkoxy groups having from 1 to 4 carbon atoms, such as methoxy, ethoxy, propoxy, butoxy, etc. As the acyloxy group, there are acetoxy group, etc. As the halogen atom, there are chlorine, bromine, fluorine, iodine, etc.

Then, practical examples of the monomer corresponding to the repeated structure unit shown by the formula (IV) are shown below but the invention is not limited to them.

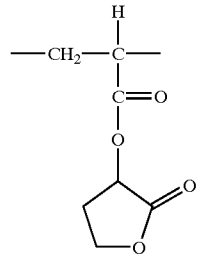

(IV-1)

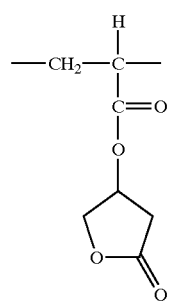 (IV-2)
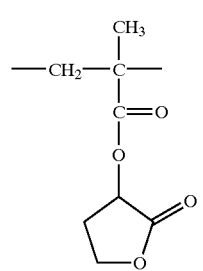 (IV-3)
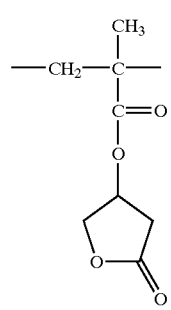 (IV-4)
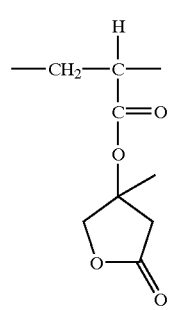 (IV-5)
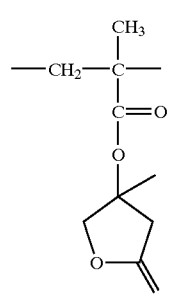 (IV-6)
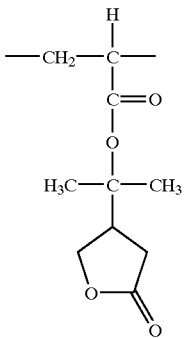 (IV-7)
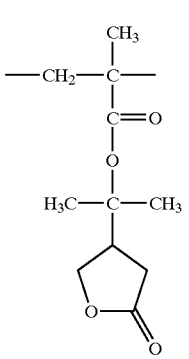 (IV-8)
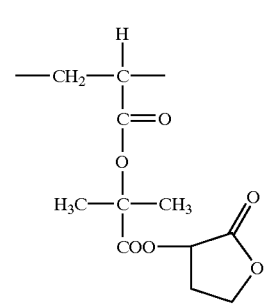 (IV-9)
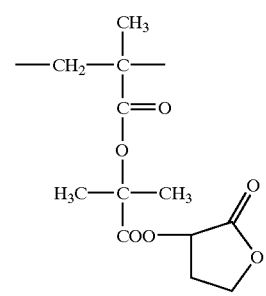 (IV-10)
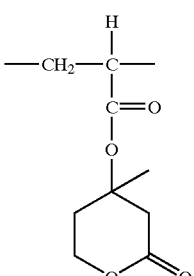 (IV-11)

(IV-12) 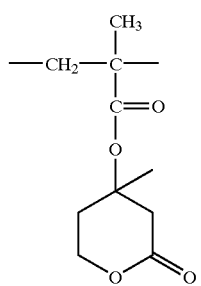
(IV-13) 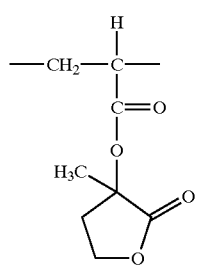
(IV-14) 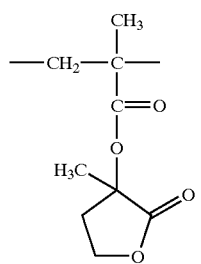
(IV-15) 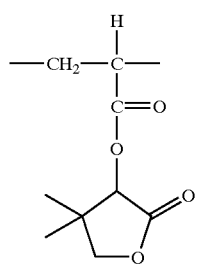
(IV-16) 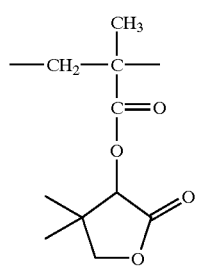
(IV-17) 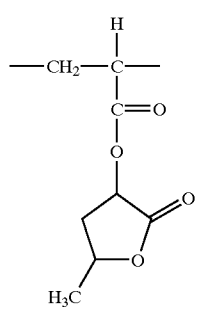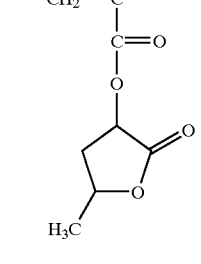
(IV-18) 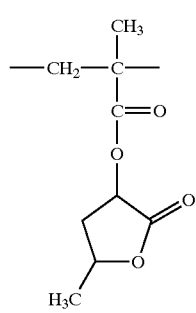
(IV-19) 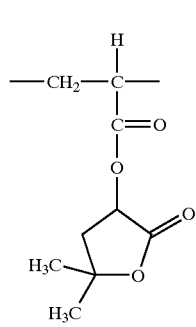
(IV-20) 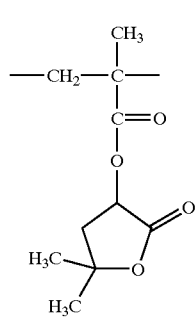
(IV-21) 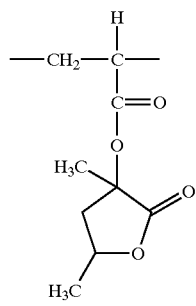
(IV-22) 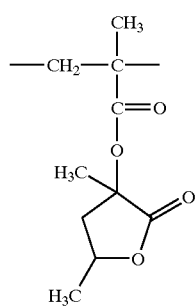

(IV-23) 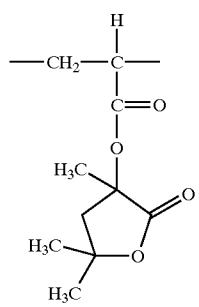
(IV-24) 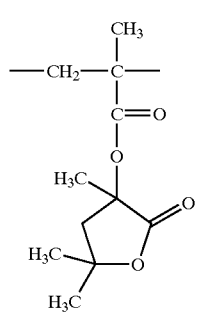
(IV-25) 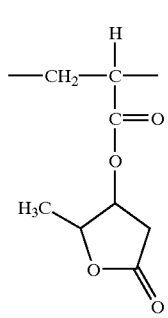
(IV-26) 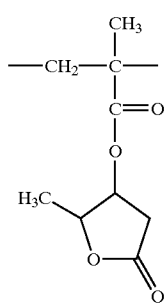
(IV-27) 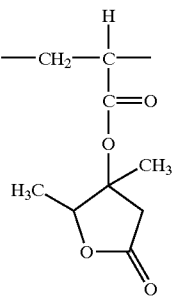
(IV-28) 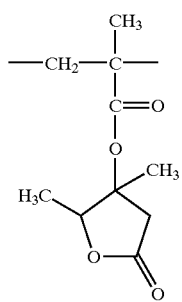
(IV-29) 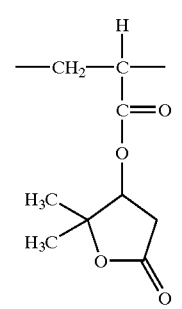
(IV-30) 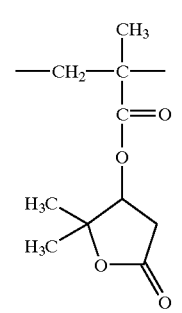
(IV-31) 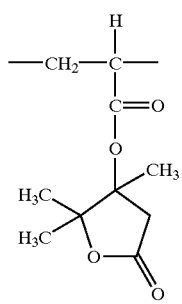
(IV-32) 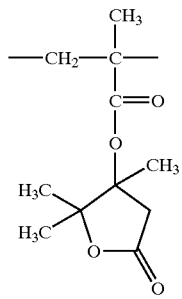

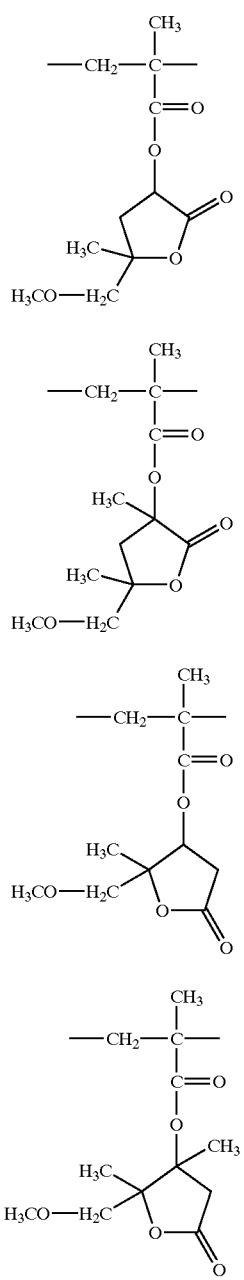

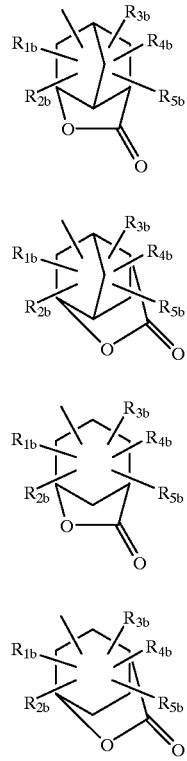

In the above-described practical examples of the formula (IV), from the point that the light exposure margin becomes better, (IV-17) to (IV-36) are preferred.

Furthermore, as the structure of the formula (IV), from the point that the edge roughness becomes good, the above-illustrated monomers having an acrylate structure are preferred.

Also, the acid-decomposing resin in the invention may have the repeating unit having the group represented by one of following formulae (V-1) to (V-4).

In the formulae (V-1) to (V-4), $R_{1b}$ to $R_{3b}$ each independently represents a hydrogen atom, an alkyl group, a cycloalkyl group, or an alkenyl group, each group may have a substituent. Also, two of $R_{1b}$ to $R_{5b}$ may be bonded to each other to form a ring.

In the formulae (V-1) to (V-4), as the alkyl groups of $R_{1b}$ to $R_{5b}$, there are straight chain and branched alkyl groups, which may have a substituent.

As the straight or branched alkyl groups, the straight or branched alkyl groups having from 1 to 12 carbon atoms are preferred, the straight or branched alkyl groups having from 1 to 10 carbon atoms are more preferred, and methyl, ethyl, propyl, isopropyl, n-butyl, isobutyl, sec-butyl, t-butyl, pentyl, hexyl, heptyl, octyl, nonyl, and decyl are far more preferred.

As the cycloalkyl group in $R_{1b}$ to $R_5$, the cycloalkyl groups having from 3 to 8 carbon atoms, such as cyclopropyl, cyclopentyl, cyclohexyl, cycloheptyl, cyclooctyl, etc., are preferred.

As the alkenyl group in $R_{1b}$ to $R_{5b}$, the alkenyl groups having from 2 to 6 carbon atoms, such as vinyl, propenyl, butenyl, hexenyl, etc., are preferred.

Also, as the ring formed by bonding two groups in $R_{1b}$ to $R_5$, there are the 3-to 8-membered rings such as a cyclopropane ring, a cyclobutane ring, a cyclopentane ring, a cyclohexane ring, a cyclooctane ring, etc.

In addition, each of $R_{1b}$ to $R_{5b}$ in the formulae (V-1) to (V-4) may be bonded to any one the carbon atoms constituting the cyclic skeleton.

Also, the alkyl group, the cycloalkyl group, or the alkenyl group described above may have a substituent, and as the preferred substituent, there are an alkoxy group having from 1 to 4 carbon atoms, a halogen atom (e.g., fluorine, chlorine, bromine, and iodine), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms, a nitro group, etc.

As the repeating unit having the group shown by the formula (V-1) to (V-4), there are the repeating unit wherein at least one of $R_{13}'$ to $R_{16}'$ in the formula (II-A) or (II-B) described above has the group shown by the formula (V-1) to (V-4) [for example, $R_5$ of $-COOR_5$ shows the group represented by the formula (V-1) to (V-4)], and the repeating groups represented by following formula (AI), etc.

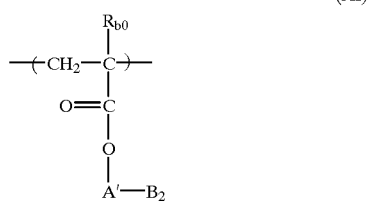

(AI)

In the formula (AI), $R_{b0}$ represents a hydrogen atom, a halogen atom, or a substituted or unsubstituted alkyl group having from 1 to 4 carbon atoms. As the substituent of the substituted alkyl group, there are those illustrated above as the preferred substituents each of which may be bonded to the alkyl group as $R_{1b}$ in the formula (V-1) to (V-4) described above.

As the halogen atom of $R_{b0}$, there are fluorine, chlorine, bromine, and iodine. However, $R_{b0}$ is preferably a hydrogen atom.

A' represents a single bond, an ether group, an ester group, a carbonyl group, an alkylene group, or a divalent group formed by combining them.

$B_2$ represents a group shown by one of the formulae (V-1) to (V-4). In A', as the divalent group formed by combining the above-described groups, for example, there are the groups represented by following formulae.

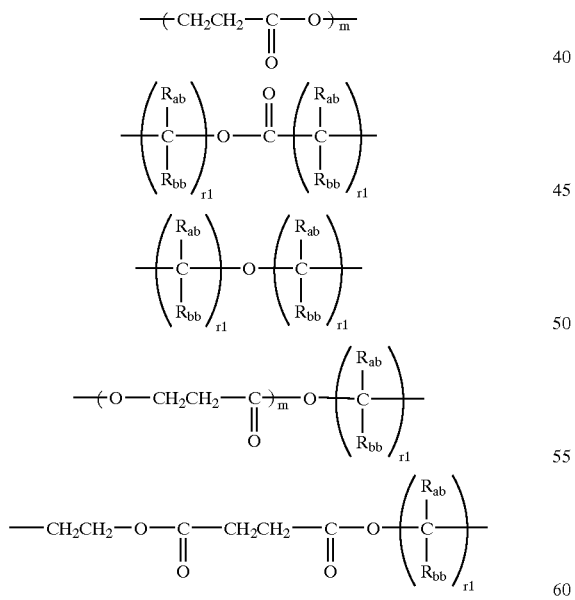

In the above-described formulae, Rab and Rbb, which may be the same or different, each represents a hydrogen atom, an alkyl group, a substituted alkyl group, a halogen atom, a hydroxy group, or an alkoxy group.

As the alkyl group, lower alkyl groups such as methyl, ethyl, propyl, isopropyl, butyl, etc., are preferred, and far preferred alkyl group is selected from methyl, ethyl, propyl, and isopropyl. As the substituent of the substituted alkyl group, there are a hydroxy group, a halogen group, and an alkoxy group having from 1 to 4 carbon atoms.

As the alkoxy group, there are alkoxy groups having from 1 to 4 carbon atoms, such as methoxy, ethoxy, propoxy, butoxy, etc. As the halogen atom, there are chlorine, bromine, fluorine, iodine, etc. Also, r1 represent an integer of from 1 to 10, and preferably from 1 to 4 and m represents an integer of from 1 to 3, and preferably 2.

Then, practical examples of the repeating unit shown by the formula (AI) are shown below, but the contents of the invention are not limited to these examples.

(Ib-1)

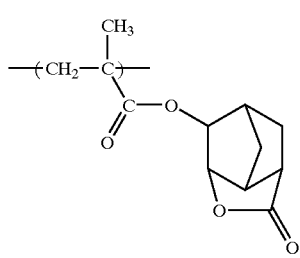

(Ib-2)

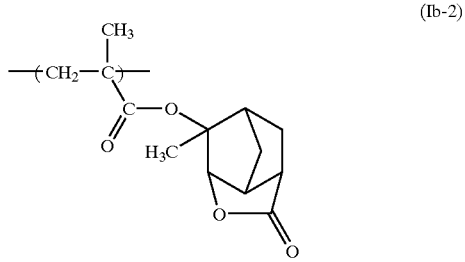

(Ib-3)

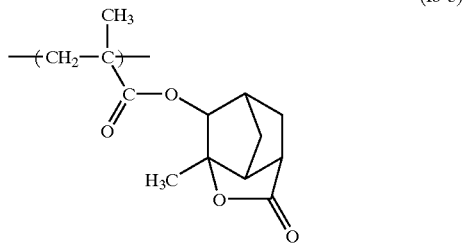

(Ib-4)

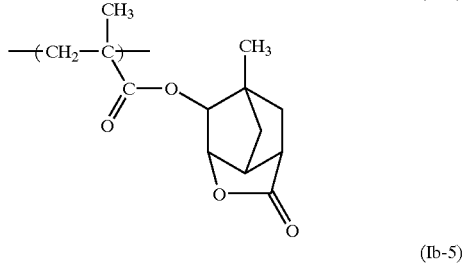

(Ib-5)

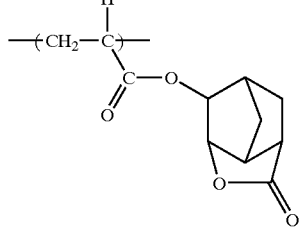

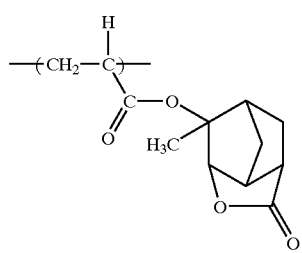 (Ib-6)
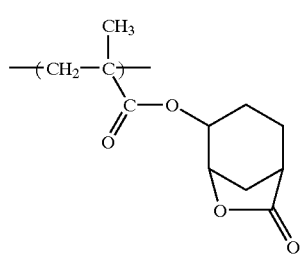 (Ib-7)
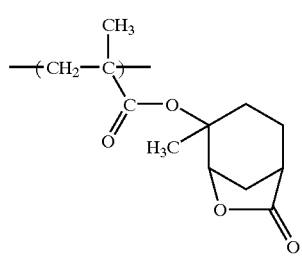 (Ib-8)
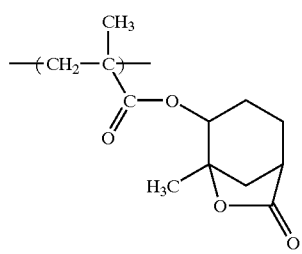 (Ib-9)
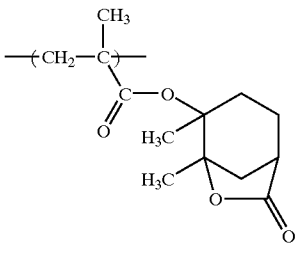 (Ib-10)
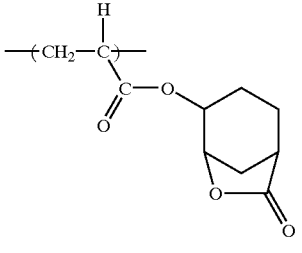 (Ib-11)
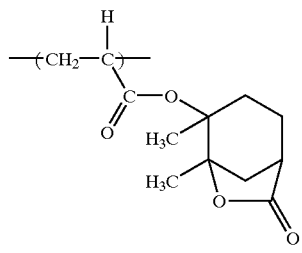 (Ib-12)
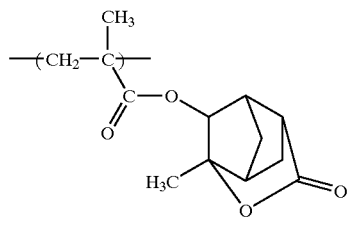 (Ib-13)
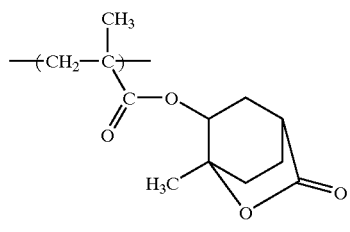 (Ib-14)
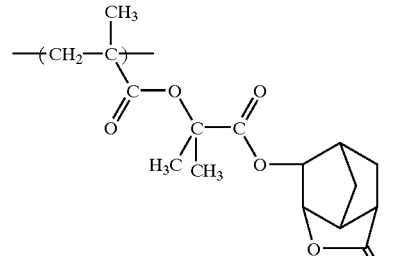 (Ib-15)
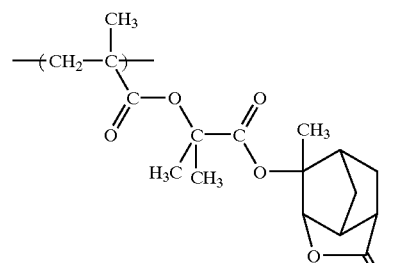 (Ib-16)
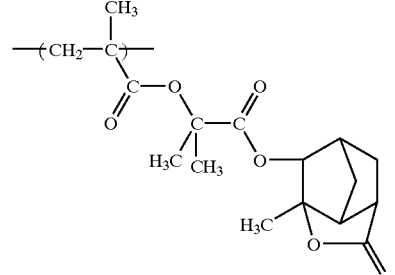 (Ib-17)

(Ib-18) 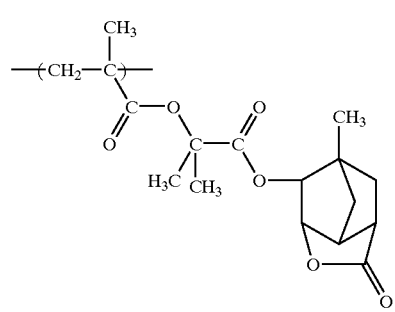
(Ib-19) 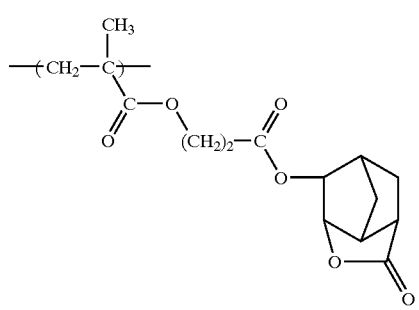
(Ib-20) 
(Ib-21) 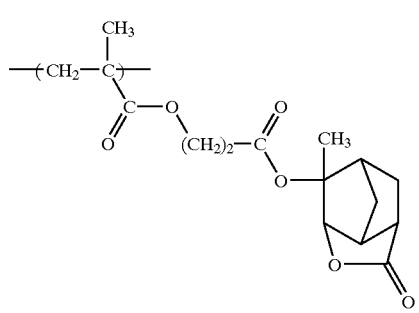
(Ib-22) 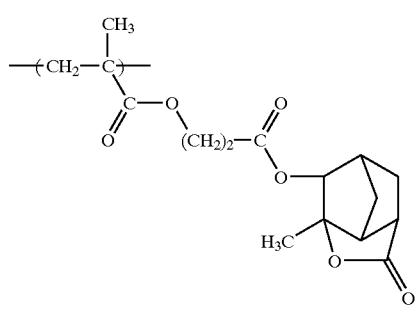
(Ib-23) 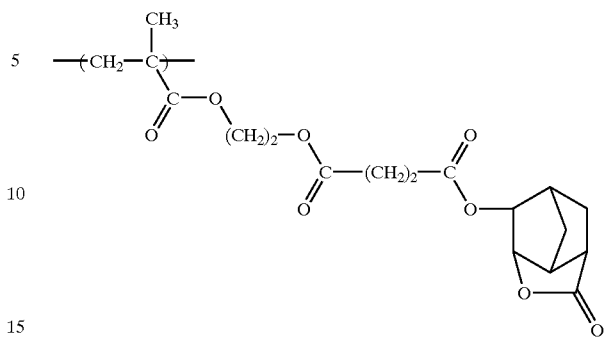
(Ib-24) 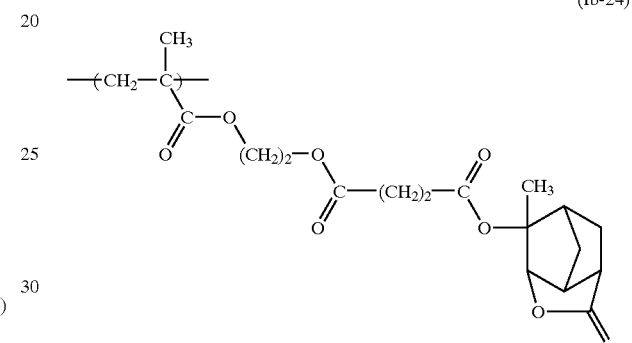
(Ib-25) 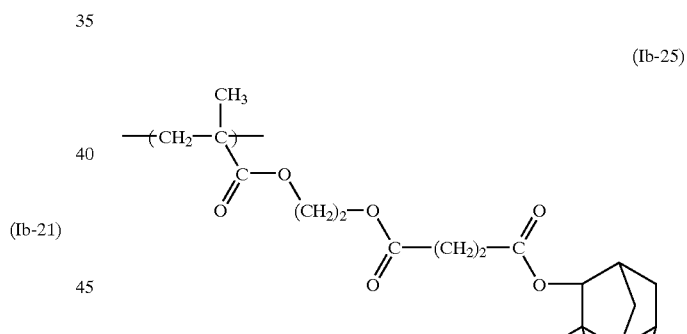
(Ib-26) 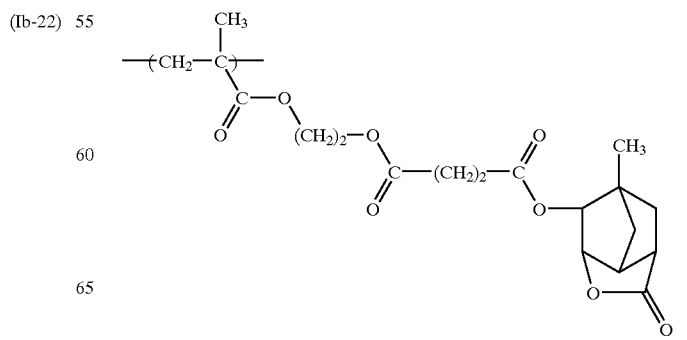

-continued
(Ib-27)
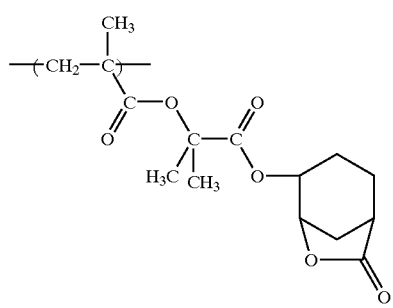
(Ib-28)
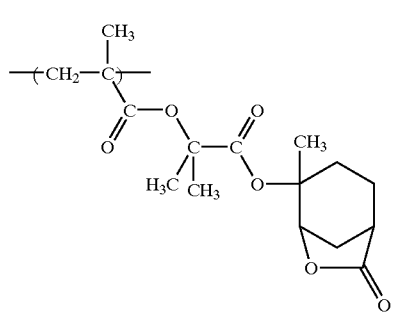
(Ib-29)
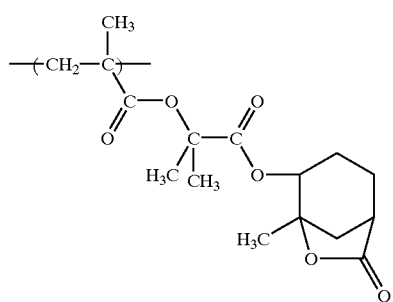
(Ib-30)
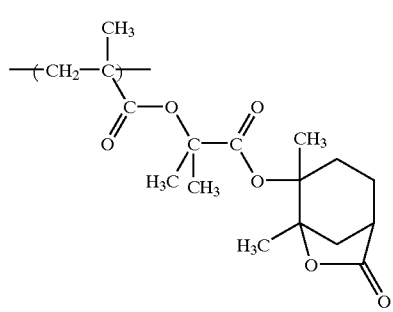
(Ib-31)
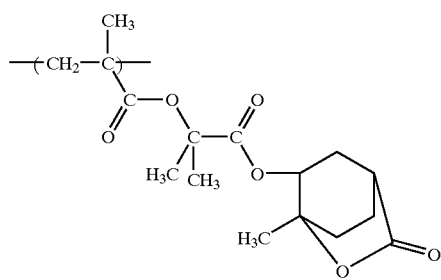
-continued
(Ib-32)
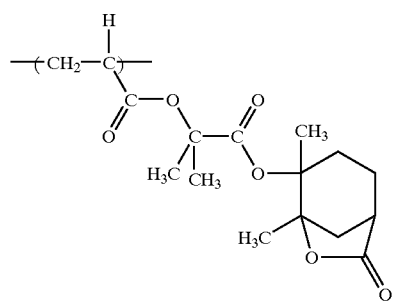
(Ib-33)
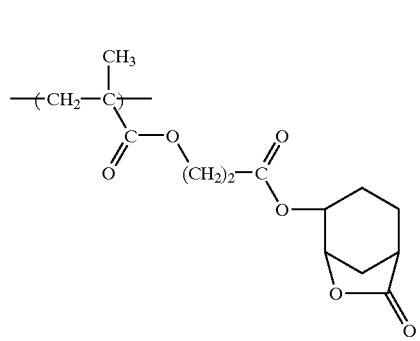
(Ib-34)
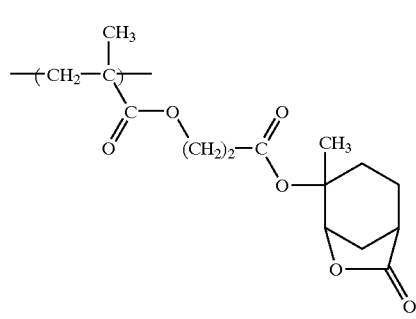
(Ib-35)
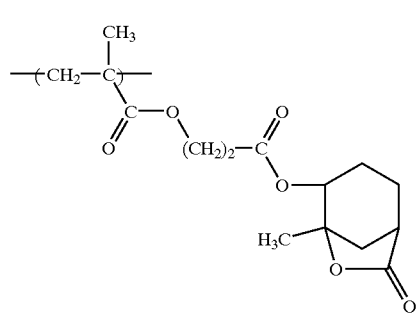
(Ib-36)
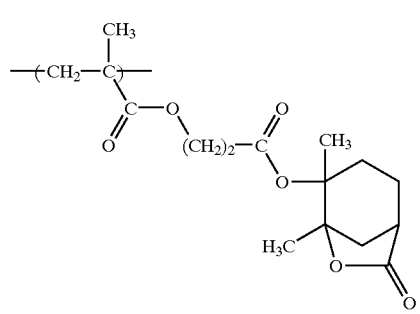

(Ib-37)
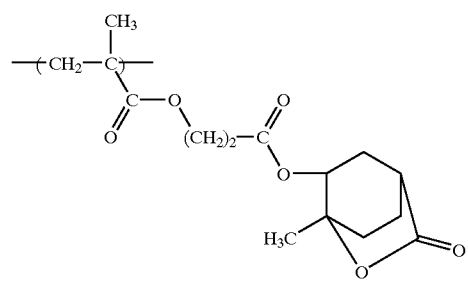

(Ib-38)
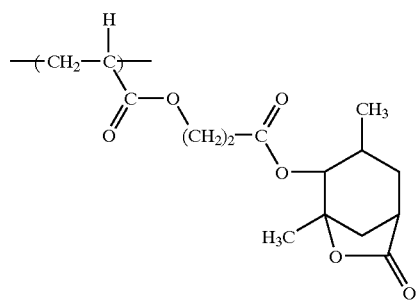

(Ib-39)
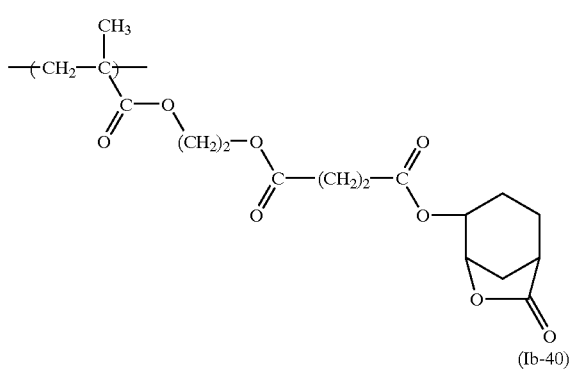

(Ib-40)
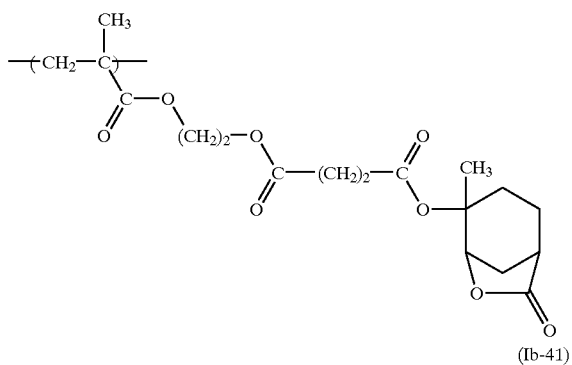

(Ib-41)
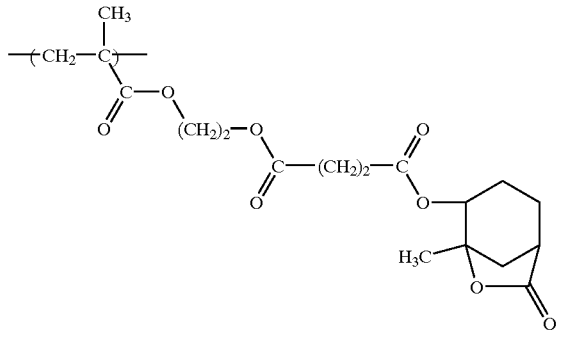

(Ib-42)
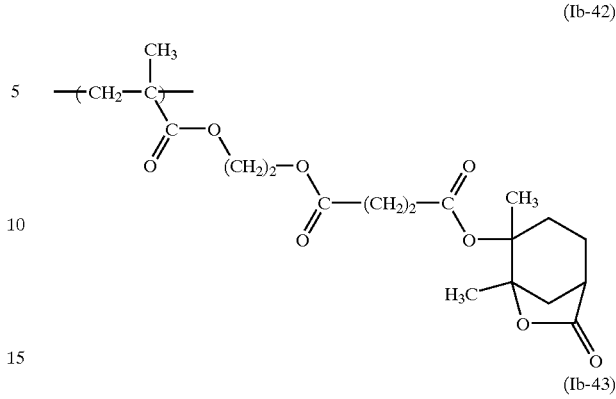

(Ib-43)
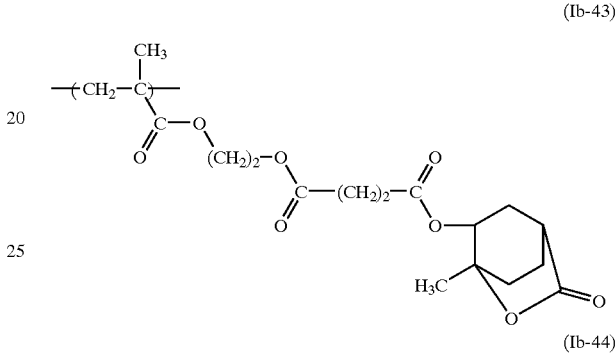

(Ib-44)
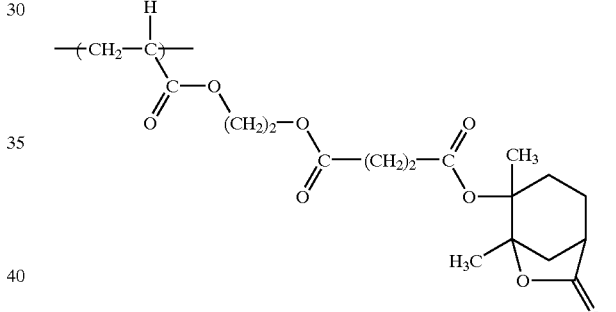

Also, the acid-decomposing resin in the invention can contain the repeating unit represented by following formula (VI).

(VI)
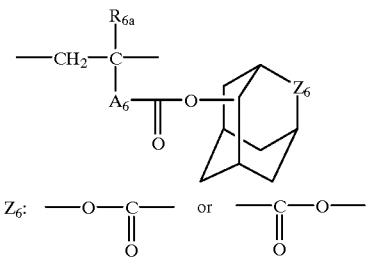

In the formula (VI), $A_6$ represents a single bond or a single group or a combination of two or groups selected from the class consisting of an alkylene group, a cycloalkylene group, an ether group, a thioether group, a carbonyl group, and an ester group.

$R_{6a}$ represents a hydrogen atom, an alkyl group having from 1 to 4 carbon atoms, a cyano group, or a halogen atom.

In the formula (VI), as the alkylene group of $A_6$, there are groups represented by the following formula.

$$-[C(Rnf)(Rng)]_r-$$

In the above-described formula, Rnf and Rng, which may be the same or different, each represents a hydrogen atom, an alkyl group, a substituted alkyl group, a halogen atom, a hydroxy group, or an alkoxy group.

As the alkyl group, lower alkyl groups such as methyl, ethyl, propyl, isopropyl, butyl, etc., and more preferable alkyl group is selected from methyl, ethyl, propyl, and isopropyl. As the substituent of the substituted alkyl group, there are a hydroxy group, a halogen atom, and an alkoxy group. As the alkoxy group, there are alkoxy groups having from 1 to 4 carbon atoms, such as methoxy, ethoxy, propoxy, butoxy, etc. As the halogen atom, there are chlorine, bromine, fluorine, iodine, etc. Also, r is an integer of from 1 to 10.

In the formula (VI), as the cycloalkylene group of $A_6$, there are the cycloalkyl groups having from 3 to 10 carbon atoms, such as cyclopentylene, cyclohexylene, cyclooctylene, etc.

In the formula (VI), the bridged cyclic ring containing $Z_6$ may have a substituent. Examples of the substituent are a halogen atom, an alkoxy group (preferably having from 1 to 4 carbon atoms), an alkoxycarbonyl group (preferably having from 1 to 5 carbon atoms), an acyl group (such as formyl and benzoyl), an acyloxy group (such as propylcarbonyloxy and benzoyloxy), an alkyl group (preferably having from 1 to 4 carbon atoms), a carboxyl group, a hydroxy group, and an alkylsulfonylsulfamoyl group ($-CONHSO_2CH_3$, etc.). In addition, the alkyl group as the substituent may be further substituted by a hydroxy group, a halogen atom, an alkoxy group (preferably having from 1 to 4 carbon atoms), etc.

In the formula (VI), the oxygen atom of the ester group bonded to $A_6$ may be bonded at any position of the carbon atoms constituting the bridged alicyclic ring structure containing $Z_6$.

Then, practical examples of the repeating unit shown by the formula (VI) are illustrated below, but the invention is not limited to them.

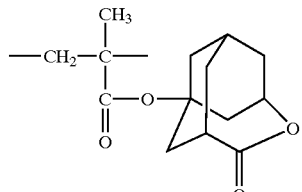

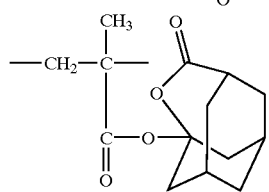

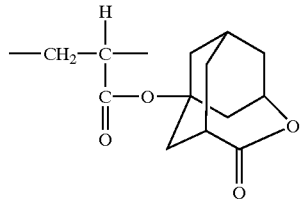

-continued

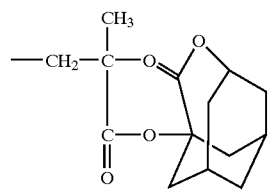

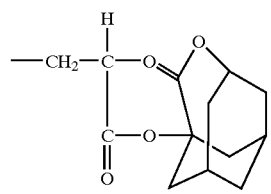

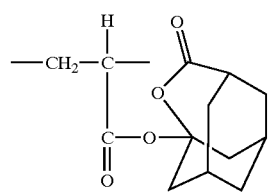

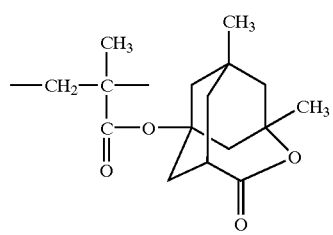

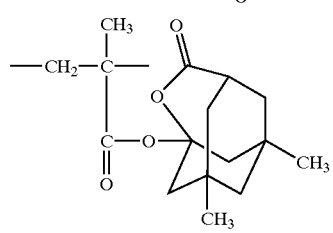

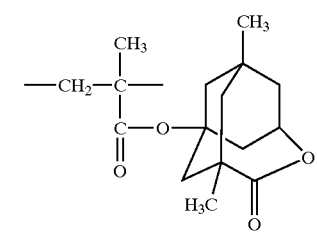

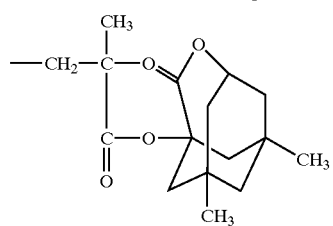

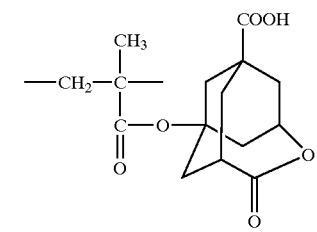

-continued

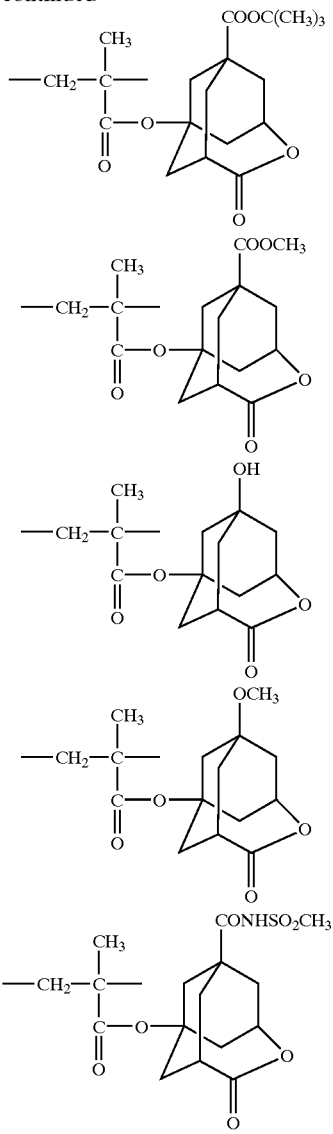

Furthermore, the acid-decomposing resin in the invention may further contain the repeating unit having the group represented by the following formula (VII).

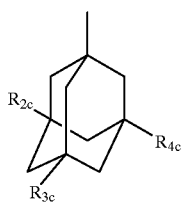

(VII)

In the formula (VII), $R_{2c}$ to $R_{4c}$ each independently represents a hydrogen atom or a hydroxy group, and at least one of $R_{2c}$ to $R_{4c}$ represents a hydroxy group.

The group shown by the formula (VII) is preferably a dihydroxy material or a monohydroxy material, and more preferably a dihydroxy material.

As the repeating unit having the group shown by the formula (V-II), there are the repeating unit wherein at least one of $R_{13}{}'$ to $R_{16}{}'$ in the formula (II-A) or (II-B) described above has the group shown by the formula (V-II) [for example, $R_5$ of —$COOR_5$ shows the group represented by the formula (V-1) to (V-4)], and the repeating groups, etc., represented by following formula (AII).

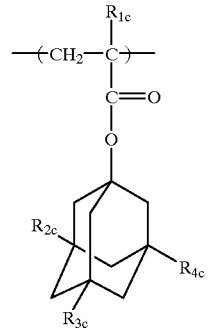

(AII)

In the formula (AII) described above, $R_{1c}$ represents a hydrogen atom or a methyl group.

$R_{2c}$ to $R_{4c}$ each independently represents a hydrogen atom or a hydroxy group. Wherein, however, at least one of $R_{2c}$ to $R_{4c}$ represents a hydroxy group.

Then, practical examples of the repeating unit having the structure shown by the formula (AII) are illustrated below, but the invention is not limited to them.

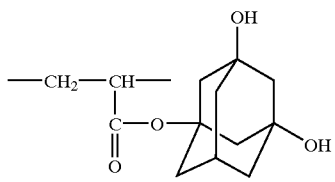
(1)

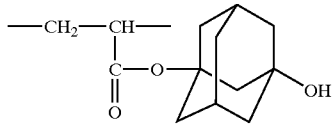
(2)

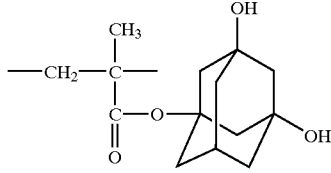
(3)

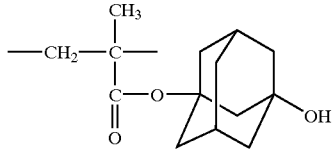
(4)

Furthermore, the acid-deposing resin in the invention further contains the repeating unit having the group represented by the following formula (VIII).

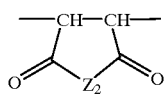
(VIII)

In the formula (VIII):

$Z_2$ represents —O— or —N($R_{41}$). Wherein $R_{41}$ represents a hydrogen atom, a hydroxy group, an alkyl group, a haloalkyl group, or —OSO$_2$—$R_{42}$ Also, $R_{42}$ represents an alkyl group, a haloalkyl group, a cycloalkyl group, or a camphor residue.

As the alkyl group in above-described $R_{41}$ and $R_{42}$, the straight chain or branched alkyl groups having from 1 to 10 carbon atoms are preferred, the straight chain or branched alkyl groups having from 1 to 6 carbon atoms are more preferred, and methyl, ethyl, propyl, isopropyl, n-butyl, isobutyl, sec-butyl, and t-butyl are far more preferred.

As the haloalkyl group in above-described $R_{41}$ and $R_{42}$, there are trifluoromethyl, nanofluoromethyl, pentadecafluorooctyl, trichloromethyl, etc. As the cycloalkyl group in $R_{42}$, there are cyclopentyl, cyclohexyl, cyclooctyl, etc.

The alkyl group and the haloalkyl group in $R_{41}$ and $R_{42}$, and the cycloalkyl group or the camphor residue in $R_{42}$ each may have a substituent. As such a substituent, there are, for example, a hydroxy group, a carboxyl group, a cyano group, a halogen atom (e.g., chlorine, bromine, fluorine, and iodine), an alkoxy group (preferably having from 1 to 4 carbon atoms, such as methoxy, ethoxy, propoxy, butoxy, etc.), an acyl group (preferably having from 2 to 5 carbon atoms, such as formyl, acetyl, etc.), an acyloxy group (preferably having from 2 to 5 carbon atoms, such as acetoxy, etc.), and an aryl group (preferably having from 6 to 14 carbon atoms, such as phenyl, etc.).

Then, as the practical examples of the repeating unit shown by the formula (VIII), following {I'-1} to [I'-7] are illustrated but the invention is not limited to them.

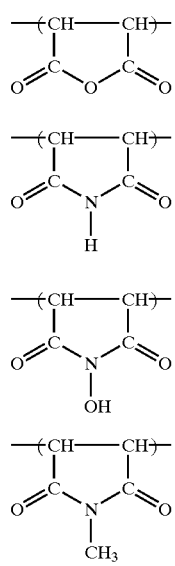

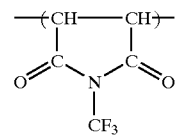

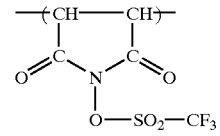

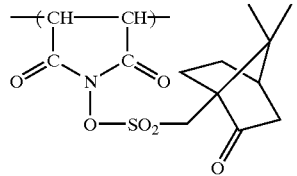

The acid-decomposing resin, which is the component (A) in the invention, can further contain, in addition to the above-described repeating structure units, various repeating structure units for the purposes of controlling the dry etching resistance, the standard developer aptitude, the adhesion to substrate, the resist profile, and further the resolution, the heat resistance, the sensitivity, etc., which are the characteristics generally necessary for resist.

As such other repeating structure units, the repeating structure units corresponding to the following monomers can be illustrated but the invention is not limited to these monomers.

By these repeating structure units, the performance required to the acid-decomposing resins, particularly, the fine controls of (1) the solubility in the coating solvent,
(2) the film-forming property (glass-transition point),
(3) the alkali developing property,
(4) the film loss (hydrophobic property, selection of alkali soluble group),
(5) the adhesion of unexposed portion to the substrate,
(6) the dry etching resistance, etc., become possible.

As such a monomer, there are, for example, the compounds each having one addition polymerizing unsaturated bond selected from acrylic acid esters, methacrylic acid esters, acrylamides, methacrylamides, allyl compounds, vinyl ethers, vinyl esters, etc.

Practically, there are following monomers.

Acrylic acid esters (preferably, alkyl acrylates wherein the carbon atom number of the alkyl group of from 1 to 10):

Methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl-acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate, etc.

Methacrylic acid esters (preferably, alkyl methacrylate wherein the carbon atom number of the alkyl group is from 1 to 10):

Methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, etc.

Acrylamides:

Acrylamide, N-alkylacrylamide (the alkyl group having from 1 to 10 carbon atoms, such as, for example, methyl, ethyl, propyl, butyl, t-butyl, heptyl, octyl, cyclohexyl, and hydroxyethyl), N,N-dialkylacrylamide (the alkyl group having from 1 to 10 carbon atoms, such as, for example, methyl, ethyl, butyl, isobutyl, ethylhexyl, and cyclohexyl), N-hydroxyethyl-N-methylacrylamide, N-2-acetamidoethyl-N-acetylacrylamide, etc.

Methacrylamides:

Methacrylamide, N-alkylmethacrylamide (the alkyl group having from 1 to 10 carbon atoms, such as, for example, methyl, ethyl, t-butyl, ethylhexyl, hydroxyethyl, and cyclohexyl), N,N-dialkylmethacrylamide (as the alkyl group, there are ethyl, propyl, butyl, etc.), N-hydroxyethyl-N-methylmethacrylamide, etc.

Allyl Compounds:

Allyl esters (for example, allyl acetate, allyl caproate, allyl caprylate, allyl laurate, allyl palmitate, allyl stearate, allyl benzoate, and allyl lactate), allyl oxyethanol, etc.

Vinyl Ethers:

Alkyl vinyl ether (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.

Vinyl Esters:

Vinyl butyrate, vinyl isobutyrate, vinyltrimethyl acetate, vinyldiethyl acetate, vinyl varate, vinyl caproate, vinyl chloroacetate, vinyl dichloroacetate, vinyl methoxyacetate, vinyl butoxyacetate, vinyl acetoacetate, vinyl lactate, vinyl-β-phenylbutyrate, vinyl cyclohexylcarboxylate, etc.

Dialkyl Itaconates:

Dimethyl itaconate, diethyl itaconate, dibutyl itaconate, etc.

Other examples are dialkyl esters or monoalkyl esters of fumaric acid; such as dibutyl fumarate, etc.

Still other examples are crotonic acid, itaconic acid, maleic anhydride, maleimide, acrylonitrile, methacrylonitrile, maleilonitrile, etc.

Moreover, if there are addition polymerizing unsaturated compounds copolymerizable with the monomers corresponding to the above-described various repeating structure units, they may be copolymerized.

In the acid-decomposing resin in the invention, the mol ratio of the content of each repeating structure unit is properly established for controlling the dry etching resistance, the standard developer aptitude, the adhesion to substrate and the resist profile of the resist, and also the resolution, the heat resistance, the sensitivity, etc., which are general necessary performances of the resist.

As the preferred embodiments of the acid-decomposing resin in the invention, there are following ones.

(1) The resin containing the repeating unit having the partial structure containing the alicyclic hydrocarbon, shown by above-described formulae (pI) to (pVI) (side chain type).

(2) The resin containing the repeating unit shown by the formula (II) (main chain type).

However, in the embodiment (2), for example, there is further the following embodiment.

(3) The resin having the repeating unit shown by the formula (II), a maleic anhydride derivative, and a (meth)acrylate structure (hybrid type).

In the acid-decomposing resin, the content of the repeating unit having the partial structure containing the alicyclic hydrocarbon shown by the formula (pI) to (PVI) is preferably from 30 to 70%, more preferably from 35 to 65 mol %, and far more preferably from 40 to 60% in the whole repeating structure units.

In the acid-decomposing resin, the content of the repeating unit shown by the formula (II) is preferably from 10 to 60 mol %, more preferably from 15 to 55 mol %, and far more preferably from 20 to 50 mol % in the whole repeating structure units.

In the acid-decomposing resin, the content of the repeating unit shown by the formula (IV) is preferably from 1 to 60 mol %, more preferably from 5 to 50 mol %, and far more preferably from 10 to 40 mol % in the whole repeating structure units.

In the acid-decomposing resin, the content of the repeating unit having a group shown by one of the formulae (V-1) to (V-4) is preferably from 1 to 60 mol %, more preferably from 5 to 50 mol %, and far more preferably from 10 to 40 mol % in the whole repeating structure units.

In the acid-decomposing resin, the content of the repeating unit shown by the formula (VI) is preferably from 1 to 60 mol %, more preferably from 5 to 50 mol %, and far more preferably from 10 to 40 mol % in the whole repeating structure units.

In the acid-decomposing resin, the content of the repeating unit having a group shown by the formula (VII) is preferably from 5 to 40 mol %, more preferably from 10 to 35 mol % in the whole repeating structure units.

In the acid-decomposing resin, the content of the repeating unit shown by the formula (VIII) is preferably from 15 to 55 mol %, more preferably from 19 to 51 mol % in the whole repeating structure units.

Also, the content of the repeating structure unit based on the monomer of the above-described copolymer components, which may further be used in the invention, in the acid-decomposing resin can be properly established according to the desired performance of the resist, but in general, is preferably not more than 99 mol %, more preferably not more than 90 mol %, and far more preferably not more than 80 mol % to the total mol number of the sum total of the repeating structure unit having the partial structure containing the alicyclic hydrocarbon shown by the above-described formula (pI) to (pVI) and the repeating unit shown by the above-described formula (II).

The acid-decomposing resin used in the invention can be synthesized according to an ordinary method (for example, a radical polymerization). For example, in a general synthetic method, monomers are charged in a lump or during the reaction in a reaction vessel, after, if necessary, uniformly dissolving the reaction mixture in a reaction solvent, for example, an ether such as tetrahydrofuran, 1,4-dioxane, di-isopropyl ether, etc.; a ketone such as methyl ethyl ketone, methyl isobutyl ketone, etc.; an ester solvent such as ethyl acetate, etc.; or a solvent of dissolving the composition of the invention, such as propylene glycol monomethyl ether acetate described below, the solution is, if necessary, heated under an inert gas atmosphere such as nitrogen or argon, and the polymerization is initiated using a commercially available radical initiator (such as, azo-base initiator, a peroxide, etc.). If desired, the initiator is additionally added or separately added, after the reaction is over, the reaction product is added to a solvent and the desired polymer is recovered as the manner of the recover of the powder or the solids. The concentration of the reaction liquid is at least 20% by weight, preferably at least 30% by weight, and more preferably at least 40% by weight. The reaction temperature is from 10° C. to 150° C., preferably from 30° C. to 120° C., and more preferably from 50° C. to 100° C.

The weight average molecular weight of the resin (A) in the invention is preferably from 1,000 to 200,000 as the polystyrene converted value by a GPC method. When the weight average molecular weight is less than 1,000, the heat resistance and the dry etching resistance are undesirably deteriorated and when the weight average molecular weight exceeds 200,000, undesirable results such as the deterioration of the developing property, and also the deterioration of the film-forming property owing to the very increase of the viscosity occur.

In the positive photoresist composition of the invention, the compounding amounts of all the resins (A) in the invention in the whole composition are preferably from 40 to 99.99% by weight, and more preferably from 50 to 99.97% by weight in the total resist solid components.

[2] (B) Compound generating an acid upon irradiation with one of an actinic ray and radiation (photoacid generator).

The photoacid generator used in the invention is a compound generating an acid upon irradiation with an actinic ray or radiation.

As the photoacid generator used in the invention, a photoinitiator of a photocationic polymerization, a photoinitiator of a photo-radical polymerization, a photobleaching agent of coloring matters, a photo-discoloring agent, or a compound generating an acid by a known light used for microresist, etc., (for example, ultraviolet rays of from 400 to 200 nm, far-ultraviolet rays, and particularly preferably, a g-line, an h line, an i line, and a KrF excimer laser light), an ArF excimer laser light, electron rays, X-rays, or an ion beam, and a mixture of these compounds can be properly used.

Also, other photoacid generator, which can be used in the invention, includes, for example, onium salts such as a diazonium salt, an ammonium salt, a phosphonium salt, an iodonium salt, a sulfonium salt, a selenonium salt, an alsonium salt, etc.; organic halogen compounds, organic metal/organic halogen compound, a photoacid generator having an o-nitrobenzyl type protective group, a compound generating a sulfonic acid by being photodecomposed, such as imino sulfonate, etc., disulfone compounds, diazoketosulfone compounds, and diazodisulfone compounds.

Also, a polymer having introduced the group or compound generating an acid by the action of light into the main chain or the side chain of the polymer can be used.

Furthermore, the compounds each generating an acid by the action of light described in V. N. R. Pillai, "Synthesis". (1), 1(1980), A. Abad et al., "Tetrahedron Lett.", (47), 4555(1971). D. H. R. Barton et al., "J. Chem. Soc.", (C), 329(1970), U.S. Pat. No. 3,779,778, European Patent 126, 712, etc., can be used in the invention.

Then, in the above-described compounds each generating an acid by being decomposed upon irradiation with an actinic ray or radiation, the particularly effectively used compounds are explained below.

(1) The oxazole derivatives represented by following formula (PAG1) substituted with a trihalomethyl group and the S-triazine derivatives represented by following formula (PAG2).

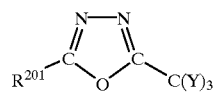

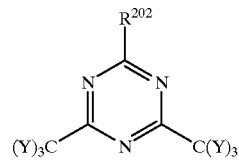

In the formulae, $R^{201}$ represents a substituted or unsubstituted aryl group or alkenyl group, $R^{202}$ represents a substituted or unsubstituted aryl group, alkenyl group, alkyl group, or $-C(Y)_3$. Y represents a chlorine atom or a bromine atom.

Practical examples of the above-described derivatives are illustrated below, but they are not limited to these compounds.

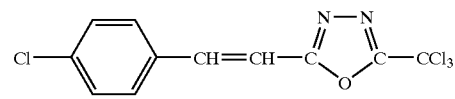

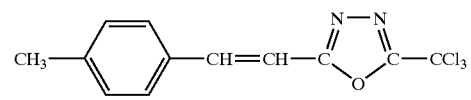

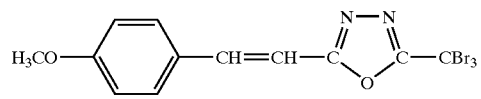

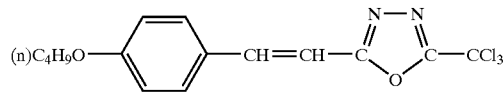

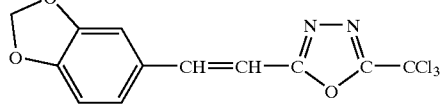

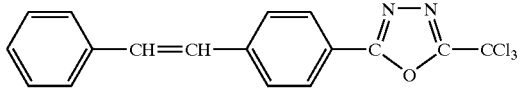

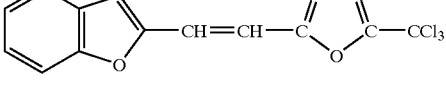

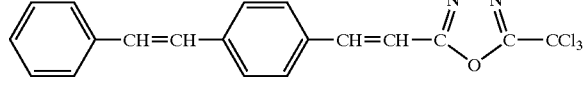

(PAG2-1) 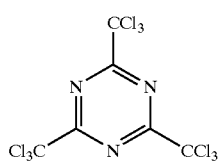
(PAG2-2) 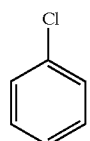
(PAG2-3) 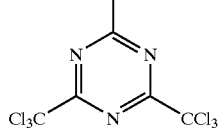
(PAG2-4) 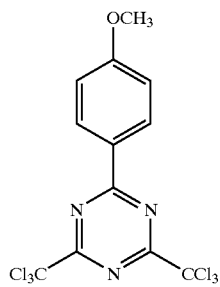
(PAG2-5) 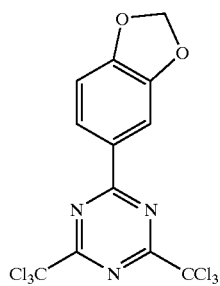
(PAG2-6) 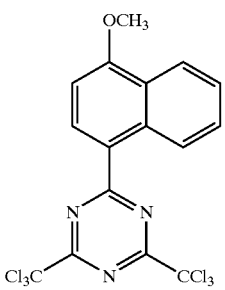
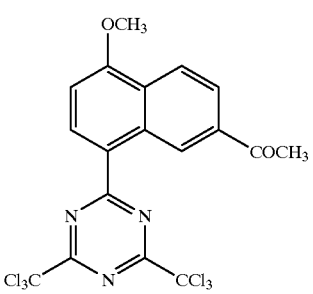
(PAG2-7) 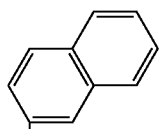
(PAG2-8) 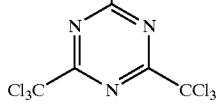
(PAG2-9) 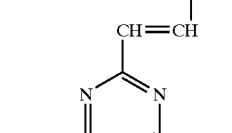
(PAG2-10) 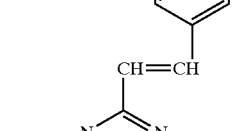
(2) The iodonium salts represented by following formula (PAG3) or the sulfonium salts represented by following formula (PAG4).
(PAG3) 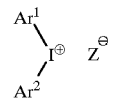

-continued (PAG4)

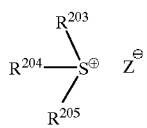

In the formula (PAG3), $Ar^1$ and $Ar^2$ each independently represents a substituted or unsubstituted aryl group.

In the formula (PAG4), $R^{203}$, $R^{204}$, and each independently represents a substituted or unsubstituted alkyl or aryl group.

In the above-described formulae, Z represents a counter anion and there are, for example, $BF_4^-$, $AsF_6^-$, $PF_6^-$, $SbF_6^-$, $SiF_6^-$, $ClO_4^-$, perfluoroalkanesulfonic acid anions such as $CF_3SO_3-$, etc.; condensed polynuclear aromatic sulfonic acid anions such as a pentafluorobenzenesulfonic acid anion, a naphthalene-1-sulfonic acid anion, etc.; an anthraquinonesulfonic acid anion, sulfonic acid group-containing dyes, etc., but the invention is not limited to them.

Also, at least two of $R^{203}$, $R^{204}$, and $R^{205}$ and $Ar^1$ and $Ar^2$ may be bonded to each other via a single bond or a substituent.

As practical examples, there are compounds shown below but the invention is not limited to them.

(PAG3-1)

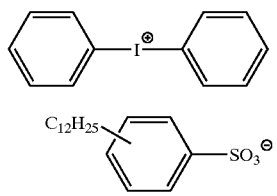

(PAG3-2)

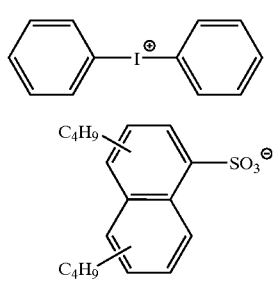

(PAG3-3)

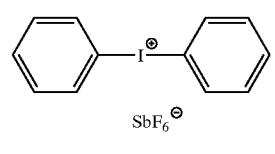

(PAG3-4)

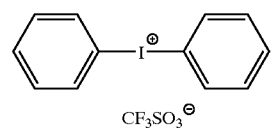

(PAG3-5)

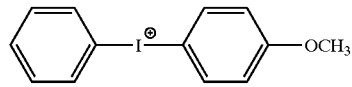

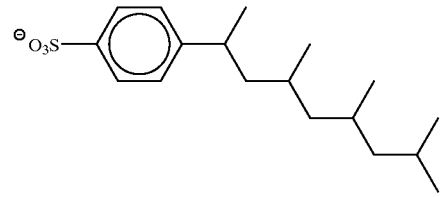

(PAG3-6)

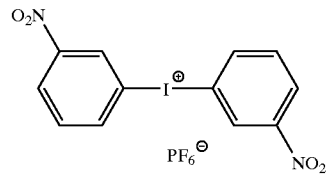

(PAG3-7)

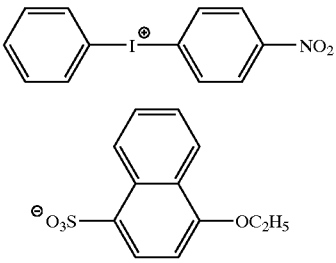

(PAG3-8)

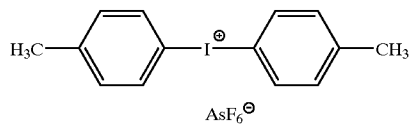

(PAG3-9)

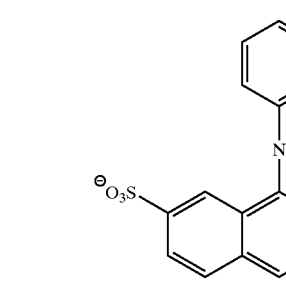

-continued (PAG3-10) ... (PAG3-22)

-continued
(PAG3-23)
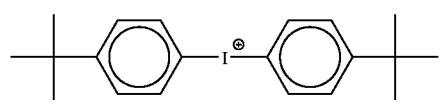
(PAG3-24)
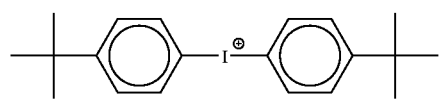
(PAG3-25)
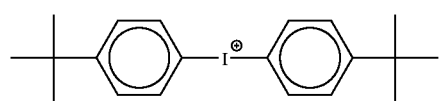
(PAG4-1)
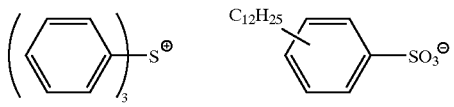
(PAG4-2)
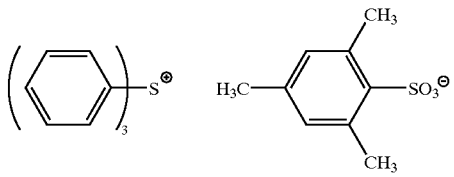
(PAG4-3)
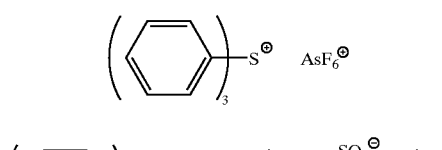
(PAG4-4)
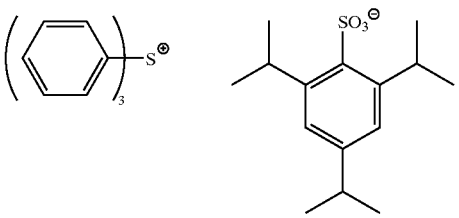
(PAG4-5)
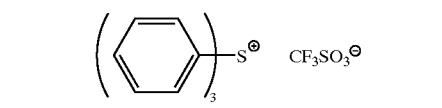
(PAG4-6)
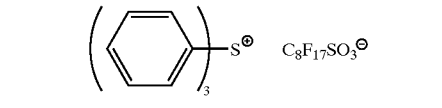
(PAG4-7)
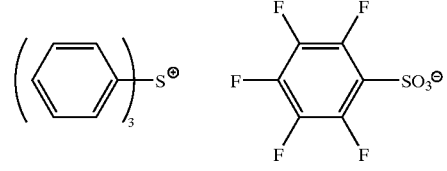
-continued
(PAG4-8)
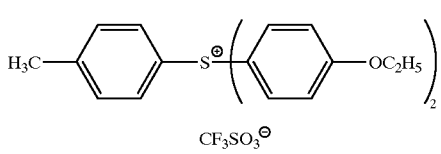
(PAG4-9)
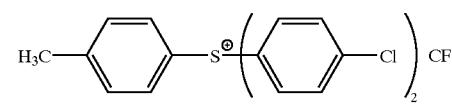
(PAG4-10)
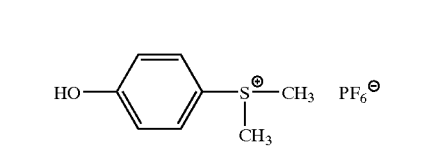
(PAG4-11)
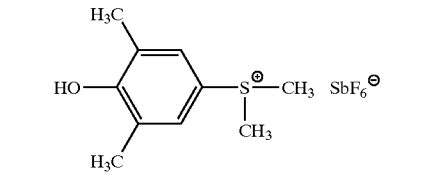
(PAG4-12)
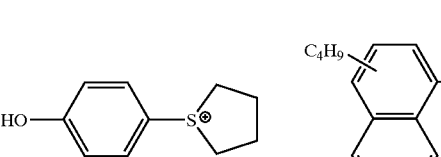
(PAG4-13)
(PAG4-14)
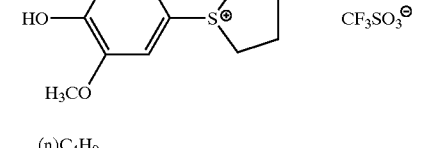
(PAG4-15)
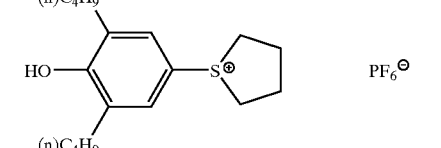
(PAG4-16)
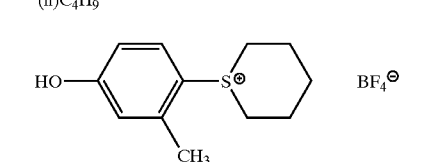

-continued
(PAG4-17)
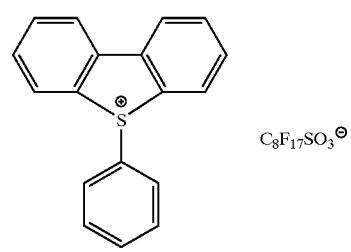
(PAG4-18)
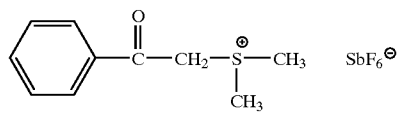
(PAG4-19)
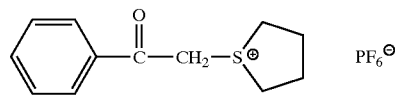
(PAG4-20)
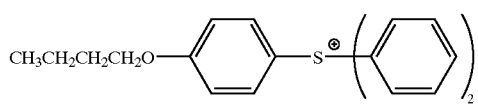
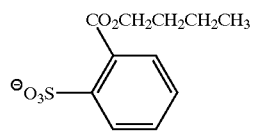
(PAG4-21)
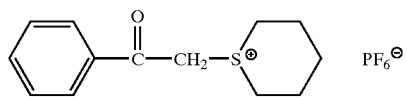
(PAG4-22)
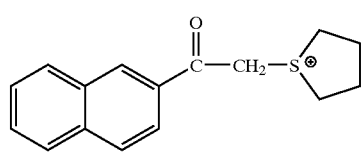
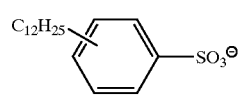
(PAG4-23)
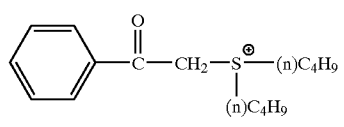
(PAG4-24)
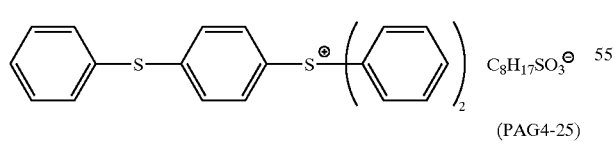
(PAG4-25)
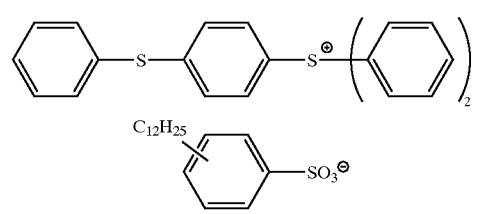
-continued
(PAG4-26)
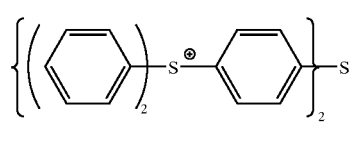
(PAG4-27)
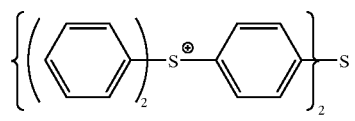
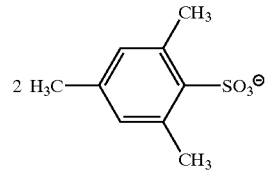
(PAG4-28)
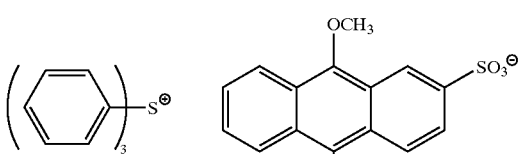
(PAG4-29)
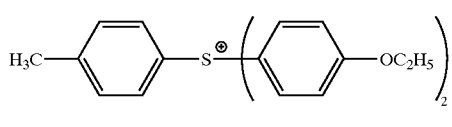
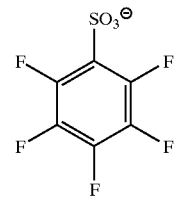
(PAG4-30)
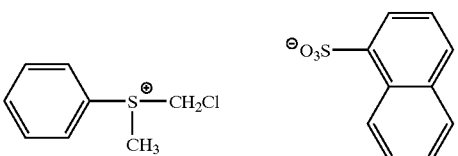
(PAG4-31)
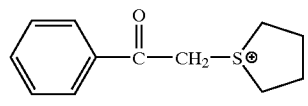 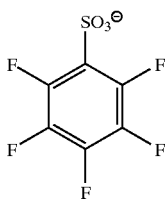

(PAG4-32)
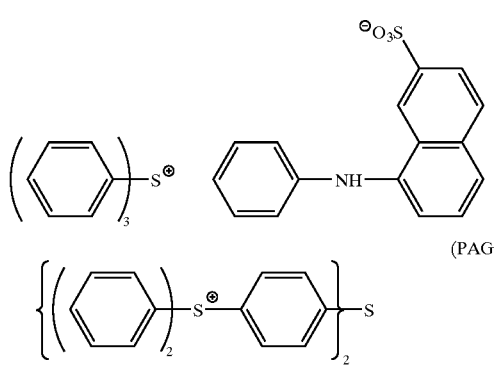
(PAG4-33)
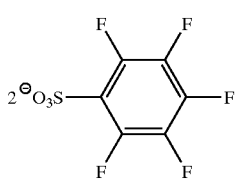
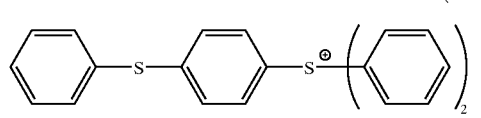
(PAG4-34)
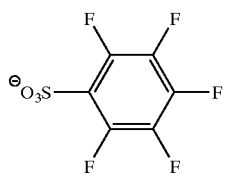
(PAG4-35)
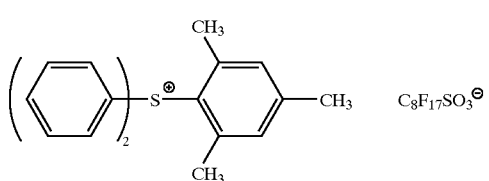
(PAG4-36)
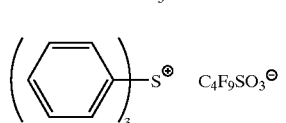
(PAG4-37)
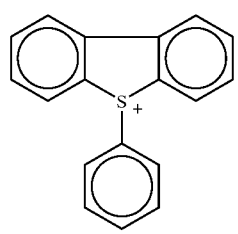
(PAG4-38)
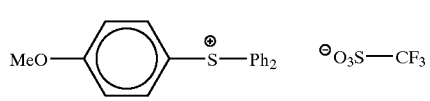
(PAG4-39)
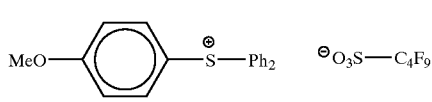
(PAG4-40)
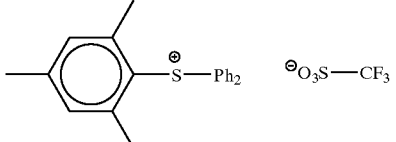
(PAG4-41)
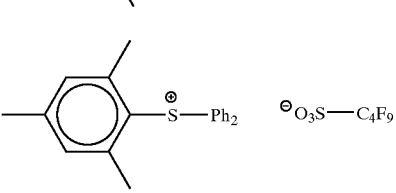
(PAG4-42)
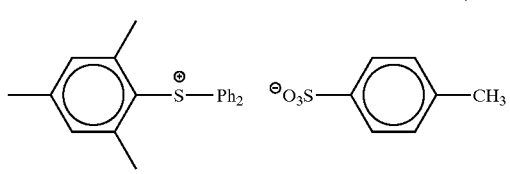
(PAG4-43)
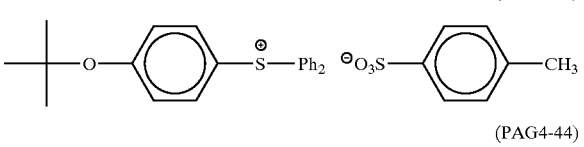
(PAG4-44)
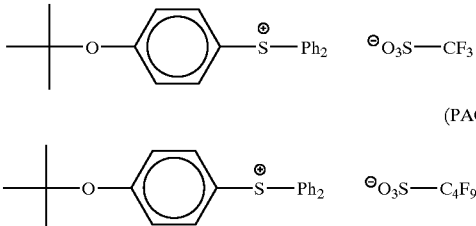
(PAG4-45)
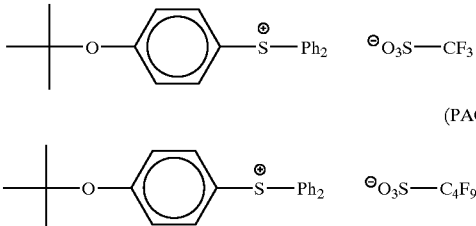
(PAG4-46)
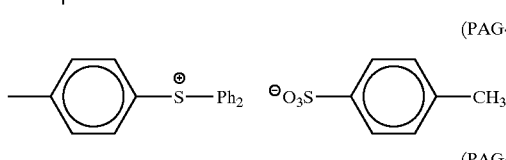
(PAG4-47)
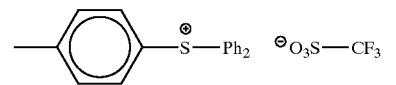
(PAG4-48)
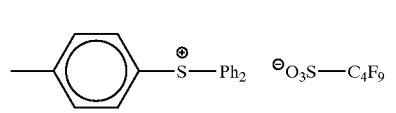
(PAG4-49)
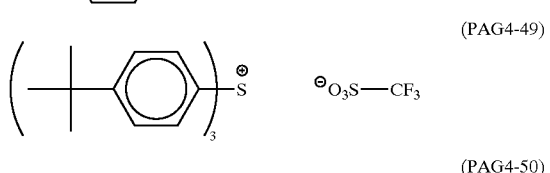
(PAG4-50)
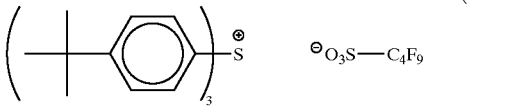
(PAG4-51)
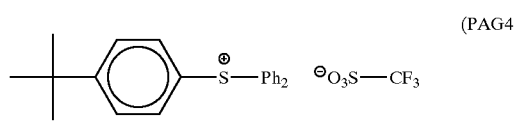

-continued

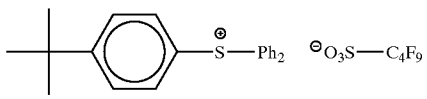
(PAG4-52)

In the above formulae, Ph represents a phenyl group.

The above-described onium salts shown by the formulae (PAG3) and (PAG4) are known and can be synthesized, for example, by the methods described in U.S. Pat. Nos. 2,807,648 and 4,247,473, Japanese Patent Laid-open No. 101331/1978.

(3) The disulfone derivatives represented by following formula (PAG5) or the iminosulfonate derivatives represented by following formula (PAG6).

$$Ar^3-SO_2-SO_2-Ar^4 \quad \text{(PAG5)}$$

(PAG6)

R$^{206}$—SO$_2$—O—N⟨A⟩ (with two C=O)

In the formula (PAG5), $Ar^3$ and $Ar^4$ each independently represents a substituted or unsubstituted aryl group. In the formula (PAG6), $R^{206}$ represents a substituted or unsubstituted alkyl or aryl group, and A represents a substituted or unsubstituted alkylene, alkenylene, or arylene group.

As the practical examples of the above-described derivatives, there are illustrated the following compounds but they are not limited to these compounds.

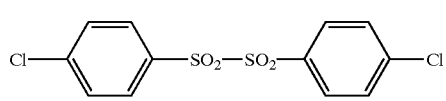
(PAG5-1)

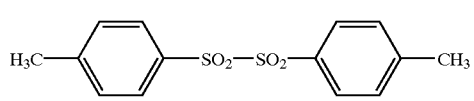
(PAG5-2)

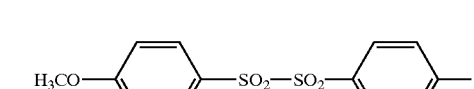
(PAG5-3)

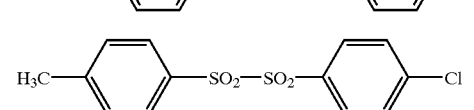
(PAG5-4)

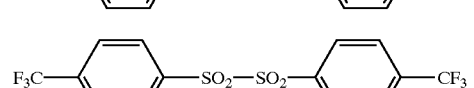
(PAG5-5)

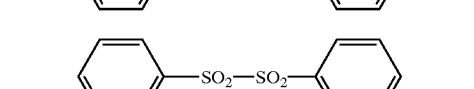
(PAG5-6)

-continued

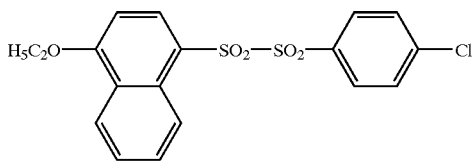
(PAG5-7)

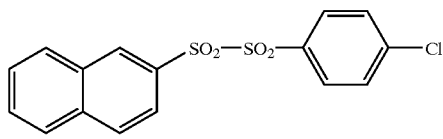
(PAG5-8)

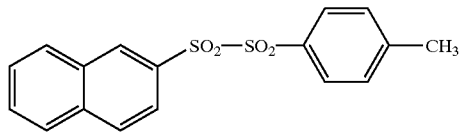
(PAG5-9)

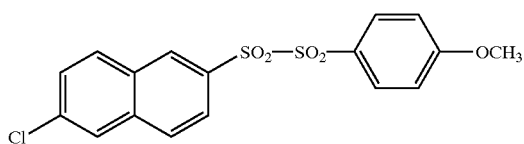
(PAG5-10)

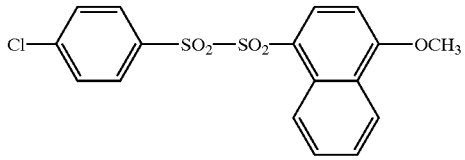
(PAG5-11)

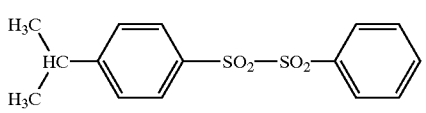
(PAG5-12)

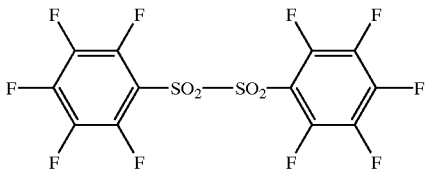
(PAG5-13)

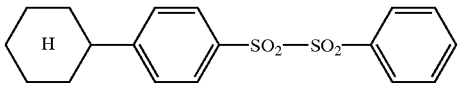
(PAG5-14)

(PAG5-15)

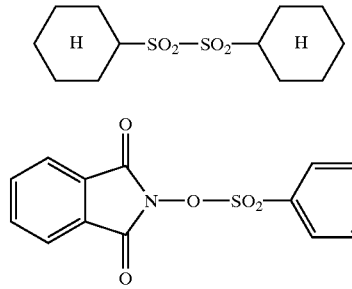
(PAG6-1)

-continued (PAG6-2) (PAG6-10) (PAG6-3) (PAG6-11) (PAG6-4) (PAG6-12) (PAG6-5) (PAG6-13) (PAG6-6) (PAG6-14) (PAG6-7) (PAG6-15) (PAG6-8) (PAG6-16) (PAG6-9) (PAG6-17)

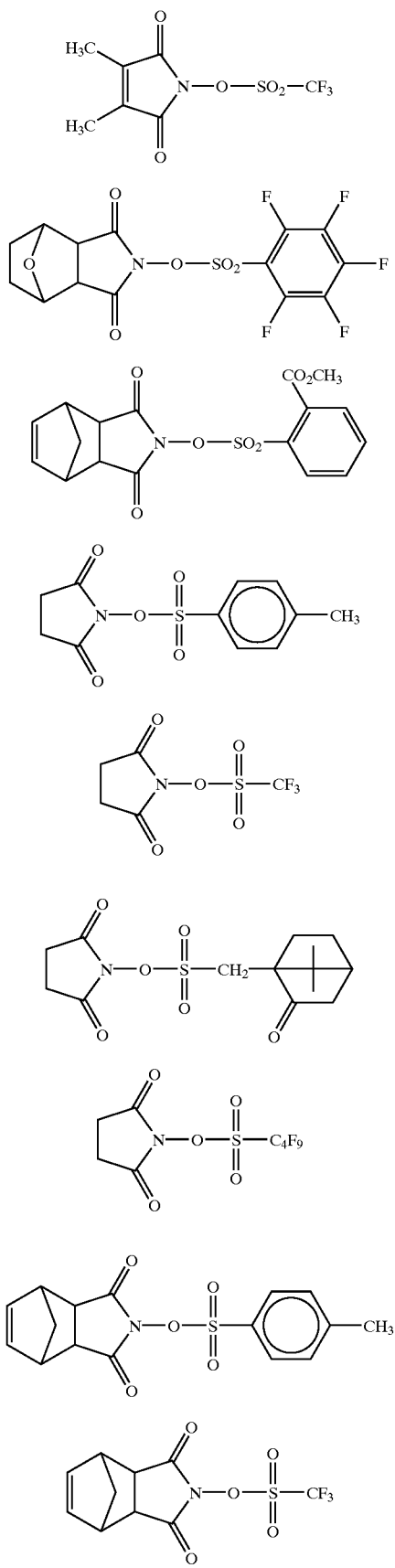
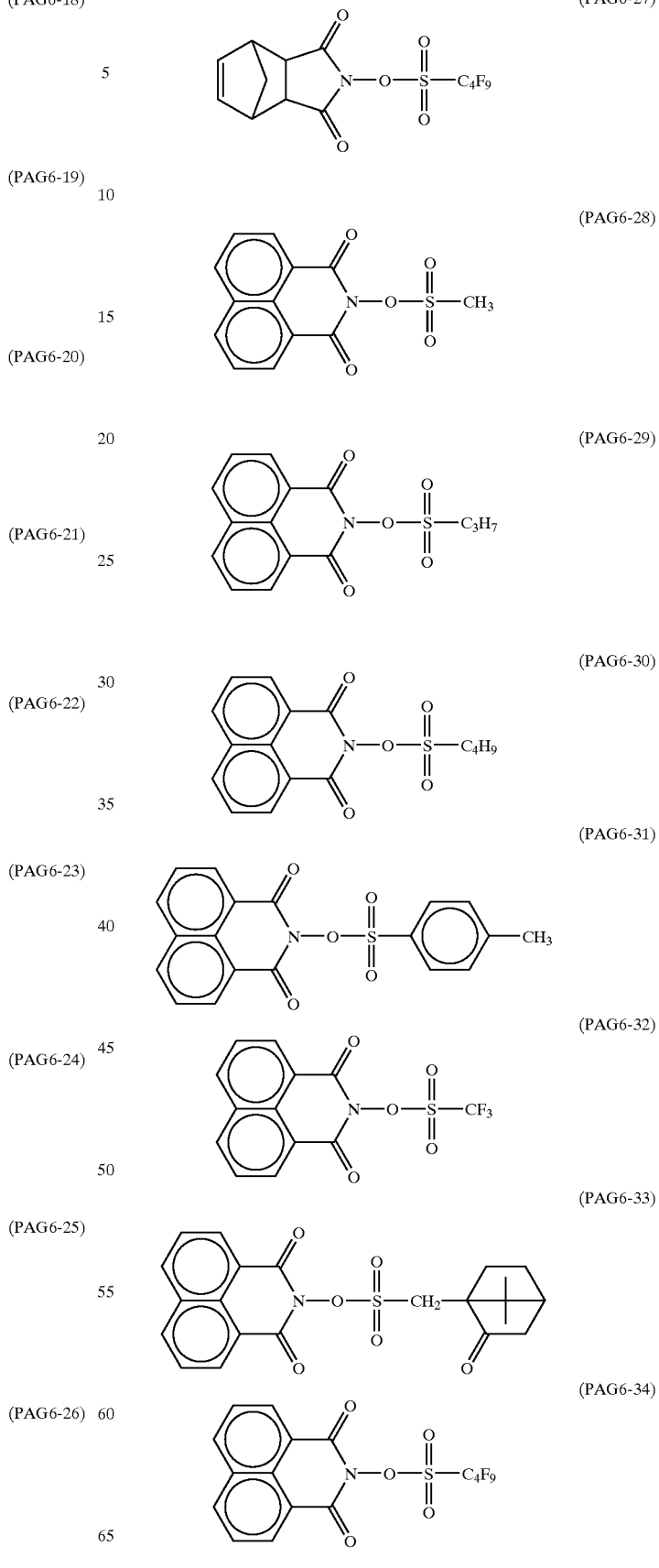

(4) The diazodisulfone derivatives represented by following formula (PAG7).

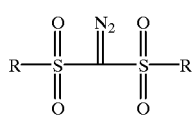
(PAG7)

In the above formula, R represents a straight chain, branched, or cyclic alkyl group, or an aryl group which may be substituted.

As the practical examples of the derivatives, there are compounds shown below but they are not limited to these compounds.

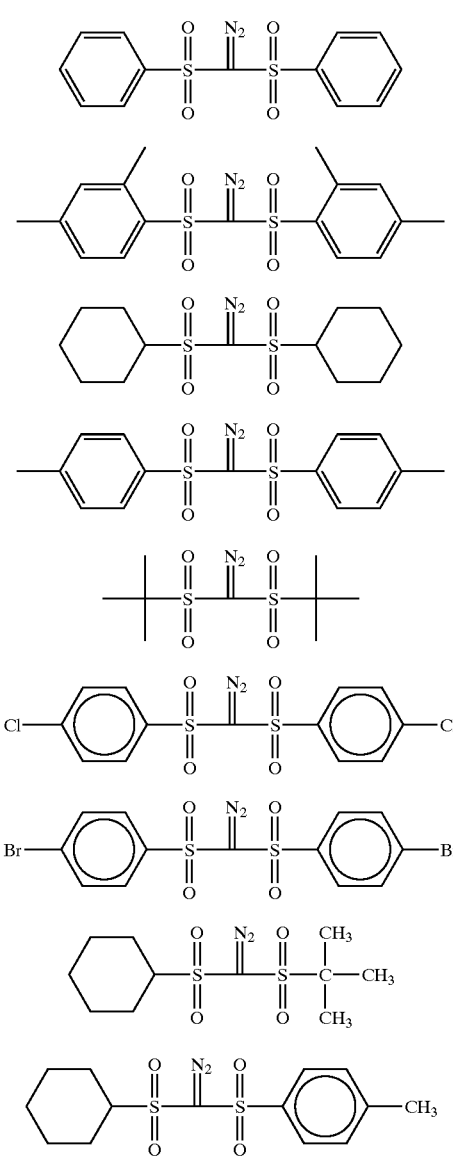

(PAG7-1)
(PAG7-2)
(PAG7-3)
(PAG7-4)
(PAG7-5)
(PAG7-6)
(PAG7-7)
(PAG7-8)
(PAG7-9)

The addition amount of the photoacid generator used is in the range of usually from 0.001 to 30% by weight, preferably from 0.3 to 20% by weight, and more preferably from 0.5 to 10% by weight based on the solid components in the composition of the invention.

When the addition amount of the photoacid generator is less than 0.001% by weight, there is a tendency of lowering the sensitivity, while the addition amount exceeds 30% by weight, there are tendencies that the light absorption of the resist becomes too high, the resist profile is deteriorated, and the process (particularly bake) margin is narrowed.

[3] (C) Nitrogen-Containing Compound

The nitrogen-containing compound (C) used in the invention is a nitrogen-containing compound having at least on partial structure represented by following formula (I) in the molecule.

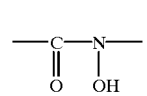
(I)

As the compound containing the partial structure of the formula (I), the compounds represented by following formula (Ia) are preferred.

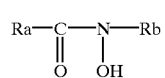
(Ia)

In formula (Ia), Ra represents a hydrogen atom, an alkyl group, an alkenyl group, or an aryl group, each group may have a substituent.

Rb represents a hydrogen atom, an aryl group which may have a substituent, —C(=O)—Ra, or —N=N—Ra. Ra and Rb may be bonded to each other to form a ring.

As the alkyl group, there are alkyl groups having from 1 to 10 carbon atoms, and the alkyl groups having from 1 to 4 carbon atoms, such as methyl, ethyl, propyl, n-butyl, sec-butyl, t-butyl, etc., are preferred.

As the aryl group, there are the aryl groups having from 6 to 20 carbon atoms, and the aryl groups having from 6 to 14 carbon atoms, such as phenyl, xylyl, toluyl, cumenyl, naphthyl, anthracenyl, etc., are preferred.

As the alkenyl group, there are the alkenyl groups having from 1 to 4 carbon atoms, such as vinyl, propenyl, allyl, butenyl, etc.

As the substituent of the alkyl group, the alkenyl group, or the aryl group of Ra, there are a halogen atom, a nitro group, a cyano group, a hydroxy group, etc.

As the ring formed by bonding Ra and Rb each other, there are the rings having the structures shown by (C-4) to (C-7) described hereinbelow.

As the above-described nitrogen-containing compound (C), the compounds represented by following formula (II-1) are preferred.

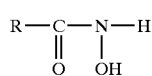
(II-1)

In the formula (II-1), R represents a monovalent organic residue having from 1 to 20 carbon atoms. As the monovalent organic residue having from 1 to 20 carbon atoms, there are, for example, an alkyl group which may have a substituent, a cycloalkyl group which may have a substituent, an aryl group which may have a substituent, and an aralkyl group which may have a substituent.

As the alkyl group, there are alkyl groups having from 1 to 10 carbon atoms, but the alkyl groups having from 1 to 4 carbon atoms, such as methyl, ethyl, propyl, n-butyl, sec-butyl, t-butyl, etc., are preferred.

As the cycloalkyl group, there are the cycloalkyl groups having from 3 to 15 carbon atoms, but the cycloalkyl group having from 3 to 10 carbon atoms, such as cyclopropyl, cyclobutyl, cyclohexyl, adamantyl, etc., are preferred.

As the aryl group, there are the aryl groups having from 6 to 20 carbon atoms, but the aryl groups having from 6 to 14 carbon atoms, such as phenyl, xylyl, toluyl, cumenyl, naphthyl, anthracenyl, etc., are preferred.

As the aralkyl group, there are the aralkyl groups having from 7 to 20 carbon atoms and practically there are the aralkyl groups having from 7 to 15 carbon atoms, such as a substituted or unsubstituted benzyl group, a substituted or unsubstituted phenetyl group, etc.

As the substituents of these alkyl groups, cycloalkyl groups, aryl groups, and aralkyl group, there are an alkyl group, an alkoxy group, a hydroxy group, a halogen atom, a nitro group, an acyl group, etc.

Also, as the nitrogen-containing compound (C), the compounds represented by following formula (II-2) are preferred.

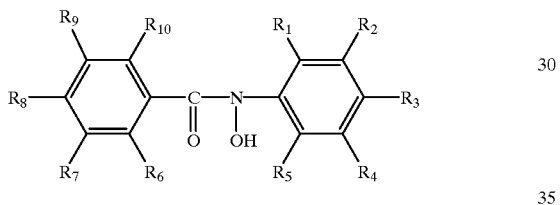

(II-2)

In the formula (II-2), $R_1$ to $R_{10}$, which are the same or different, each represents a hydrogen atom, a hydroxyl group, a halogen atom, a nitro group, a cyano group, an alkyl group, an alkoxy group, a hydroxyalkyl group, a cycloalkyl group, or an aryl group.

In the formula (II-2), as the alkyl group, the alkyl groups having from 1 to 4 carbon atoms, such as methyl, ethyl, propyl, n-butyl, sec-butyl, t-butyl, etc., are preferred; as the cycloalkyl group, the cycloalkyl group having from 3 to 10 carbon atoms, such as cyclopropyl, cyclobutyl, cyclohexyl, adamantyl, etc., are preferred; and as the aryl group, but the aryl groups having from 6 to 14 carbon atoms, such as phenyl, xylyl, toluyl, cumenyl, naphthyl, anthracenyl, etc., are preferred.

As the alkoxy group, the alkoxy groups having from 1 to 4 carbon atoms, such as methoxy, ethoxy, hydroxyethoxy, propoxy, hydroxypropoxy, n-butoxy, isobutoxy, sec-butoxy, and t-butoxy are preferred.

As the halogen atom, there are fluorine, chlorine, bromine, and iodine.

As the hydroxyalkyl group, the hydroxyalkyl groups having from 1 to 4 carbon atoms, such as hydroxymethyl, hydroxyethyl, hydroxypropyl, and hydroxybutyl are preferred.

As the practical examples of the above-described nitrogen-containing compound used in the invention, there are following compounds (I-1) to (I-11) and (C-1) to (C-12) shown below but they are not limited to these compounds.

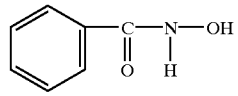
(I-1)

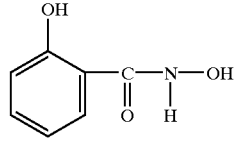
(I-2)

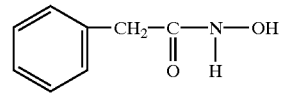
(I-3)

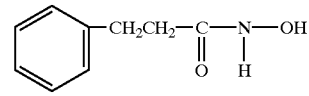
(I-4)

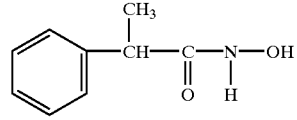
(I-5)

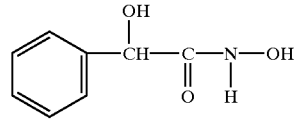
(I-6)

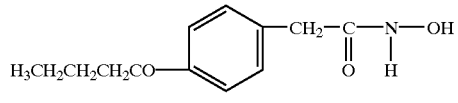
(I-7)

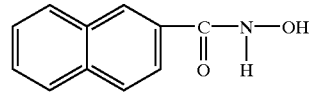
(I-8)

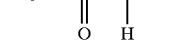
(I-9)

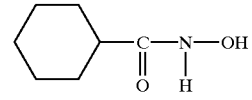
(I-10)

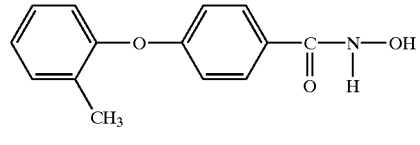
(I-11)

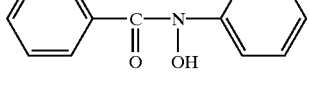
(C-1)

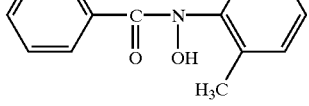
(C-2)

-continued (C-3) 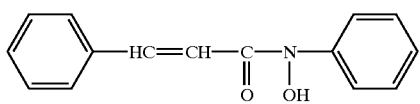

(C-4) 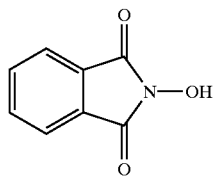

(C-5) 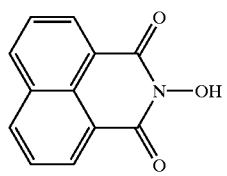

(C-6) 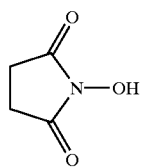

(C-7) 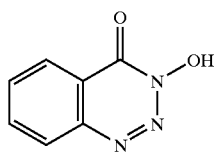

(C-8) 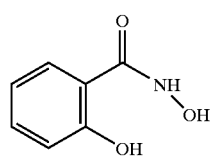

(C-9) 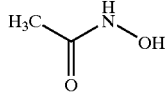

(C-10) 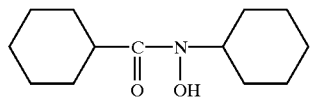

(C-11) 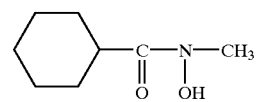

(C-12) 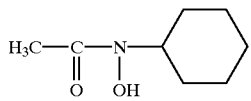

In the invention, the addition amount of the above-described nitrogen-containing compound (C) used is in the range of from 0.001 to 40% by weight, preferably from 0.01 to 20% by weight, and more preferably from 0.05 to 15% by weight based on the solid components in the composition of the invention.

When the addition amount of the nitrogen-containing compound (C) is less than 0.001% by weight, the sufficient effect of improving the line edge roughness is not obtained. Also, when the addition amount exceeds 40% by weight, the profile of the resist is deteriorated and the process margin is narrowed, which are undesirable.

[4] (D) Nitrogen-Containing Basic Compound

Then, the nitrogen-containing basic compound (D), which can be preferably used for the positive resist composition of the invention, is explained. As the nitrogen-containing basic compound (D), organic amines, basic ammonium salts, basic sulfonium salts, etc., are used if they do not deteriorate the sublimation and the performance of the resist.

In these nitrogen-containing basic compounds, the organic amines are preferred in the point of excellent in the image performance.

For example, the basic compounds described in c149640/1988, 24966/1993, 127369/1993, 289322/1993, 149683/1993, 289340/1993, 232706/1993, 257282/1993, 142605/1994, 242606/1994, 266100/1994, 266110/1994, 317902/1994, 120929/1995, 146558/1995, 319163/1995, 508840/1995, 333844/1995, 21921/1995, 219217/1995, 92678/1995, 28247/1995, 22120/1996, 110638/1996, 123030/1996, 274312/1997, 166871/1007, 292708/1997, and 325496/1997, International Patent Publication No. 508840/1995, U.S. Pat. Nos. 5,629,134, 5,667,938, etc., can be used.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]-octane, 4-dimethylaminopyridine, 1-naphthylamine, piperidine, hexamethylenetetramine, imidazoles, hydroxypyridines, pyridines, 4,4'-diaminodiphenyl ether, pyridinium p-toluenesulfonate, 2,4,6-trimethylpyridinium p-toluenesulfonate, tetramethyl-ammonium p-toluenesulfonate, tetrabutylammonium lactate, triethylamine, and tributylamine.

In these compounds, the organic amines such as 1,5-diaza-bicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, triethylamine, tributylamine, etc., are preferred.

The content of the nitrogen-containing basic compound (D) is usually from 0.001 to 10 parts by weight, preferably 0.001 to 5 parts by weight, and more preferably from 0.001 to 0.5 part by weight to 100 parts by weight of the positive resist composition (solid components) of the invention.

When the content is less than 0.001 part by weight, the addition effect of the component (D) is not sufficiently obtained. On the other, hand, when the content exceeds 10 parts by weight, there are tendencies of lowering the sensitivity and greatly deteriorating the developing property of the unexposed portions. The nitrogen-containing basic compounds (D) can be used singly or as a combination of two or more kinds of them.

[5] (E) Fluorine- and/or Silicon-Containing Surfactant

Then, the surfactant (E) containing at least one of a fluorine atom and silicon atom, which can be preferably used for the positive resist composition of the invention is explained.

The resist composition of the invention can contain one or two or more kinds of a fluorine-containing surfactant, a silicon-containing surfactant, and a surfactant containing a fluorine atom and a silicon atom.

As these surfactants, there are the surfactants described, for example, Japanese Patent Laid-Open Nos. 36663/1987, 226746/1986, 226745/1986, 170950/1987, 34540/1088, 230165/1995, 62834/1996, and 54432/1997, U.S. Pat. Nos. 5,405,720, 5,360,692, 5,529,881, 5,296,330, 5,436,098, 5,576,143, 5,294,511, 5.824,451, etc., and also the following commercially available surfactants can be used as they are.

As the commercially available surfactants, which can be used in the invention, there are, for example, the fluorine-containing and/or silicon-containing surfactants, such as Eftop EF301 and EF303 (manufactured by Shin-Akita Kasei K.K.), Florad FC430 and 431 (manufactured by SUMITOMO 3M INC.), Megafac F171, F173, F176, F189, R08 (manufactured by DAINIPPON INK & CHEMICALS, INC.), Surflon S-382, SC 101, 102, 103, 104, 105, and 106 (manufactured by Asahi Glass Co. Ltd.), Troysol S-366 (manufactured by Troy Chemical Industries, Inc.), etc. Also, a polysiloxane polymer, KP-341 (manufactured by Shin-Etsu Chemical Industry Co., Ltd.) can be used as the silicon-containing surfactant.

The compounding amount of the surfactant (E) is usually from 0.001 part by weight to 2 parts by weight, and preferably from 0.003 part by weight to 0.10 part by weight per 100 parts by weight of the solid components in the composition of the invention.

These surfactants (E) can be used singly or as a combination of two or more kinds of them.

The positive resist composition of the invention can, if necessary, contain a low-molecular acid-decomposing compound having a molecular weight of not higher than 2,000, which has a group capable of decomposing by the action of an acid and increases the alkali solubility by the action of an acid.

For example, the aliphatic compounds such as the cholic acid derivatives, the dehydrocholic acid derivatives, the deoxycholic acid derivatives, the lithocholic acid derivatives, the ursocholic acid derivatives, the abietic acid derivatives, etc., in which each contains an acid-decomposing group; and the aromatic compounds such as the naphthalene derivatives each containing an acid-decomposing group described, for example, in "Proc. SPIE", 2724, 355(1996), Japanese Patent Laid-Open no. 15965/1996, U.S. Pat. Nos. 5,310,619 and 5,372,912, and "J. Photopolym. Sci. Tech.", Vol. 10, No. 3, 511(1997) can be used.

Furthermore, the low-molecular acid-decomposing dissolution inhibiting compound described in Japanese Patent Laid-Open no. 51519/1994 can be used in the addition range of a level of not reducing the permeability of 220 nm, and also, 1,2-naphthoquinonediazide compounds can be used.

In the case of using the above-described low-molecular acid-decomposing dissolution-inhibiting compound for the resist composition of the invention, the content thereof is in the range of usually from 0.5 to 50 parts by weight, preferably from 0.5 to 40 parts by weight, more preferably from 0.5 to 30 parts by weight, and particularly preferably from 0.5 to 20.0 parts by weight based on 100 parts by weight (solid components) of the resist composition.

When the low-molecular acid-decomposing dissolution-inhibiting compound is added, not only the above-described development defects are improved but also the dry etching resistance is improved.

The positive resist composition of the invention can, if necessary, contain a dissolution-accelerating compound for a developer, an antihalation agent, a plasticizer, a surfactant, a photo-sensitizer, an adhesion aid, a crosslinking agent, a photobase generator, etc.

Examples of the dissolution-accelerating compound for a developer, which can be used in the invention, include low molecular compounds having a molecular weight of not higher than 2,000 such as the compound having at least two phenolic hydroxy groups described in Japanese Patent Laid-Open no. 206458/1991, a compound having at least one of naphthols such as 1-naphthol, etc., or carboxyl groups, carboxylic acid anhydrides, sulfonamide compounds, sulfonylimide compounds, etc.

The compounding amount of the dissolution-accelerating compound is preferably not more than 30% by weight, and more preferably not more than 20% by weight to the total weight (solid components) of the resist composition of the invention.

As a suitable antihalation agent, a compound absorbing efficiently the irradiated radiation is preferred and there are substituted benzenes such as fluorene, 9-fluorenone, benzophenone, etc., and polycyclic aromatic compounds such as anthracene, anthracene-9-methanol, anthracene-9-carboxyethyl, phenanthrene, perylene, azirene, etc. In these compounds, the polycyclic aromatic compounds are particularly preferred. The antihalation agent gives the effect of improving the standing wave by reducing the reflected light from a substrate and reducing the influences of the multipath reflection in the resist film.

In the invention, a nonionic surfactant can be used together for the purposes of improving the coating property of the resist composition of the invention and improving the developing property.

The nonionic surfactant, which can be used together in the invention, includes polyoxyethylene lauryl ether, polyoxyethylene stearyl ether, polyoxyethylene octylphenyl ether, polyoxyethylene nonylphenyl ether, polyethylene glycol dilaurate, polyethylene glycol distearate, polyoxyethylene sorbitan monostearate, sorbitan monolaurate, etc.

Also, for improving the acid-generating ratio by a light exposure, a photo-sensitizer can be added in the invention. The suitable photo-sensitizer includes benzophenone, p.p'-tetramethyldiaminobenzophenone, 2-chlorothioxanthone, anthrone, 9-ethoxyanthrone, pyrene, phenothiazine, benzyl, benzoflavin, acetophenone, phenanthrene, benzoquinone, anthraquinone, 1,2-naphthoquinone, etc., but they are not limited to these compounds. These photosensitizers can be used as the above-described antihalation agents.

For preparing the resist composition of the invention, after dissolving the above-described components in a solvent, the solution is filtrated by a filter having pore sizes of from about 0.05 $\mu$m to 0.2 $\mu$m according to an ordinary manner to prepare the composition as the solution thereof.

Examples of the solvent used in the case include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, y-butyrolactone, N,N-dimethylamide, etc. These solvents are used singly or as a combination of two or more kinds of them.

In these solvents, from the view points of the solubility for the above-described composition of the invention, the coating property to a substrate, the storage stability, etc., it is particularly preferred to contain at least 70% by weight at least one kind of the solvent selected from ethyl lactate, propylene glycol monomethyl ether acetate, propylene glycol monomethyl ether, propylene glycol monomethyl ether propionate, methyl 3-methoxypropionate, ethyl 3-ethoxypropionate, and 2-heptanone.

Also, because water contained in the solvent gives influences on the resist performance, the content is as small as preferred.

Furthermore, it is preferable that in the resist composition of the invention, the contents of metal impurities such as metals, etc., impurity components such as chlorine ions, etc., are reduced to not more than 100 ppb. When these impurities large exist, in the case of producing semiconductor devices, inferior actions, defects, and yield lowering undesirably occur.

After coating the resist composition of the invention on a substrate by a proper coating method such as a spinner, a coater, etc., the coated resist is pre-baked (heating before exposure), the coated resist is light-exposed through a definite mask by an exposure light having a wavelength of not longer than 220 nm, PEB (Pose-exposure baking) is carried out, and the baked resist layer is developed, whereby a good resist pattern can be obtained.

As the substrate used in this case, a substrate usually used in the apparatus such as a semiconductor device, etc., and for example, there are s silicon substrate, a glass substrate, a non-magnetic ceramic substrate, etc.

Also, if necessary, an addition layer such as a silicon oxide layer, a metal layer for wiring, an interlaminar insulating film, a magnetic layer, a reflection inhibiting film layer, etc., may exist on the substrate, and also various kinds of wirings, circuits, etc., may be formed therein.

Still further, for increasing the adhesion of the resist film, the substrate may be subjected to a hydrophobic treatment by an ordinary manner. As a proper hydrophobic treating agent, there are, for example, 1,1,3,3,3-hexamethyldisilazane (HMSF), etc.

The thickness of the resist film coated on the substrate is preferably in the range of from about 0.1 to 10 $\mu$m and in the case of an ArF exposure, it is recommended that the thickness is from about 0.1 to 1.5 $\mu$m.

Also, it is preferable the resist film coated on the substrate is pre-baked at a temperature of from about 60 to 160° C. and for from about 30 to 300 seconds. When the temperature of pre-baking is too low and the time is too short, the amount of the residual solvent in the resist film becomes relatively large to cause the problem of deteriorating the adhesion, etc., which is undesirable. Also, on the other hand, when the baking temperature is too high and the time is too long, the problem that the constituting components of the resist composition, such as the binder, the photoacid generator, etc., are decomposed occurs, which is also undesirable.

As the apparatus of exposing the resist film after pre-baking, the commercially available ultraviolet exposure apparatus, X-ray exposure apparatus, electron beam exposure apparatus, KrF excimer exposure apparatus, ArF excimer exposure apparatus, $F_2$ excimer apparatus, etc., are used, and particularly, in the invention, the apparatus using an ArF excimer laser as the light source is preferred.

Baking after the light exposure is carried out for the purpose of causing the release of the protective group using an acid as the catalyst, the purpose of eliminating the standing waves, and the purpose of dispersing the photoacid generator in the film. Baking after the light exposure can be carried out by the same manner as pre-baking previously carried out. For example, the baking temperature is from about 60 to 160° C., and preferably from about 90 to 150° C.

As the developer of the resist composition of the invention, the alkali aqueous solution of inorganic alkalis such as sodium hydroxide, potassium hydroxide, sodium carbonate, sodium silicate, aqueous ammonium, etc.; primary amines such as ethylamine, n-propylamine, etc.; secondary amines such as diethylamine, di-n-butylamine, etc.; tertiary amines such as triethylamine, methyldiethylamine, etc.; alcoholamines such as dimethyl ethanolamine, triethanolamine, etc.; quaternary ammonium salts such as tetramethylammonium hydroxide (TMAH), tetraethylammonium hydroxide (TEAH), trimethylhydroxymethylammonium hydroxide, triethylhydroxy-methyl ammonium hydroxide, trimethylhydroxyethylammonium hydroxide, etc.; cyclic amines such as pyrrole, piperidine, 1,8-diazabicyclo-[5,4,0]-7-undecene, 1-5-diazabicyclo-[4.3.0]-5-nonane, etc., can be used.

Furthermore, proper amounts of a hydrophilic organic solvent such as alcohols, ketones, etc.; a nonionic or anionic surfactant, a cationic surfactant, a defoaming agent, etc., can be added to the above-described alkaline aqueous solution.

These additives are added to the alkaline aqueous solution for the purposes of increasing adhesion of the resist with the substrate, reducing the using amount of the developer, reducing the defect caused by bobbles at development, etc., in addition to improving the performance of the resist.

EXAMPLES

Then, the invention is more practically explained by the following examples but the invention is not limited to these examples. Synthetic Example (1): Synthesis of resin (1) (side chain type)

After charging 2-ethyl-2-adamantyl methacrylate and butyrolactone methacrylate at a ratio of 55/45, the mixture was dissolved in methyl ethyl ketone/tetrahydrofuran=5/5 to prepare 100 ml of a solution of solid component concentration of 20%. To the solution was added 2 mol % radical initiator V-65 manufactured by Wako Pure Chemical Industries, Ltd., and the mixture was added dropwise to 10 ml of methyl ethyl ketone heated to 60° C. over a period of 4 hours under a nitrogen stream. Thereafter, the reaction mixture was heated for 4 hours, and after adding again 1 mol % radical initiator V-65, the mixture was stirred for 4 hours. After the reaction was over, the reaction liquid was cooled to room temperature, added to 3 liters of the mixed solvent of distilled water/iso-propyl alcohol=1/1, and a white powder deposited was recovered as the resin (1).

The polymer composition ratio obtained by $C^{13}$ NMR was 46/54. Also, the weight average molecular weight of a standard polystyrene conversion obtained by the GPC measurement was 10700.

By the similar operations to Synthesis Example (1) described above, resins (2) to (18) were synthesized.

The composition ratios and the molecular weights of the resins (2) to (18) obtained are shown below. (The repeating units 1, 2, 3, and 4 are the order from the left side of each structural formula.

TABLE 1

| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 2 | 53 | 40 | 7 | | 13400 |
| 3 | 46 | 34 | 20 | | 9400 |
| 4 | 42 | 31 | 27 | | 8300 |
| 5 | 49 | 42 | 9 | | 9900 |
| 6 | 42 | 30 | 28 | | 10300 |
| 7 | 39 | 35 | 26 | | 8900 |
| 8 | 46 | 22 | 30 | 2 | 12900 |
| 9 | 42 | 20 | 32 | 6 | 11600 |
| 10 | 46 | 42 | 12 | | 9200 |
| 11 | 38 | 32 | 30 | | 11300 |
| 12 | 42 | 18 | 38 | 2 | 13800 |
| 13 | 38 | 31 | 29 | 2 | 11100 |

TABLE 1-continued
| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 14 | 50 | 31 | 19 |  | 11700 |
| 15 | 35 | 6 | 16 | 43 | 13200 |
| 16 | 50 | 20 | 20 | 10 | 11500 |
| 17 | 50 | 40 | 10 |  | 12300 |
| 18 | 40 | 10 | 40 | 10 | 11300 |
Also, the structures of the above-described resins (1) to (18) are shown below.
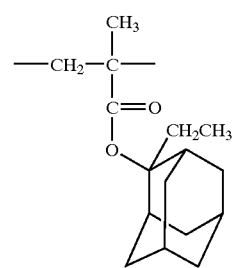 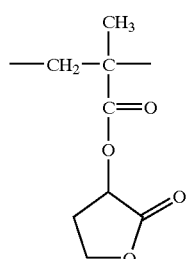
(1)
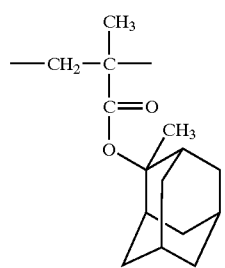 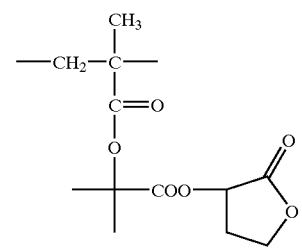
(2)
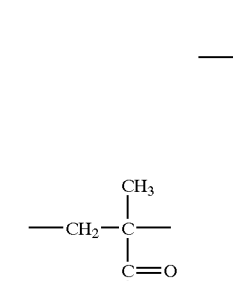 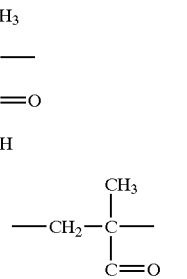
(3)
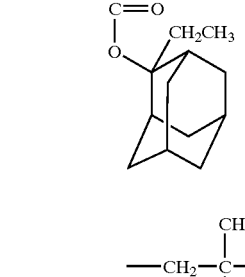 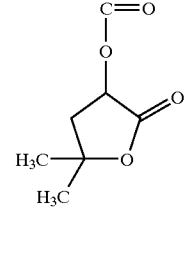
(4)
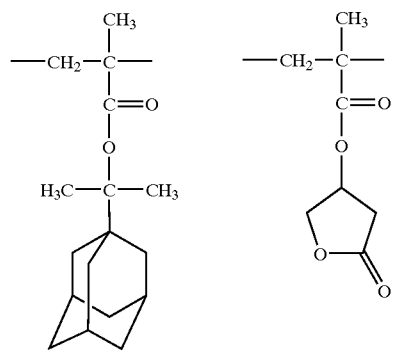
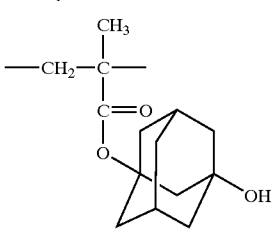
(5)
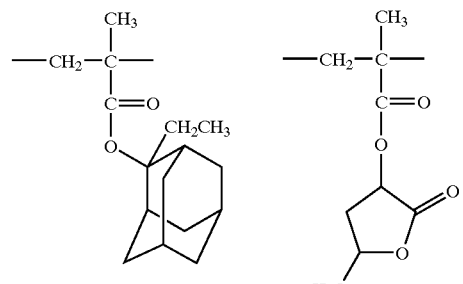
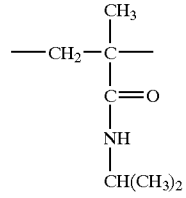
(6)
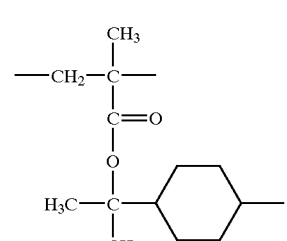 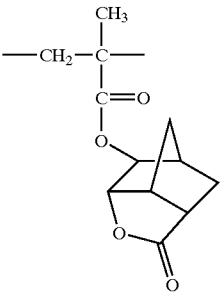
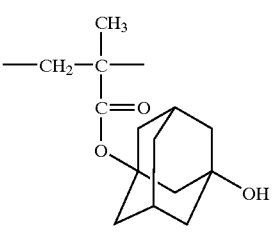

(7)
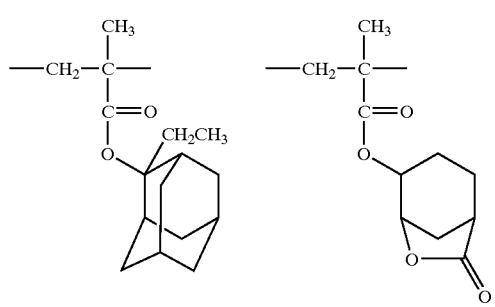
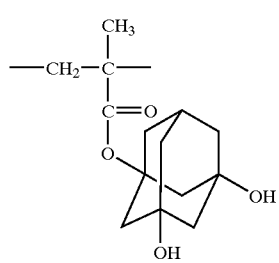
(8)
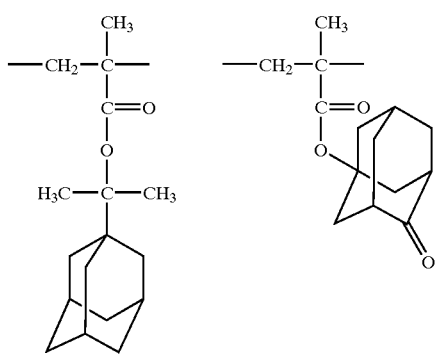
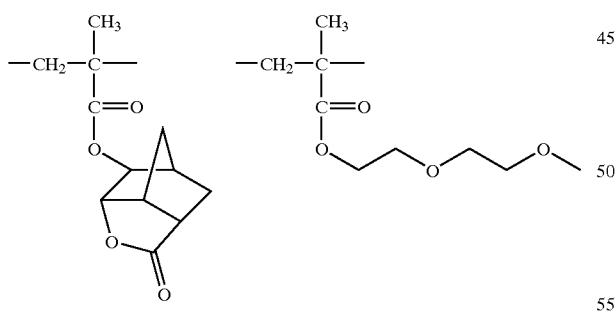
(9)
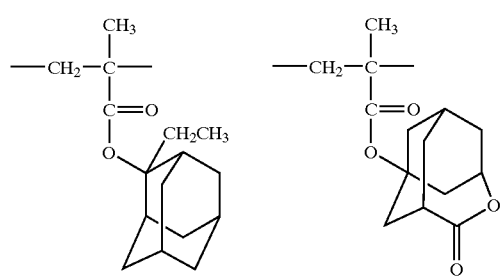
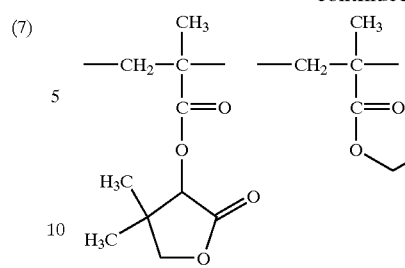
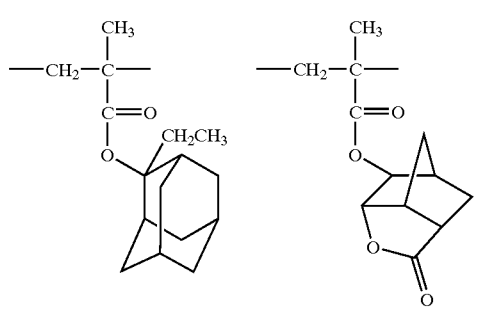
(10)
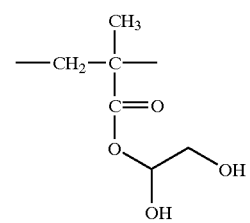
(11)
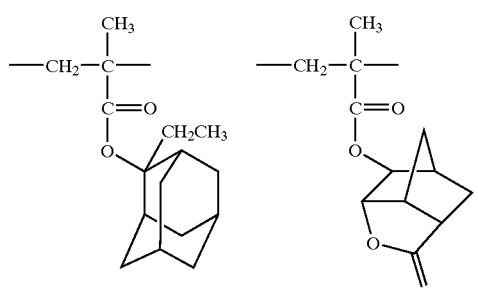
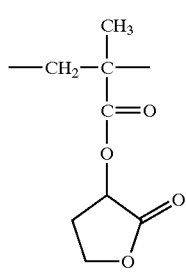

-continued
(12)
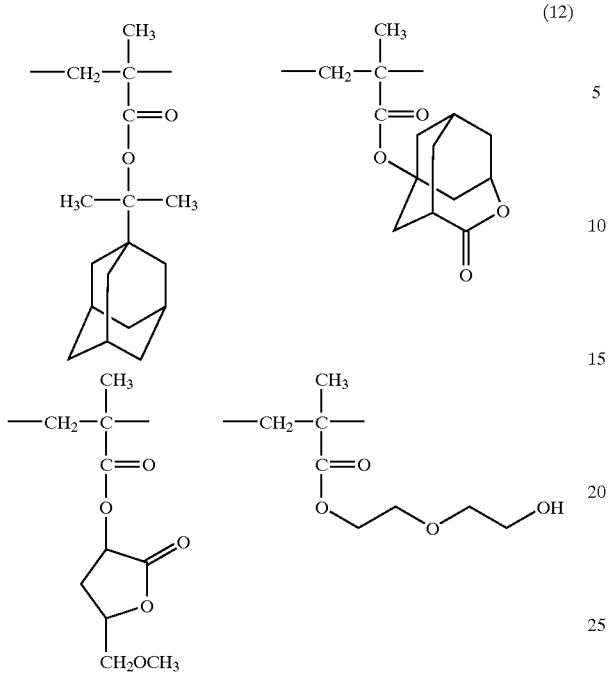
(13)
(14)
-continued
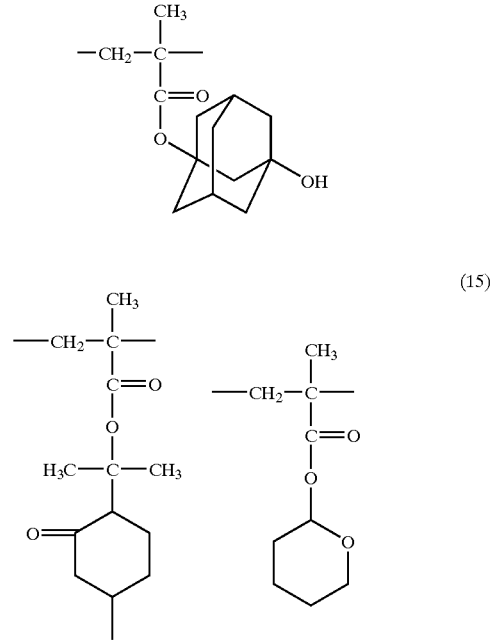
(15)
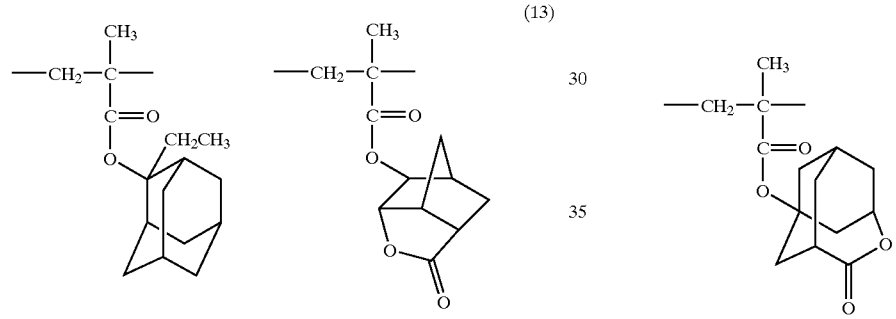
(16)
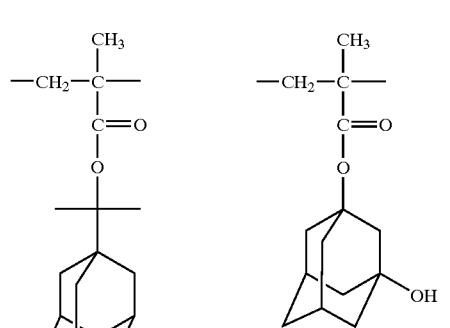
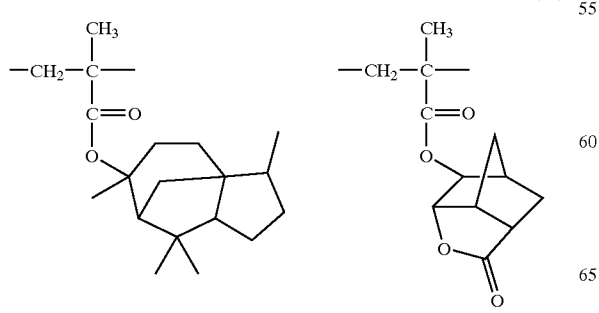

-continued (17)

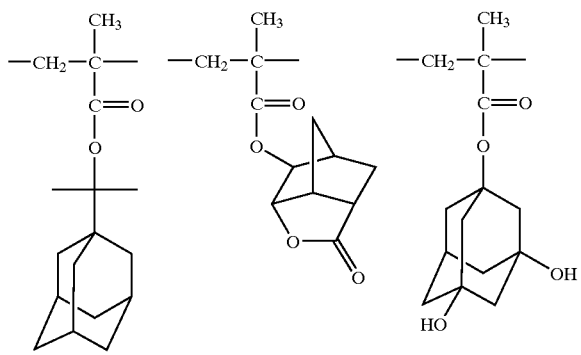

(18)

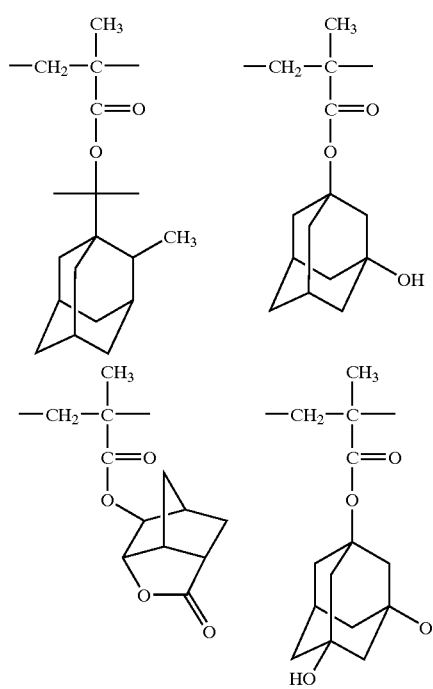

Synthesis Example (2): Synthesis of Resin (19) (Main Chain Type):

In a separable flask were charged norbornenecarboxylic acid t-butyl ester, norbornenecarboxylic acid butyrolactone ester, and maleic anhydride (40/10/50 mol ratio) and THF (60% by weight), the mixture was heated to 60° C. under a nitrogen stream. When the reaction temperature was stabilized, 2 mol % of a radical initiator, V-601 manufactured by Wako Pure Chemical Industries, Ltd. was added and the reaction was initiated. The mixture was heated for 12 hours. The reaction mixture obtained was diluted to two times with tetrahydrofuran and the mixture was added to a mixed solution of hexane/isopropyl alcohol 1/1 to deposit a white powder. The powder deposited was collected by filtration and dried to obtain the desired resin (19).

When the molecular weight of the resin (19) obtained was analyzed by GPC, the molecular weight was 8300 (weight average) as polystyrene conversion. Also, by the NMR spectrum, it was confirmed that the mol ratio of the repeating units of norbornenecarboxylic acid t-butyl ester/ norbornenecarboxylic acid butyrolactone ester/maleic anhydride was 42/8/50.

By the similar manners to Synthesis Example (2), resins (20) to (30) were synthesized.

The composition ratios and the molecular weights of the resins (20) to (30) are shown below. (The alicyclic olefin units 1, 2, and 3 are the order from the left side of each structural formula.)

TABLE 2

| Resin | Alicyclic Olefin Unit 1 (mol %) | Alicyclic Olefin Unit 2 (mol %) | Alicyclic Olefin Unit 3 (mol %) | Maleic Anhydride (mol %) | Molecular Weight |
| --- | --- | --- | --- | --- | --- |
| 20 | 35 | 15 | | 50 | 8200 |
| 21 | 20 | 30 | | 50 | 8600 |
| 22 | 36 | 14 | | 50 | 9100 |
| 23 | 31 | 19 | | 50 | 7900 |
| 24 | 35 | 5 | 10 | 50 | 8300 |
| 25 | 33 | 17 | | 50 | 8500 |
| 26 | 38 | 12 | | 50 | 8300 |
| 27 | 31 | 6 | 13 | 50 | 8100 |
| 28 | 33 | 7 | 10 | 50 | 9100 |
| 29 | 40 | 10 | | 50 | 9300 |
| 30 | 34 | 16 | | 50 | 8800 |

Also, the structures of the resins (20) to (30) are shown below.

(19)

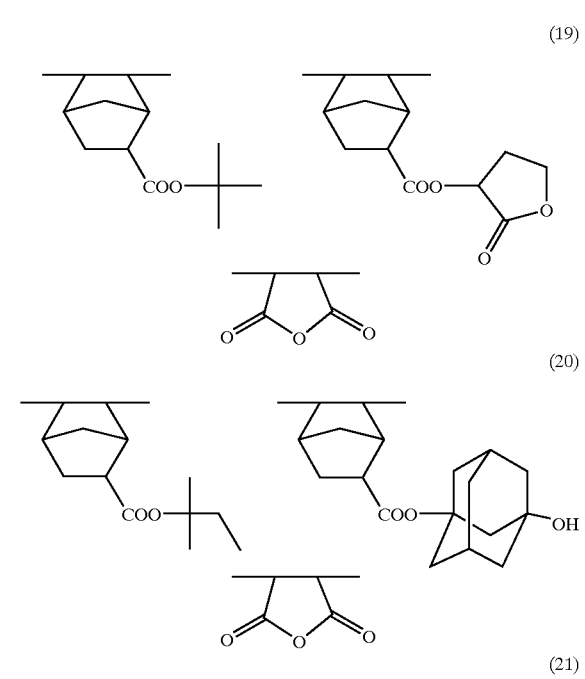

(20)

(21)

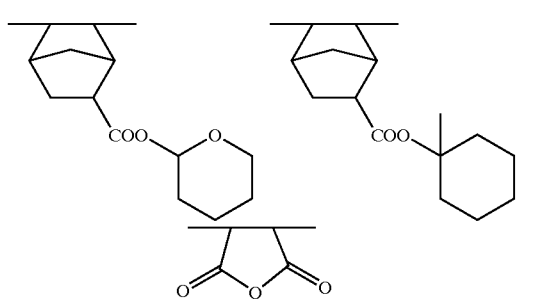

(22)
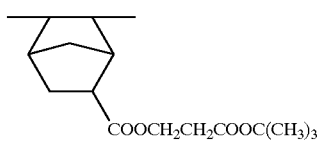 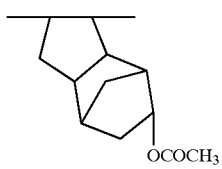
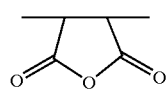
(23)
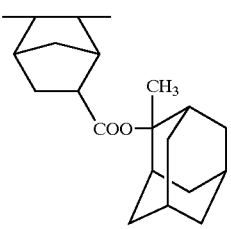 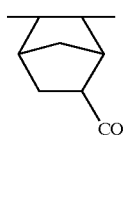
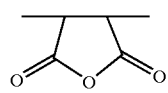
(24)
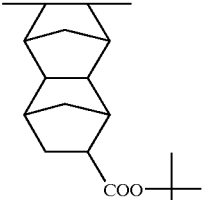 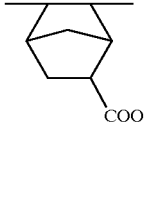
(25)
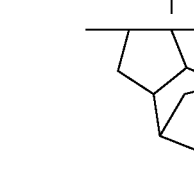 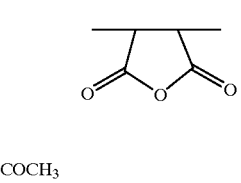
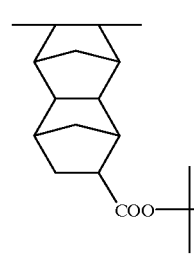
(26)
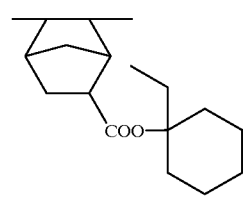 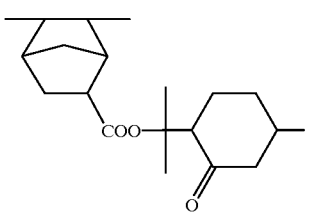
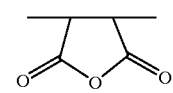
(27)
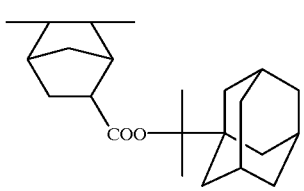 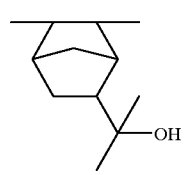
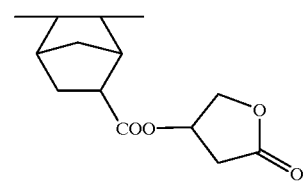 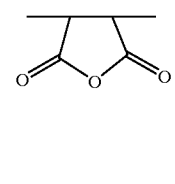
(28)
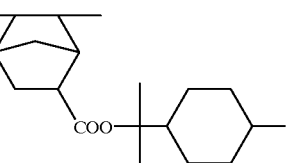 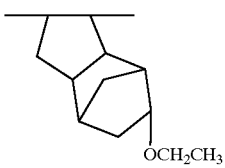
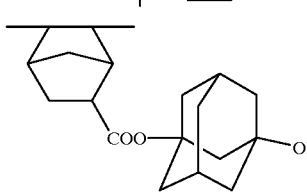 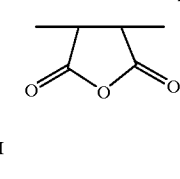
(29)
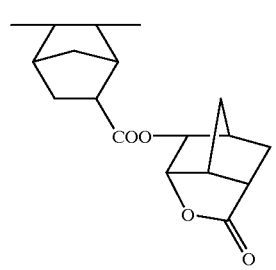 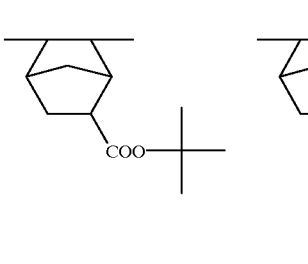 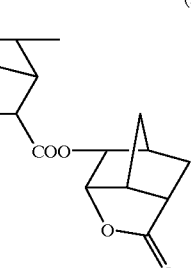
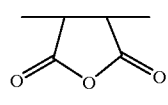 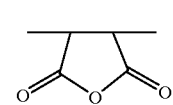

-continued (30)

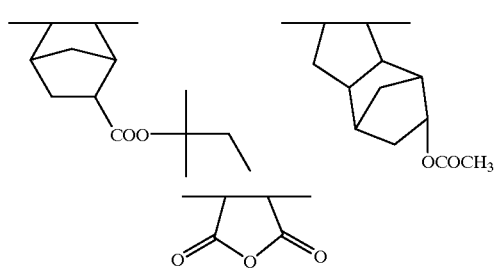

Synthesis Example (3): Synthesis of Resin (31) (Hybrid Type):

In a reaction vessel were charged norbornene, maleic anhydride, t-butyl acrylate, and 2-methylcyclohexyl-2-propyl acrylate at a mol ratio of 35/35/20/10, and the mixture was dissolved in tetrahydrofuran to prepare a solution having solid components of 60%. The solution was heated to 65° C. under a nitrogen steam. When the reaction temperature was stabilized, 1 mol % of a radical initiator V-601 manufactured by Wako Pure Chemical Industries, Ltd. was added thereto, and the reaction was initiated. After heating for 8 hours, the reaction mixture was diluted to two times with tetrahydrofuran, and thereafter, the mixed liquid was added to hexane of 5 volume times that of the mixed liquid to deposit a white powder. The powder deposited was collected by filtration, dissolved in methyl ethyl ketone, the solution was added to a mixed solvent of hexane/t-butyl methyl ether of 1/1 of 5 volume times that of the solution to deposit a white powder, which was collected by filtration, and dried to obtain the desired resin (31).

When the molecular weight of the resin (31) obtained was analyzed by GPC, the molecular weight was 12100 (weight average) as polystyrene conversion. Also, by the NMR spectra, it was confirmed that the composition of the resin (31) was norbornene/maleic anhydride/t-butyl acrylate/2-methylcyclo-hexyl-2-propyl acrylate of 32/39/19/10.

By the similar methods to that of Synthesis Example (3), (32) to (44) were synthesized.

The composition ratios and the molecular weights of the (32) to (44) described above are shown below.

TABLE 3

| Resin | Norbornenes | Acid Anhydride | (Meth)acrylate | Mw |
|---|---|---|---|---|
| 32 | 20/15 | 40 | 15/10 | 11900 |
| 33 | 32 | 37 | 20/8/3 | 10500 |
| 34 | 16 | 21 | 36/27 | 13900 |
| 35 | 15 | 22 | 34/29 | 12300 |
| 36 | 17 | 20 | 33/30 | 12400 |
| 37 | 18 | 24 | 32/26 | 13000 |
| 38 | 15 | 19 | 36/30 | 12700 |
| 39 | 15 | 20 | 29/10/26 | 13100 |
| 40 | 17 | 21 | 31/31 | 12800 |
| 41 | 18 | 17/3 | 30/32 | 13300 |
| 42 | 16 | 19 | 31/12/11/11 | 12600 |
| 43 | 20 | 22 | 58 | 14700 |
| 44 | 23 | 28 | 35/14 | 13300 |

Also, the structures of the resins (32) to (44) described above are shown below.

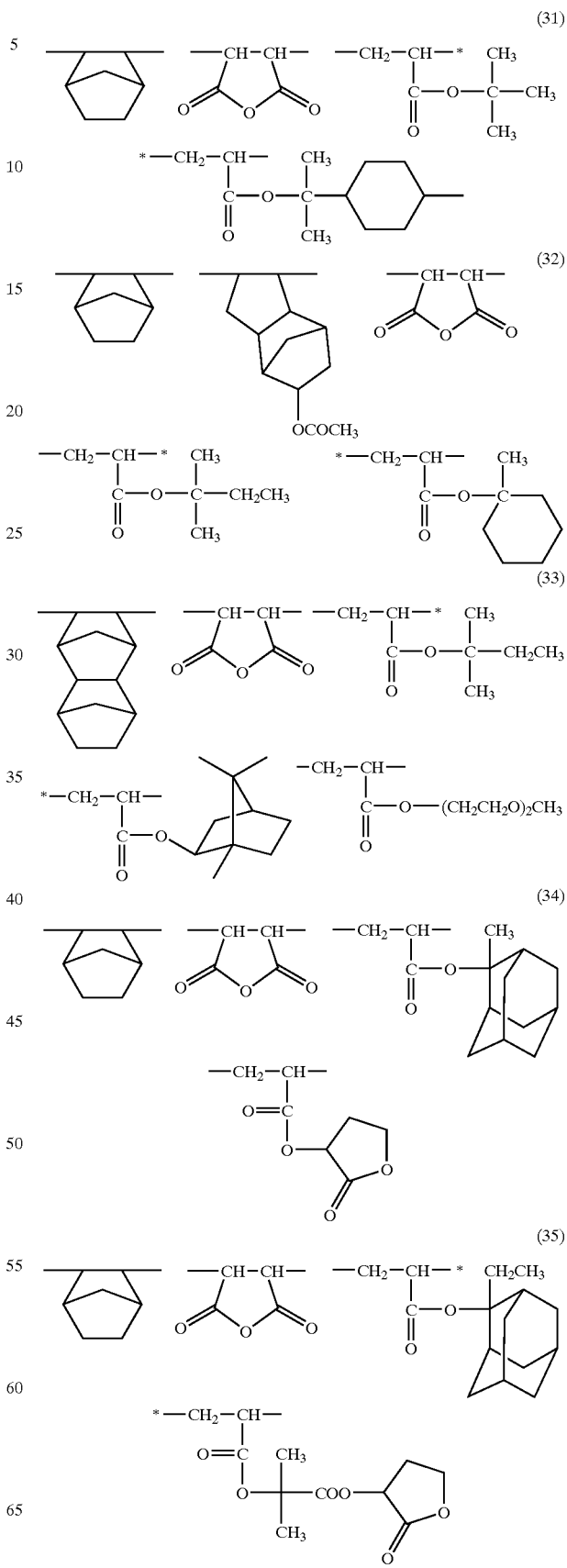

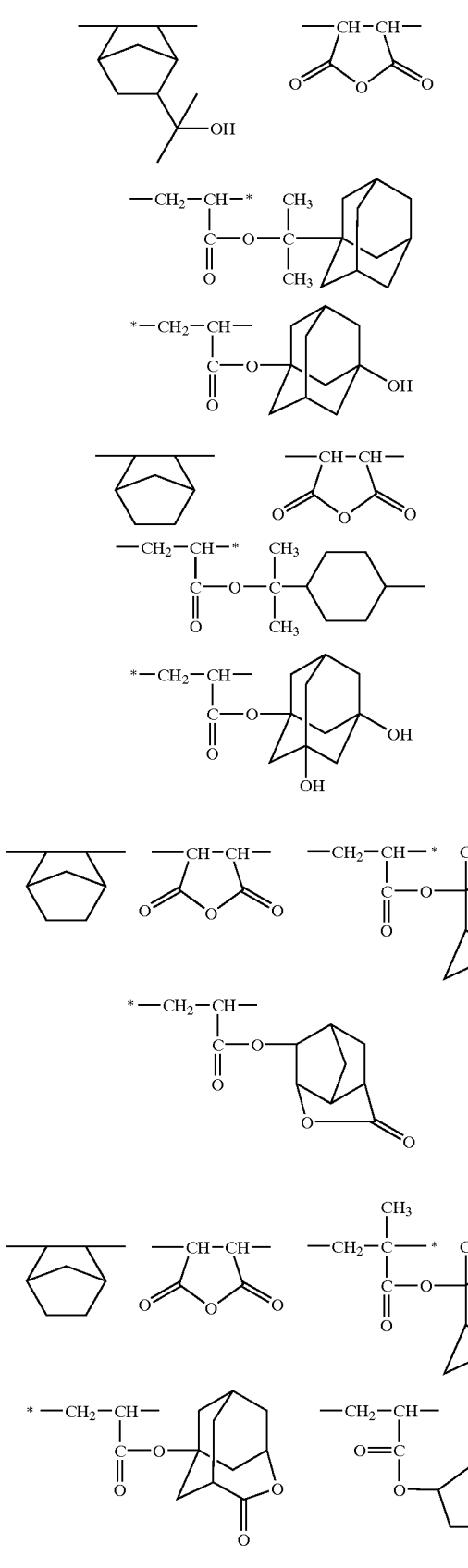
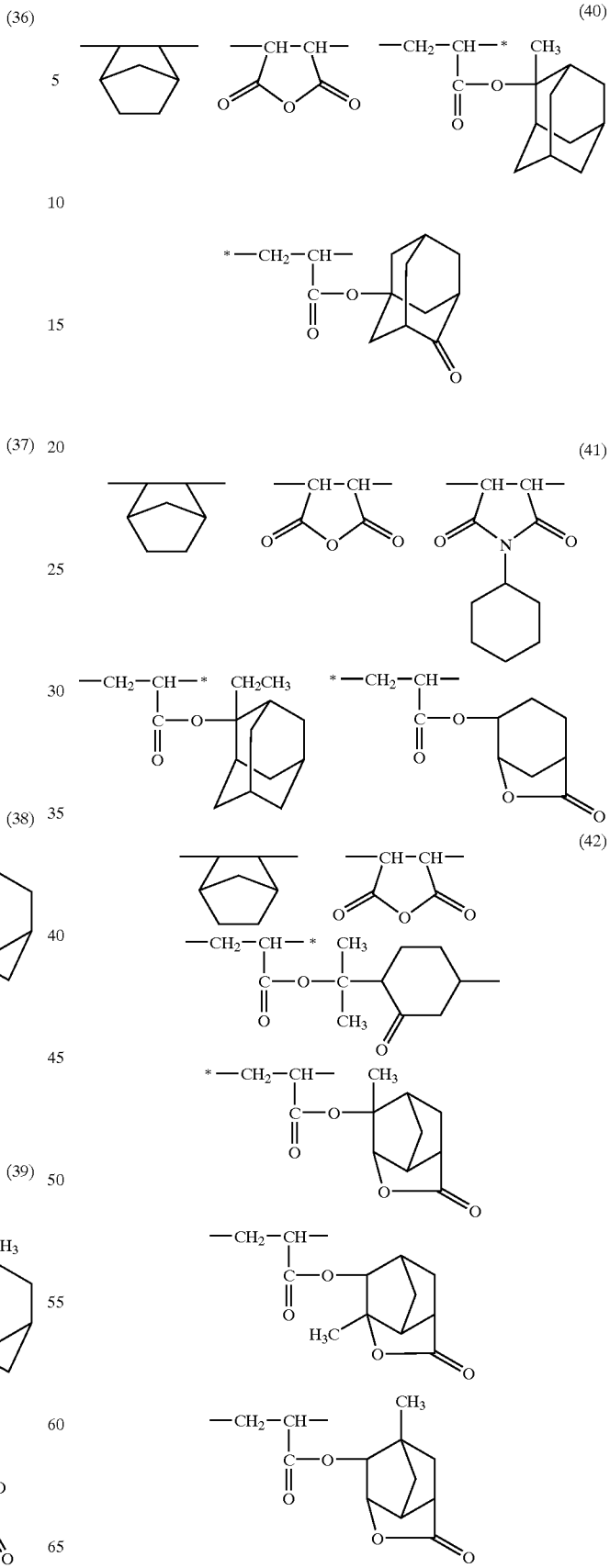

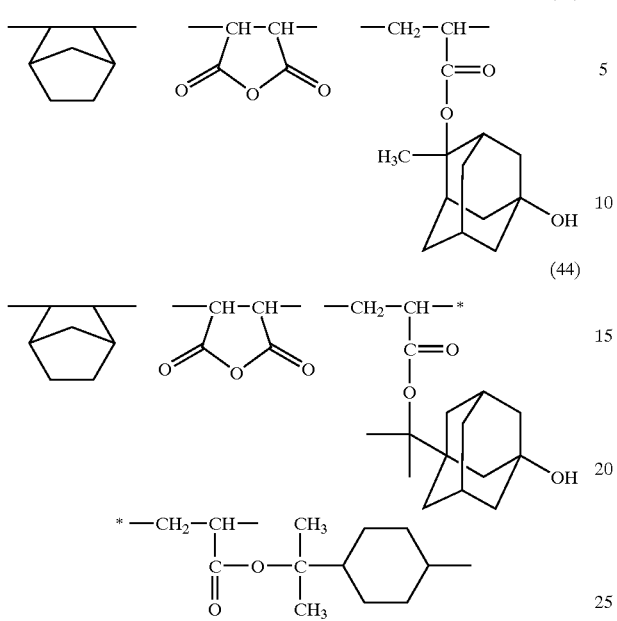

(43)

(44)

Synthesis Example (4): Synthesis of Resin (45) (Hybrid Type):

In a reaction vessel were charged norbornenecarboxylic acid t-butyl ester, maleic anhydride, 2-methyl-2-adamantyl acrylate, and norbornenelactone acrylate at 20/20/35/25 mol ratio, and the mixture was dissolved in a mixed solvent of methyl ethyl ketone/tetrahydrofuran=1/1 to prepare a solution having solid components of 60%. The solution was heated to 65° C. under a nitrogen stream. When the reaction was stabilized, 3 mol % of a radical initiator V-601 manufactured by Wako Pure Chemical Industries, Ltd. was added and the reaction was initiated. After heating for 12 hours, the reaction mixture was added to hexane of 5 times the weight of the reaction mixture to deposit a white powder. The powder deposited was collected and dissolved again in a mixed solvent of methyl ethyl ketone/tetrahydrofuran=1/1 and the solution was added to hexane/methyl t-butylether of five times the weight of the solution to deposit a white powder, which was collected by filtration. By repeating the operation again, followed by drying, a desired resin (45) was obtained.

When the molecular weight analysis (RI analysis) of the resin (45) obtained was tried by GPC, the molecular weight (weight average) was 11600 as the polystyrene conversion, and the amounts of the residual monomers were 0.4%. Also, by the NMR spectra, it was confirmed that the composition of the resin (45) was norbornene/maleic anhydride/2-methyl-2-adamantyl acrylate/-norbornene acrylate of 18/23/34/25 by mol ratio.

By the similar methods to that of Synthesis Example (4), resins (46) to (69) were synthesized.

The composition ratios and the molecular weights of the resins (43) to (66) are shown below.

TABLE 4

| Resin | Alicyclic Olefin | Formula (VIII) Monomer (Anhydride, etc.) | Acryl Monomer | Mw |
|---|---|---|---|---|
| 46 | 24 | 29 | 31/16 | 12300 |
| 47 | 21 | 28 | 32/29 | 11100 |
| 48 | 22 | 27 | 28/23 | 11300 |
| 49 | 27 | 31 | 24/18 | 10700 |
| 50 | 32 | 38 | 20/10 | 9700 |
| 51 | 31 | 35 | 21/13 | 9200 |
| 52 | 29 | 35 | 20/16 | 8900 |
| 53 | 35 | 39 | 23/3 | 8700 |
| 54 | 28 | 36 | 22/14 | 10600 |
| 55 | 28/8 | 44 | 20 | 9100 |
| 56 | 30/6 | 42 | 22 | 7700 |
| 57 | 46 | 47/3 | 4 | 6300 |
| 58 | 37/6 | 48 | 9 | 6800 |
| 59 | 34/10 | 51 | 5 | 7400 |
| 60 | 41 | 43 | 10/6 | 6700 |
| 61 | 39 | 42 | 11/8 | 8800 |
| 62 | 36 | 42 | 10/12 | 9300 |
| 63 | 39 | 43 | 14/4 | 9800 |
| 64 | 38 | 42 | 15/5 | 9300 |
| 65 | 24 | 27 | 25/24 | 12600 |
| 66 | 19 | 24 | 40/17 | 9500 |
| 67 | 29 | 32 | 34/5 | 10400 |
| 68 | 20 | 25 | 26/5/24 | 13400 |
| 69 | 16 | 24 | 32/24/4 | 12700 |

Also, the structures of the resins (45) to (69) are shown below.

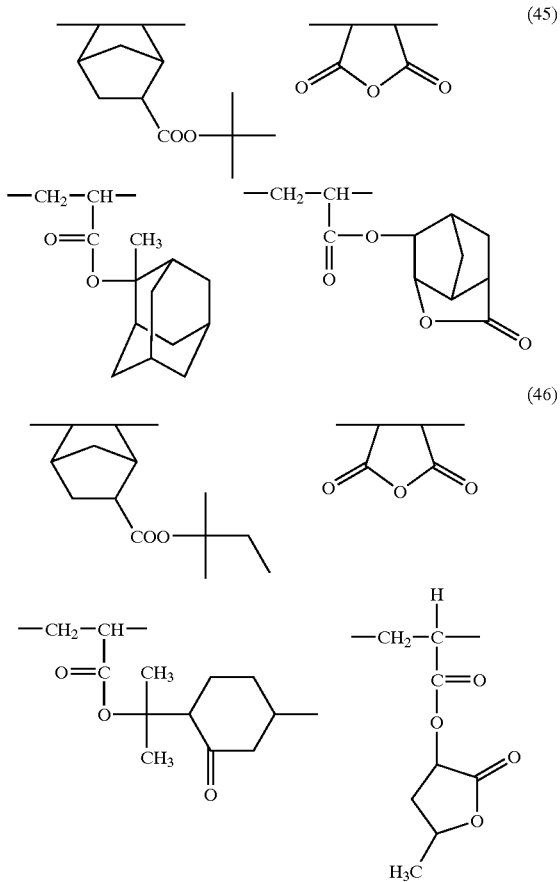

(45)

(46)

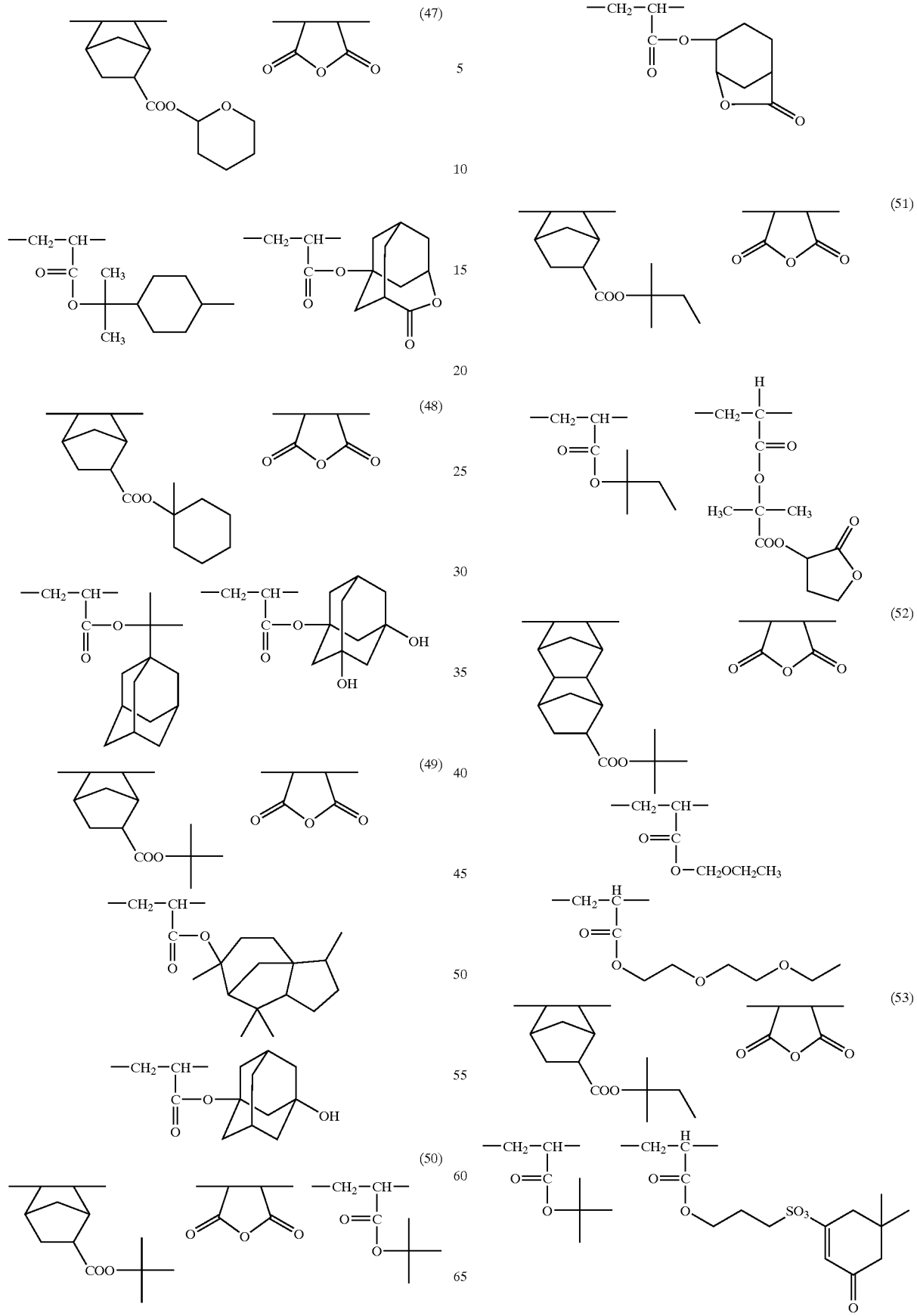

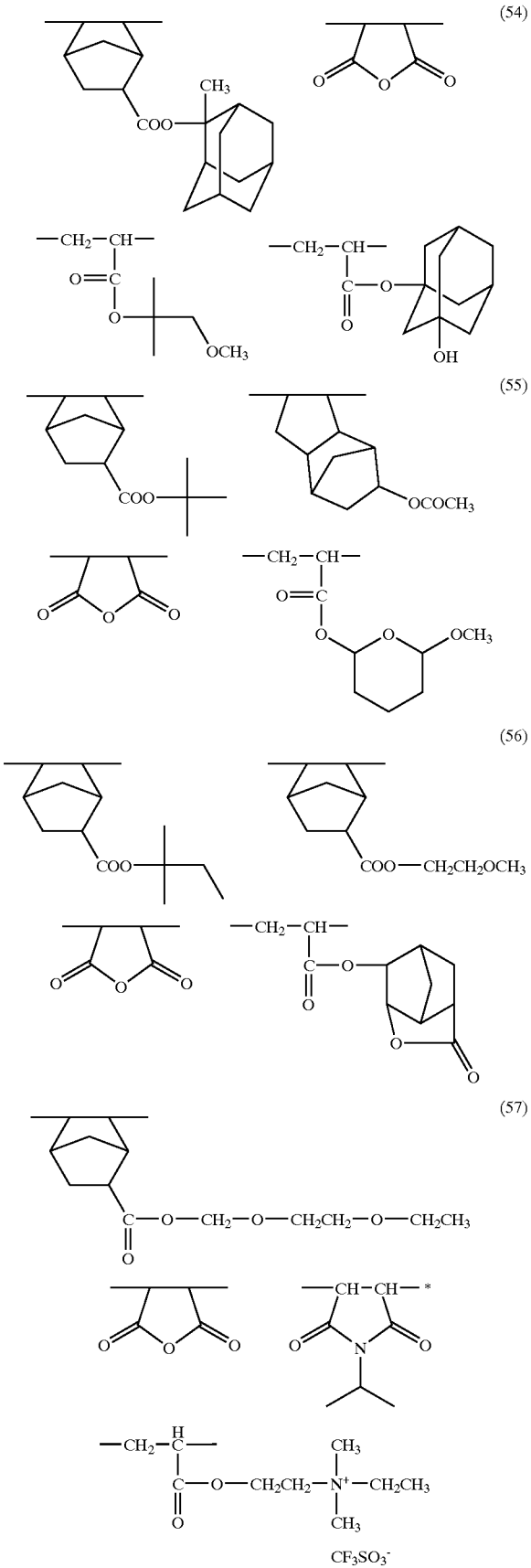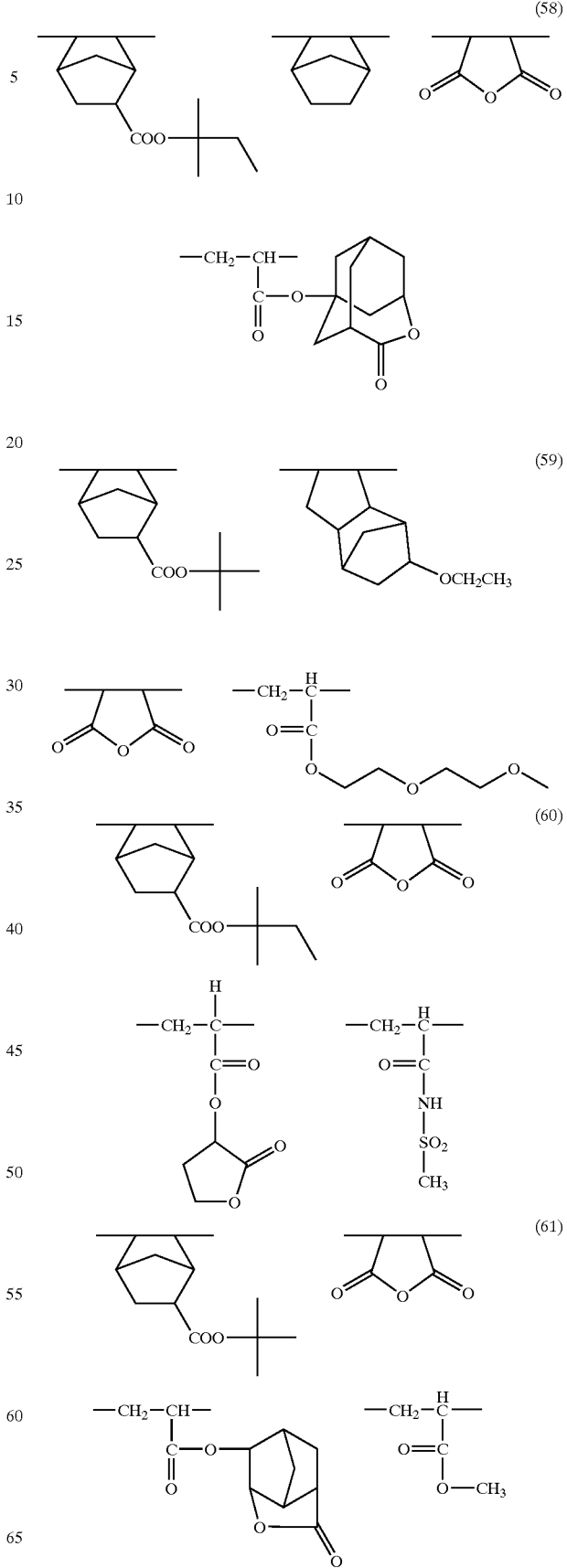

-continued
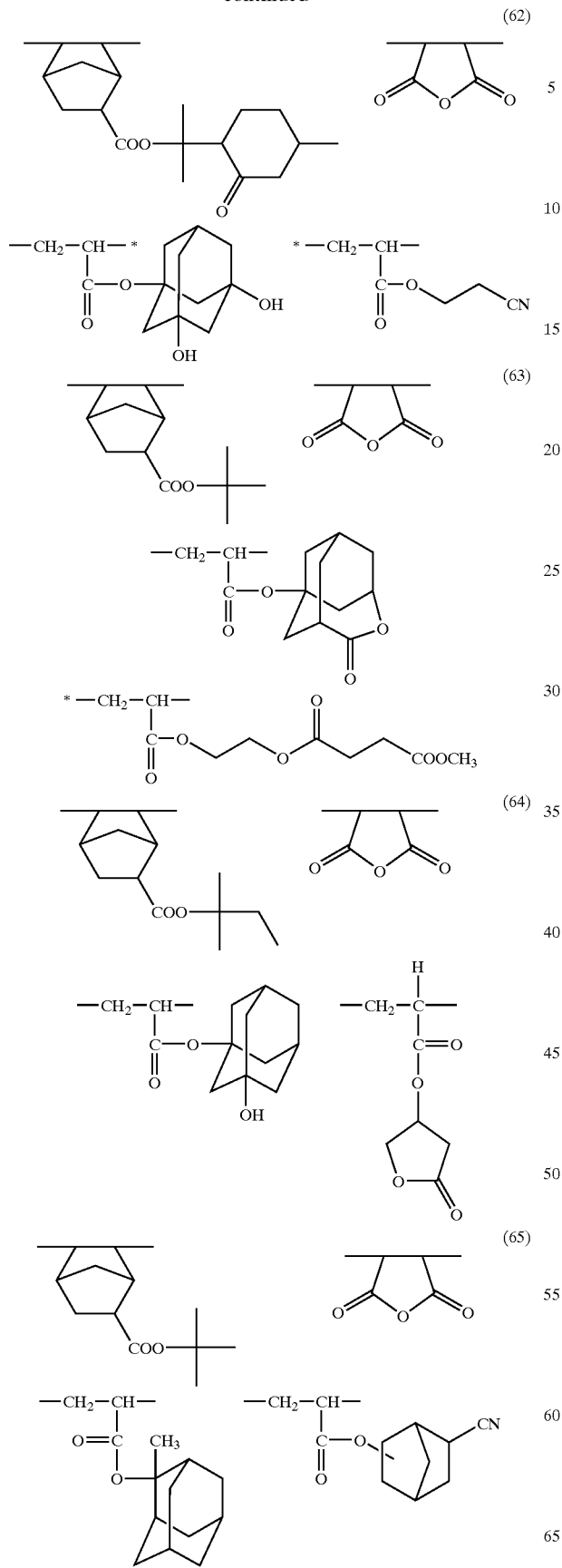
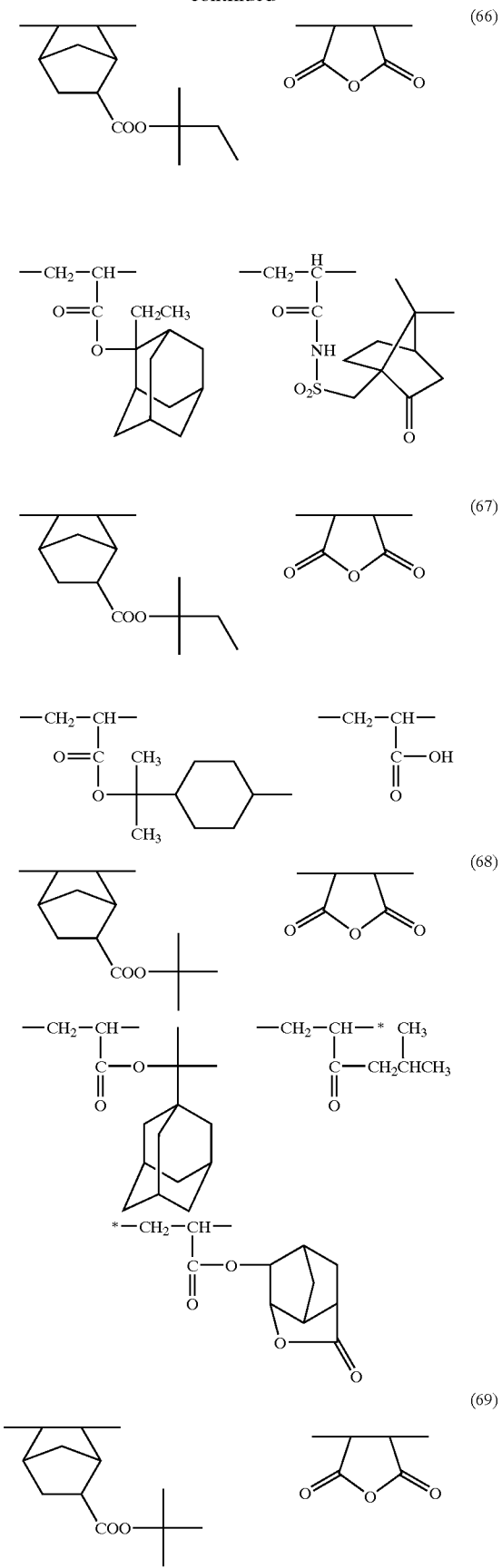

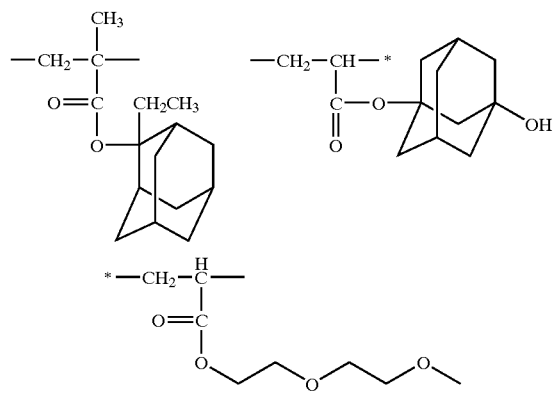

Examples 1 to 69 and Comparative Examples 1 to 4

(Preparation and Evaluation of Positive Resist Composition)

A mixture was obtained by compounding 1.25 g (however, 1.4 q in Comparative Examples) of each of the resins shown in Tables 5 to 7 synthesized in the above-described synthetic examples, a photoacid generator, 5 mg of the nitrogen-containing compound (C), if necessary 3 mg of an organic basic compound (amine), and, if necessary 10 mg of a surfactant, and the mixture was dissolved in propylene glycol monomethyl ether acetate as having solid components of 14%. Thereafter, the solution was filtered by a microfilter of 0.1 μm to prepare each of the positive resist compositions of Examples 1 to 69 and Comparative Examples 1 to 4.

TABLE 5

| Example | Resin | Photoacid Generator | N-containing Compound | Amine | Surfactant |
|---|---|---|---|---|---|
| 1 | 1 | PAG4-6 = 45 mg | C-1 | 1 | W1 |
| 2 | 2 | PAG4-36 = 40 mg | C-1 | 3 | W2 |
| 3 | 3 | PAG4-35 = 50 mg | C-1 | 4 | W3 |
| 4 | 4 | PAG4-39 = 42 mg | C-1 | 5 | W3 |
| 5 | 5 | PAG4-41 = 43 mg | C-2 | 4 | W5 |
| 6 | 6 | PAG4-45 = 42 mg | C-2 | 6 | W5 |
| 7 | 7 | PAG4-48 = 41 mg | C-1 | 2 | W5 |
| 8 | 8 | PAG4-52 = 43 mg | C-1 | 4 | W5 |
| 9 | 9 | PAG4-6/PAG4-5 = 45/5 mg | C-2 | 5 | W9 |
| 10 | 10 | PAG4-39 = 44 mg | C-1 | 4 | W4 |
| 11 | 11 | PAG4-45 = 43 mg | C-2 | 4 | W2 |
| 12 | 12 | PAG4-6 = 50 mg | C-1 | 3 | W5 |
| 13 | 13 | PAG4-35/PAG6-27 = 40/10 mg | C-10 | 1 | W5 |
| 14 | 14 | PAG4-45/PAG6-26 = 40/5 mg | C-10 | 1 | W5 |
| 15 | 15 | PAG4-48 = 50 mg | C-11 | 1/4 = 1/1 | W5 |
| 16 | 16 | PAG4-52 = 42 mg | C-1 | 1 | W1 |
| 17 | 17 | PAG4-48 = 45 mg | C-1 | 3 | W3 |
| 18 | 18 | PAG4-46 = 45 mg | C-2 | 1 | W2 |
| 19 | 19 | PAG4-17 = 50 mg | C-11 | 3 | W3 |
| 20 | 20 | PAG4-36 = 41 mg | C-12 | 4 | W2 |
| 21 | 21 | PAG4-45 = 50 mg | C-12 | 3 | W1 |
| 22 | 22 | PAG4-41/PAG4-40 = 30/10 mg | C-1 | 4 | W2 |
| 23 | 23 | PAG4-51/PAG4-52 = 10/35 mg | C-1 | 4/5 = 1/1 | W3 |

TABLE 5-continued

| Example | Resin | Photoacid Generator | N-containing Compound | Amine | Surfactant |
|---|---|---|---|---|---|
| 24 | 24 | PAG4-50 = 42 mg | C-2 | 1 | W5 |
| 25 | 25 | PAG4-50/PAG4-49 = 32/13 mg | C-2 | 2 | W4 |
| 26 | 26 | PAG4-48 = 42 mg | C-4 | 6 | W5 |
| 27 | 27 | PAG4-36 = 43 mg | C-6 | 6 | W5 |
| 28 | 28 | PAG4-52 = 46 mg | C-5 | 3 | W3 |

TABLE 6

| Example | Resin | Photoacid Generator | N-containing Compound | Amine | Surfactant |
|---|---|---|---|---|---|
| 29 | 29 | PAG4-52/PAG7-3 = 40/10 mg | I-1 | 4 | W3 |
| 30 | 30 | PAG4-50/PAG6-27 = 39/10 mg | I-4 | 4 | W2 |
| 31 | 31 | PAG4-36/PAG-5 = 40/10 mg | I-1 | 5 | W1 |
| 32 | 32 | PAG4-48/PAG4-49 = 35/5 mg | I-5 | 4/5 = 1/1 | W2 |
| 33 | 33 | PAG4-39 = 42 mg | I-10 | 4/5 = 2/1 | W3 |
| 34 | 34 | PAG4-50 = 48 mg | C-1 | 3 | W2 |
| 35 | 35 | PAG4-45 = 43 mg | C-1 | 2 | W4 |
| 36 | 36 | PAG4-48 = 43 mg | C-2 | 1 | W5 |
| 37 | 37 | PAG4-36 = 43 mg | C-2 | 6 | W2 |
| 38 | 38 | PAG4-52 = 45 mg | C-1 | 6 | W3 |
| 39 | 39 | PAG4-39 = 41 mg | C-10 | 5 | W3 |
| 40 | 40 | PAG4-52/PAG6-34 = 40/4 mg | C-10 | 4 | W2 |
| 41 | 41 | PAG4-48 = 45 mg | C-11 | 5 | W1 |
| 42 | 42 | PAG4-45 = 43 mg | C-12 | 4/5 = 1/2 | W2 |
| 43 | 43 | PAG4-48/PAG6-26 = 40/10 mg | C-12 | 4/5 = 1/1 | W3 |
| 44 | 44 | PAG4-39/PAG6-27 = 40/5 mg | C-10 | 1/4 = 1/1 | W2 |
| 45 | 45 | PAG4-50 = 47 mg | C-1 | 1/6 = 2/1 | W4 |
| 46 | 46 | PAG4-36 = 42 mg | C-1 | 4 | W1 |
| 47 | 47 | PAG4-48 = 43 mg | C-2 | 5 | W1 |
| 48 | 48 | PAG4-45 = 46 mg | C-1 | 4 | W5 |
| 49 | 49 | PAG4-39 = 43 mg | C-2 | 5 | W5 |
| 50 | 50 | PAG4-52 = 46 mg | C-1 | 4 | W5 |
| 51 | 51 | PAG4-45 = 45 mg | C-1 | 5 | W5 |
| 52 | 52 | PAG4-50 = 47 mg | C-2 | 3 | W2 |
| 53 | 53 | PAG3-21/PAG4-50 = 20/20 mg | C-1 | 2 | W1 |

TABLE 7

| Example | Resin | Photoacid Generator | N-containing Compound | Amine | Surfactant |
|---|---|---|---|---|---|
| 54 | 54 | PAG4-52 = 45 mg | I-5 | 4 | W3 |
| 55 | 55 | PAG4-48 = 46 mg | I-6 | 5 | W3 |
| 56 | 56 | PAG4-50 = 49 mg | I-8 | 6 | W2 |
| 57 | 57 | PAG4-36 = 46 mg | C-3 | 4 | W1 |
| 58 | 58 | PAG4-52/PAG6-26 = 40/13 mg | C-1 | 1 | W1 |
| 59 | 59 | PAG4-50/PAG6-27 = 38/15 mg | C-1 | 2 | W2 |
| 60 | 60 | PAG4-39 = 43 mg | C-2 | 3 | W4 |
| 61 | 61 | PAG4-48 = 44 mg | C-1 | 4 | W1 |
| 62 | 62 | PAG4-52 = 46 mg | C-2 | 5 | W5 |
| 63 | 63 | PAG4-36 = 40 mg | C-10 | 4/5 = 1/4 | W5 |
| 64 | 64 | PAG4-52/PAG3-25 = 40/10 mg | C-10 | 5 | W5 |
| 65 | 65 | PAG4-50/PAG6-27 = 40/20 mg | C-1 | 5 | W2 |
| 66 | 66 | PAG4-38/PAG6-39 = 10/36 mg | C-1 | 4/5 = 4/1 | W1 |
| 67 | 67 | PAG4-52 = 48 mg | C-2 | 4 | W1 |
| 68 | 68 | PAG4-50/PAG7-1 = 40/10 mg | C-1 | 3/4 = 1/1 | W5 |
| 69 | 69 | PAG4-48/PAG4-5 = 40/6 mg | C-2 | 4 | W2 |
| C. Ex. 1 | 1 | PAG4-6 = 45 mg | None | None | None |
| C. Ex. 2 | 16 | PAG4-17 = 50 mg | None | 1 | None |
| C. Ex. 3 | 28 | PAG4-36 = 44 mg | None | None | W1 |
| C. Ex. 4 | 42 | PAG4-50 = 47 mg | None | 3 | W5 |

C. Ex.: Comparative Example
The surfactants are as follow:
W1: Megafac F176 (manufactured by DAINIPPON INK & CHEMICALS, INC.) (Fluorine-base)
W2: Megafac R08 (manufactured by DAINIPPON INK & CHEMICALS, INC.) (Fluorine and silicon-base)
W3: Polysiloxane polymer KP-341 (manufactured by Shin-Etsu Chemical Co., Ltd.)
W4: Polyoxyethylene nonylphenyl ether
W5: Troysol S-366 (manufactured by Troy Chemical Industries Co. Ltd.)
The amines are as follows:
1: 1,5-Diazabicyclo[4,3,0]-5-nonene (DBN).
2: Bis(1,2,2,6,6-pentamethyl-4-piperidyl) sebagate.
3: Tri-n-butylamine.
4: Triphenylimidazole.
5: Antipyrine.
6: 2,6-Diisopropylaniline.

(Evaluation test)

First, anti-reflecting coating solution ARC-25 manufactured by Brewer Science Corporation was coated at 30 nm thick on a silicon wafer utilizing a spin coater followed by drying. Thereafter, each of the positive photoresist composition solutions obtained was coated thereon utilizing a spin coater and dried for 90 seconds at 130° C. for the cases of Examples 1 to 15 and Comparative example 1 and at 190° C. for other cases to form each positive photoresist film of about 0.4 µm, and each film was exposed by an ArF excimer laser (193 nm). The heat treatment after the light exposure was carried out for 90 seconds at 120° C. for the cases of Examples 1 to 15 and Comparative example 1 and at 140° C. for other cases, each film was developed with an aqueous solution of 2.38% tetramethylammonium hydroxide and rinsed with distilled water to obtained each resist pattern profile.

To these resist patterns, the edge roughness, pattern profile and the development defect were evaluated as shown below. The evaluation results are shown in Tables 8 to 10.

[Edge roughness]: The measurement of the edge roughness is carried out about the edge roughness of an isolated pattern using a Critical Dimension scanning type electron microscope (SEM), the line pattern edges are detected at plural positions in the measurement monitor, the dispersion (3σ) of the detected positions is used as the index of the edge roughness, and the smaller value is preferred.

[Pattern Profile]: The cross section of line pattern of 0.15 µm obtained by the minimum exposure amount necessary for reproducing a mask line pattern of 0.15 µm was observed through a scanning-type electron microscope. The cross section of patterns were evaluated according to the following three stages:

A: Vertical shape;
B: Slightly Tapered shape; and
C: Tapered shape.

[Development defect]: The number of development defect was measured by KLA 2112 (manufactured by KLA Tencole Co., Ltd.) using the resist pattern obtained according to the above-described method. The development defect was defined by the primary data obtained.

The results are shown in Tables 8 to 10.

TABLE 8

| Example | Edge Roughness (nm) | Pattern Profile | Development defect |
|---|---|---|---|
| 1 | 6.1 | A | 2 |
| 2 | 6.0 | A | 2 |
| 3 | 5.8 | A | 1 |
| 4 | 5.9 | A | 2 |
| 5 | 6.0 | A | 1 |
| 6 | 5.7 | A | 3 |
| 7 | 6.2 | A | 1 |
| 8 | 6.1 | A | 2 |
| 9 | 6.0 | A | 1 |
| 10 | 5.9 | A | 3 |
| 11 | 5.9 | A | 1 |
| 12 | 6.0 | A | 1 |
| 13 | 5.9 | A | 0 |
| 14 | 6.1 | A | 0 |
| 15 | 5.9 | A | 0 |
| 16 | 6.0 | A | 0 |

TABLE 8-continued

| Example | Edge Roughness (nm) | Pattern Profile | Development defect |
|---|---|---|---|
| 17 | 5.8 | A | 1 |
| 18 | 6.1 | A | 1 |
| 19 | 5.9 | A | 1 |
| 20 | 6.1 | A | 1 |
| 21 | 5.9 | A | 1 |
| 22 | 6.2 | A | 1 |
| 23 | 6.0 | A | 0 |
| 24 | 5.9 | A | 1 |
| 25 | 6.0 | A | 1 |

TABLE 9

| Example | Edge Roughness (nm) | Pattern Profile | Development defect |
|---|---|---|---|
| 26 | 6.1 | A | 2 |
| 27 | 5.9 | A | 2 |
| 28 | 6.0 | A | 1 |
| 29 | 6.1 | A | 2 |
| 30 | 5.9 | A | 3 |
| 31 | 6.1 | A | 0 |
| 32 | 6.0 | A | 1 |
| 33 | 6.1 | A | 2 |
| 34 | 5.9 | A | 1 |
| 35 | 6.1 | A | 2 |
| 36 | 5.9 | A | 0 |
| 37 | 6.1 | A | 0 |
| 38 | 6.0 | A | 1 |
| 39 | 5.9 | A | 1 |
| 40 | 6.2 | A | 2 |
| 41 | 5.9 | A | 1 |
| 42 | 6.1 | A | 1 |
| 43 | 5.9 | A | 0 |
| 44 | 6.0 | A | 1 |
| 45 | 5.9 | A | 2 |
| 46 | 6.2 | A | 2 |
| 47 | 6.0 | A | 1 |
| 48 | 5.9 | A | 1 |
| 49 | 6.0 | A | 0 |
| 50 | 6.1 | A | 0 |

TABLE 10

| Example | Edge Roughness (nm) | Pattern Profile | Development defect |
|---|---|---|---|
| 51 | 6.2 | A | 2 |
| 52 | 6.1 | A | 2 |
| 53 | 6.2 | A | 1 |
| 54 | 5.9 | A | 2 |
| 55 | 6.0 | A | 0 |
| 56 | 6.2 | A | 1 |
| 57 | 6.0 | A | 2 |
| 58 | 6.1 | A | 1 |
| 59 | 5.9 | A | 0 |
| 60 | 6.0 | A | 1 |
| 61 | 5.9 | A | 2 |
| 62 | 6.2 | A | 1 |
| 63 | 5.9 | A | 1 |
| 64 | 6.0 | A | 1 |
| 65 | 5.8 | A | 0 |
| 66 | 6.2 | A | 1 |
| 67 | 6.1 | A | 2 |
| 68 | 5.9 | A | 0 |
| 69 | 6.0 | A | 1 |
| C. Ex. 1 | 15.3 | C | 53 |
| C. Ex. 2 | 19.2 | C | 58 |
| C. Ex. 3 | 18.4 | C | 51 |
| C. Ex. 4 | 19.5 | C | 39 |

C. Ex.: Comparative Example

As is clear from the results of Tables 8 to 10, it can be seen that the positive resist compositions of the invention show excellent performance about the edge roughness, resist pattern profile and the development defect.

As described above, the positive resist composition of the invention is suitable for a far-ultraviolet light, and particularly, for the ArF excimer laser light having a wavelength of 193 nm, has an excellent performance about the edge roughness, resist pattern profile and the development defect.

Accordingly, the resist composition is suitably used for a lithography using far-ultraviolet rays such as an ArF excimer laser light, etc.

What is claimed is:

1. A positive resist composition comprising:

(A) a resin having an aliphatic cyclic hydrocarbon group and increasing the solubility to an alkali developer by the action of an acid;

(B) a compound generating an acid upon irradiation with one of an actinic ray and radiation; and (C) a nitrogen-containing compound represented by formula (II-1):

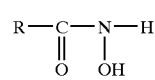

(II-1)

wherein R represents a monovalent organic residue having from 1 to 20 carbon atoms, or (II-2)

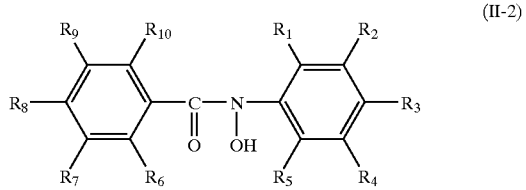

(II-2)

wherein $R_1$ to $R_{10}$, which are the same or different, each represents a hydrogen atom, a hydroxyl group, a halogen atom, a nitro group, a cyano group, an alkyl group, an alkoxy group, a hydroxyalkyl group, a cycloalkyl group or an aryl group.

2. The positive resist composition according to claim 1, wherein the resin (A) comprises at least one selected from the group consisted of: a repeating unit having a partial structure containing an alicyclic hydrocarbon, represented by formula (pI) to (pVI) below; and a repeating unit represented by formula (II) below:

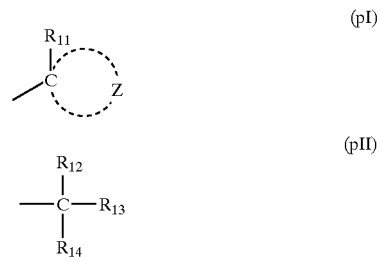

-continued

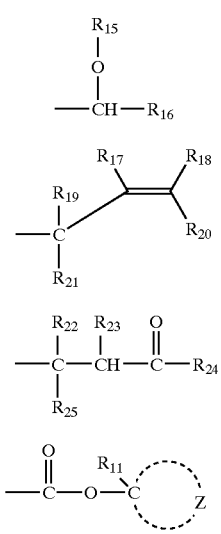

(pIII)

(pIV)

(pV)

(pVI)

wherein $R_{11}$ represents a methyl group, an ethyl group, an n-propyl group, an isopropyl group, an n-butyl group, an isobutyl group, or a sec-butyl group; Z represents an atomic group necessary for forming an alicyclic hydrocarbon group together with the carbon atom; $R_{12}$ to $R_{16}$ each independently represents a straight chain or branched alkyl group having from 1 to 4 carbon atoms or an alicyclic hydrocarbon group, wherein at least one of $R_{12}$ to $R_{14}$ or one of $R_{15}$ and $R_{16}$ represents an alicyclic hydrocarbon group; $R_{17}$ to $R_{21}$ each independently represents a hydrogen atom, a straight chain or branched alkyl group having from 1 to 4 carbon atoms or an alicyclic hydrocarbon group, wherein at least one of $R_{17}$ to $R_{21}$ represents an alicyclic hydrocarbon group and one of $R_{19}$ and $R_{21}$ represents a straight chain or branched alkyl group having from 1 to 4 carbon atoms or an alicyclic hydrocarbon group; $R_{22}$ to $R_{25}$ each independently represents a straight chain or branched alkyl group having from 1 to 4 carbon atoms or an alicyclic hydrocarbon group, wherein at least one of $R_{22}$ to $R_{25}$ represents an alicyclic hydrocarbon group and $R_{23}$ and $R_{24}$ may be bonded to each other to form a ring:

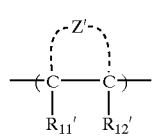

(II)

wherein $R_{11}'$ and $R_{12}'$ each independently represents a hydrogen atom, a cyano group, a halogen atom or an alkyl group which may have a substituent; Z' represents an atomic group for forming an alicyclic structure containing the two carbon atoms (C—C), which may have a substituent.

3. The positive resist composition according to claim 2, wherein Z' of the formula (II) represents an atomic group for forming a bridged alicyclic structure containing the two carbon atoms (C—C), which may have a substituent.

4. The positive resist composition according to claim 2, wherein the formula (II) is one of formulae (II-A) and (II-B);

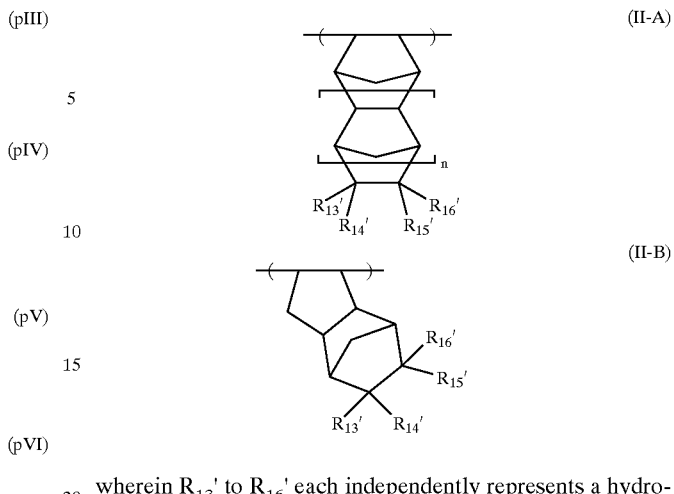

(II-A)

(II-B)

wherein $R_{13}'$ to $R_{16}'$ each independently represents a hydrogen atom, a halogen atom, a cyano group, —COOH, —COOR$_5$, a group of being decomposed by the action of an acid, —C(=O)—X-A'-R$_{17}'$, or an alkyl or cyclic hydrocarbon group which may have a substituent; $R_5$ represents an alkyl or cyclic hydrocarbon group which may have a substituent, or a —Y group below; X represents an oxygen atom, a sulfur atom, —NH—, —NHSO$_2$—, or —NHSO$_2$NH—; A' represents a single bond or a divalent linkage group; n represents 0 or 1; $R_{17}'$ represents —COOH, —COOR$_5$, —CN, a hydroxy group, an alkoxy group which may have a substituent, —CO—NH—R$_6$, —CO—NH—SO$_2$—R$_6$, or a —Y group below; $R_6$ represents an alkyl or cyclic hydrocarbon group which may have a substituent; and at least two of $R_{13}'$ to $R_{16}'$ may be bonded to each other to form a ring: —Y group:

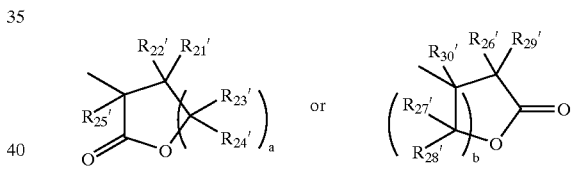

wherein $R_{21}'$ to $R_{30}'$ each independently represents a hydrogen or an alkyl group which may have a substituent; a and b each represents 1 or 2.

5. The positive resist composition according to claim 2, wherein the repeating unit having the partial structure represented by the formula (pI) to (pVI), is a repeating unit represented by formula (pA):

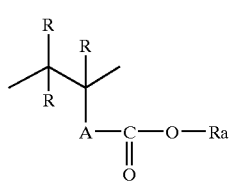

(pA)

wherein R represents a hydrogen atom, a halogen atom, a substituted or unsubstituted, straight chain or branched alkyl group having from 1 to 4 carbon atoms; each of plural R is the same or different; A represents a single bond or, an alkylene group, a substituted alkylene group, an ether group, a thioether group, a carbonyl group, an ester group, an amide group, a sulfonamide group, a urethane group, a urea group or a combination thereof; Ra represents one of the groups represented by the formulae (pI) to (pVI).

6. The positive resist composition according to claim 1, wherein the resin (A) further comprises a repeating unit having the lactone structure, represented by formula (IV):

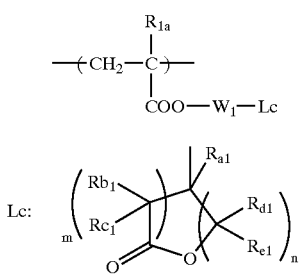

wherein $R_{1a}$ represents a hydrogen atom or a methyl group; $W_1$ represents a single bond or, an alkylene group, an ether group, a thioether group, a carbonyl group, an ester group or a combination thereof; $Ra_1$, $Rb_1$, $Rc_1$, $Rd_1$ and $Re_1$ each independently represents a hydrogen atom or an alkyl group having from 1 to 4 carbon atoms; m and n each independently represents an integer of from 0 to 3; and m+n is 2 or larger but not larger than 6.

7. The positive resist composition according to claim 1, wherein the resin (A) further comprises a repeating unit having a group represented by one of formulae (V-1) to (V-4):

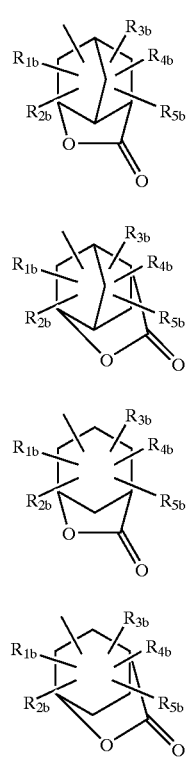

wherein $R_{1b}$ to $R_{5b}$ each independently represents a hydrogen atom, an alkyl group which may have a substituent, a cycloalkyl group which may have a substituent or an alkenyl group which may have a substituent, and two of $R_{1b}$ to $R_{5b}$ may be bonded to each other to form a ring.

8. The positive resist composition according to claim 1, wherein the resin (A) further comprises a repeating unit represented by formula (VI):

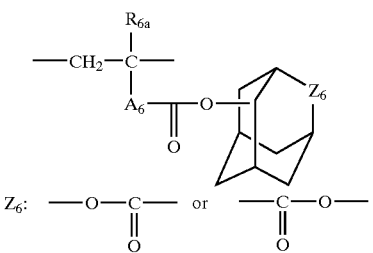

whrerein $A_6$ represents a single bond or, an alkylene group, a cycloalkylene group, an ether group, a thioether group, a carbonyl group, an ester group or a combination thereof; and $R_{6a}$ represents a hydrogen atom, an alkyl group having from 1 to 4 carbon atoms, a cyano group or a halogen atom.

9. The positive resist composition according to claim 1, wherein the resin (A) further comprises a repeating unit having a group represented by formula (VII):

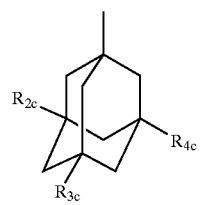

wherein $R_{2c}$ to $R_{4c}$ each independently represents a hydrogen atom or a hydroxy group, and at least one of $R_{2c}$ to $R_{4c}$ represents a hydroxy group.

10. The positive resist composition according to claim 1, wherein the resin (A) further comprises a repeating unit represented by formula (VIII):

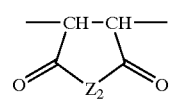

wherein $Z_2$ represents —O— or —N($R_{41}$); $R_{41}$ represents a hydrogen atom, a hydroxy group, an alkyl group, a haloalkyl group or —OSO$_2$—$R_{42}$; and $R_{42}$ represents an alkyl group, a haloalkyl group, a cycloalkyl group or a camphor residue.

11. The positive resist composition according to claim 1, wherein the nitrogen-containing compound (C) is a compound represented by formula (II-1):

wherein R represents a monovalent organic residue having from 1 to 20 carbon atoms.

12. The positive resist composition according to claim 1, wherein the nitrogen-containing compound (C) is a compound represented by formula (II-2):

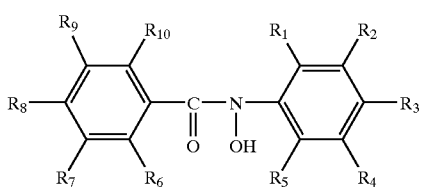

wherein $R_1$ to $R_{10}$, which are the same or different, each represents a hydrogen atom, a hydroxyl group, a halogen atom, a nitro group, a cyano group, an alkyl group, an alkoxy group, a hydroxyalkyl group, a cycloalkyl group or an aryl group.

13. The positive resist composition according to claim 1, wherein the nitrogen-containing compound (C) is used in an amount of from 0.001 to 40% by weight, based on the solid components in the composition.

14. The positive resist composition according to claim 1, which further comprises a low-molecular acid-decomposing compound: having a molecular weight of not higher than 2000; having a group capable of being decomposed by the action of an acid; and increasing the alkali solubility by the action of an acid.

15. The positive resist composition according to claim 1, wherein is a composition for light exposure by a far ultraviolet light having wavelengths of not longer than 220 nm.

16. The positive resist composition according to claim 1, which further comprises (D) a nitrogen-containing basic compound.

17. The positive resist composition according to claim 1, which further comprises (E) a surfactant containing at least one of a fluorine atom and a silicon atom.

* * * * *